US012568800B2

(12) United States Patent
Hicks, III et al.

(10) Patent No.:   US 12,568,800 B2
(45) Date of Patent:       Mar. 3, 2026

(54) CHEMICAL-DOSE SUBSTRATE DEPOSITION MONITORING

(71) Applicant: Applied Materials, Inc., Santa Clara, CA (US)

(72) Inventors: Albert Barrett Hicks, III, Sunnyvale, CA (US); Serghei Malkov, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 918 days.

(21) Appl. No.: 17/709,301

(22) Filed: Mar. 30, 2022

(65) Prior Publication Data

US 2023/0317531 A1      Oct. 5, 2023

(51) Int. Cl.
H01L 21/66         (2006.01)
C23C 16/458        (2006.01)
C23C 16/46         (2006.01)

(52) U.S. Cl.
CPC .......... H01L 22/30 (2013.01); C23C 16/4583 (2013.01); C23C 16/463 (2013.01)

(58) Field of Classification Search
CPC .......... C23C 16/45544; C23C 16/4583; C23C 16/463; C23C 16/52; G05B 19/042; H01L 22/30
See application file for complete search history.

(56) References Cited

U.S. PATENT DOCUMENTS 4,264,393 A * 4/1981 Gorin ................ H01J 37/32082
                                                              422/906
6,162,488 A   12/2000 Gevelber et al.

6,335,288 B1   1/2002 Kwan et al.
8,007,588 B2   8/2011 Ito et al.
8,529,700 B2   9/2013 Carcia et al.
(Continued)

FOREIGN PATENT DOCUMENTS

JP         2014126263 A      7/2014

OTHER PUBLICATIONS

International Search Report and Written Opinion for International Application No. PCT/US2023/011464, mailed Jul. 26, 2023, 11 Pages.
Cho D., H., et al.. "Vision-based High Speed Wafer Film Thickness Profile Estimation with Nonlinear Regression," ODS: Industrial Optical Devices and Systems, SPIE, 2020, vol. 11500, pp. K1-K13.
(Continued)

*Primary Examiner* — Benjamin Kendall
(74) *Attorney, Agent, or Firm* — Lowenstein Sandler LLP

(57)                    ABSTRACT

Assemblies, system, methods, and devices for monitoring characteristics of a substrate disposed in a recess within a processing chamber. An assembly includes an enclosure structure forming an interior volume configured to support a substrate disposed within the interior volume. The substrate may be selectively removed from the enclosure structure. The enclosure structure may include an upper interior surface and a lower interior surface located below the upper interior surface. The interior volume is configured to direct a first mass transport of a reactive species to a first surface of the substrate, the reactive species corresponding to a substrate process. A first portion of the lower interior surface is configured to support the substrate. A second portion of the lower interior surface forms a channel configured to provide a second mass transport of the reactive species to a second surface of the substrate opposite the first surface.

23 Claims, 25 Drawing Sheets

(56)　　　　　References Cited

U.S. PATENT DOCUMENTS

| | | | |
|---|---|---|---|
| 9,792,393 | B2 | 10/2017 | Tetiker et al. |
| 10,197,908 | B2 | 2/2019 | Sriraman et al. |
| 12,333,700 | B2 | 6/2025 | Hicks et al. |
| 2001/0011424 | A1* | 8/2001 | Beulens ............ H01L 21/67017 |
| | | | 34/92 |
| 2003/0022528 | A1 | 1/2003 | Todd |
| 2003/0143324 | A1 | 7/2003 | Delzer et al. |
| 2004/0031776 | A1 | 2/2004 | Gevelber et al. |
| 2005/0107870 | A1 | 5/2005 | Wang et al. |
| 2006/0144335 | A1 | 7/2006 | Lee et al. |
| 2011/0117288 | A1 | 5/2011 | Honda |
| 2015/0219508 | A1 | 8/2015 | Bryant et al. |
| 2016/0322503 | A1 | 11/2016 | Tezuka et al. |
| 2017/0177997 | A1 | 6/2017 | Karlinsky et al. |
| 2018/0179630 | A1* | 6/2018 | Takezawa ........... H01L 21/0228 |
| 2019/0347398 | A1 | 11/2019 | Cramer |
| 2019/0368032 | A1 | 12/2019 | Harutyunyan |
| 2020/0377997 | A1 | 12/2020 | Trinh et al. |
| 2021/0175103 | A1 | 6/2021 | Madananth et al. |
| 2021/0407066 | A1 | 12/2021 | Dhandapani et al. |
| 2023/0085325 | A1 | 3/2023 | Kyokane et al. |
| 2024/0055282 | A1 | 2/2024 | Yang et al. |

OTHER PUBLICATIONS

Kaur K, et al., "Determining Real-time Mass Deposition with a Quartz Crystal Microbalance in an Electrostatic, Parallel-flow, Air-liquid Interface Exposure System," Journal of Aerosol Science, Jan. 2021, vol. 151, 13 Pages.

Notley S., et al., "Examining the Use of Neural Networks for Feature Extraction: a Comparative Analysis Using Deep Learning, Support Vector Machines, and K-Nearest Neighbor Classifiers," Arxiv Preprint arXiv:1805.02294v2, 2018, pp. 1-9.

Sippola M R & Nazaroff WW., "Experiments Measuring Particle Deposition from Fully Developed Turbulent Flow in Ventilation Ducts", Aerosol Science and Technology, Jul. 2004, pp. 914-925.

Thevenot A., "Understand and Visualize Color Spaces to Improve Your Machine Learning and Deep Learning Models," Towards Data Science, May 14, 2020, pp. 1-31. Retrieved from [https://towardsdatascience.com/understand-and-visualize-color-spaces-to-improve-your-machine-learning-and-deep-learning-models-4ece80108526].

Wostbrock N & Busani T., "Stress and Refractive Index Control of Sio2 Thin Films for Suspended Waveguides," Nanomaterials, Oct. 2020, pp. 1-9.

* cited by examiner

600A

602

604

606

608

600B

630

620

622

602

606

604

608

624

1200A 1202  1202  1202  1202  1202

1202

1204

1240

1250

1242

1260

1204

1202

1280

2600

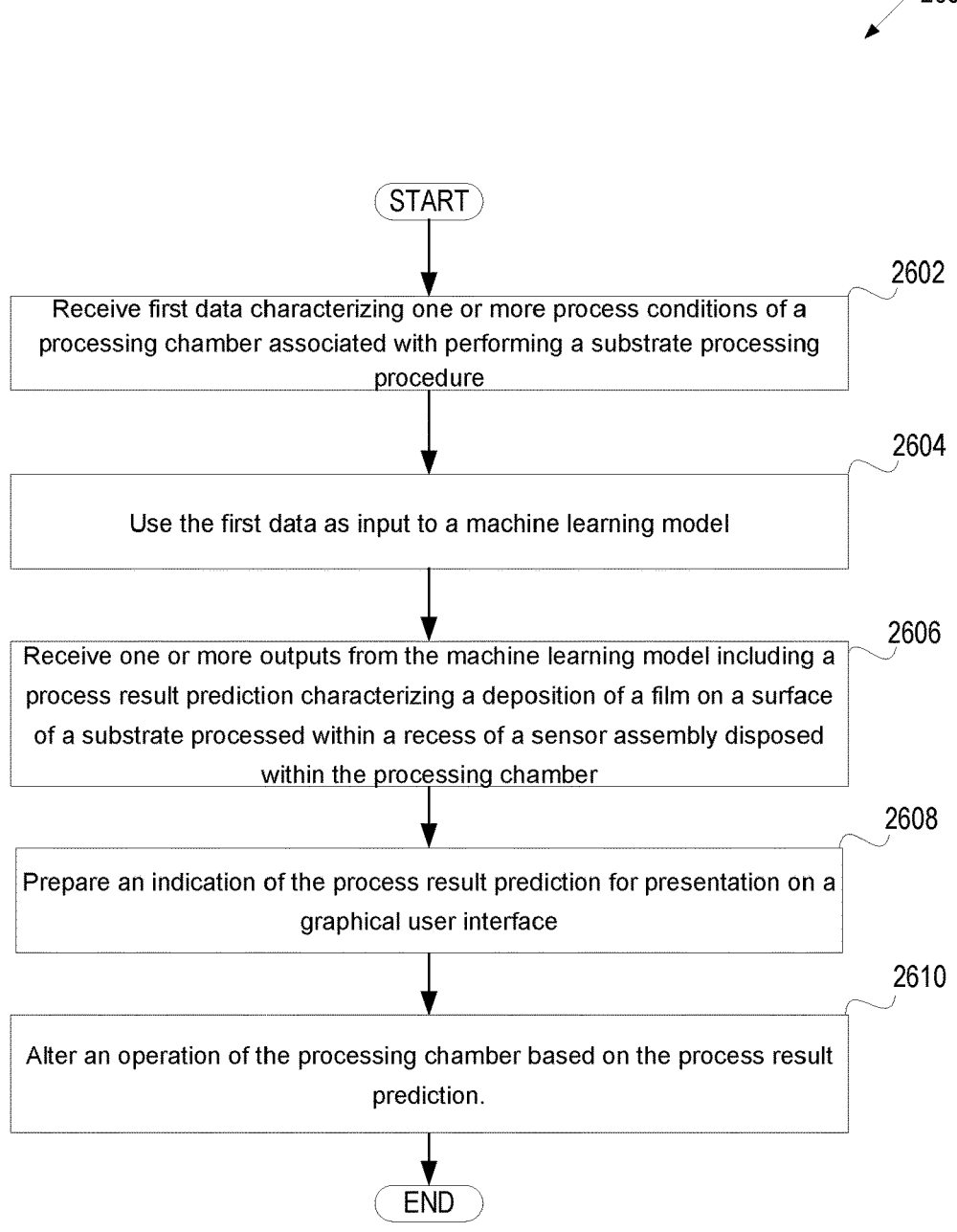

START

2602

Receive first data characterizing one or more process conditions of a processing chamber associated with performing a substrate processing procedure

2604

Use the first data as input to a machine learning model

2606

Receive one or more outputs from the machine learning model including a process result prediction characterizing a deposition of a film on a surface of a substrate processed within a recess of a sensor assembly disposed within the processing chamber

2608

Prepare an indication of the process result prediction for presentation on a graphical user interface

2610

Alter an operation of the processing chamber based on the process result prediction.

END

Data input 2801 (e.g., training input, validating input, testing input)

2800B

2900

CHEMICAL-DOSE SUBSTRATE DEPOSITION MONITORING

RELATED APPLICATIONS

This patent application is related to U.S. patent application Ser. No. 17/709,303 filed Mar. 30, 2022 titled "Chemical-Dose Substrate Deposition Monitoring," and is also related to U.S. patent application Ser. No. 17/709,304 filed Mar. 30, 2022 titled "Chemical-Dose Substrate Deposition Monitoring," both of which are incorporated by reference herein.

TECHNICAL FIELD

The instant specification generally relates to chemical-dose deposition monitoring of substrate processes. More specifically, the instant specification relates to devices, systems and method, for monitoring chemical-dose deposition and substrate process results.

BACKGROUND

Substrate processing may include a series of processes that produces electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate processes, conditions of processing chambers may be altered and may result in processed substrate failing to meet desired conditions and outcomes.

SUMMARY

The instant specification generally relates to devices, systems, and methods for chemical dose penetration into a narrow recess and/or non-line-of-sight (non-LOS) surfaces and process result monitoring. In some embodiments, an assembly includes an enclosure structure forming a first interior volume configured to support a substrate disposed within the first interior volume. The substrate may be selectively removable from the enclosure structure. The enclosure structure may include an upper interior surface and a lower interior surface located below the upper interior surface. The first interior volume is configured to direct a first mass transport (e.g., chemical diffusion with or without gas-phase convection) of a reactive species to a first surface of the substrate, the reactive species corresponding to a substrate process (e.g., reactants, products, etc.). A first portion of the lower interior surface is configured to support the substrate. A second portion of the lower interior surface forms a channel configured to provide a second mass transport of the reactive species to a second surface of the substrate opposite the first surface.

In some embodiments, a system includes a substrate processing chamber and a substrate monitoring assembly. The substrate monitoring assembly further includes an enclosure structure forming a first interior volume configured to support a substrate disposed within the first interior volume. The substrate is selectively removable from the enclosure structure. The enclosure structure may accommodate an individual substrate, in some, cases, however in other cases, the enclosure structure may accommodate a plurality of substrates. The enclosure structure further includes an upper interior surface and a lower interior surface located below the upper interior surface. The first interior volume is configured to direct a first mass transport (e.g., diffusion, gas flow, convections, movement of radicals, etc.) of a reactive species (e.g., reactants, products, etc.) to a first surface of the substrate. The reactive species corresponds to a substrate process. The first portion of the lower interior surface is configured to support the substrate. The second portion of the lower interior surface forms a channel configured to provide a second mass transport of the reactive species to a second surface of the substrate opposite the first surface. The system may further include multiple interior volumes formed by additional enclosure structures or the above described enclosure structure may form addition interior volumes with interior surfaces to perform analogous function as the first interior volume described herein.

In some embodiments, a substrate monitoring device includes a first planar structure having a bottom surface. A second planar structure coupled to the first planar structure. The second planar structure having a top surface. The bottom surface of the first planar structure and the top surface of the second planar structure forms a first slot configured to at least partially enclose a first substrate disposed within the first slot. The first slot provides a first mass transport of a reactive species associated with a substrate processing procedure to a first surface of the first substrate. The top surface of the second planar structure includes a first portion disposed in a first plane and configured to contact the bottom surface of the first planar structure. The top surface of the second planar structure further include a second portion in a second plane below the first plane and configured to support the first substrate. In some embodiments, the substrate monitoring device may include a stack of multiple planar structure for multiple interior volumes analogous to the first and second planar structure described herein.

In some embodiments, a method includes receiving, by a processing device, image data characterizing light reflected from a substrate surface. The image data may correspond to one or more locations across a surface of the film. The method further includes determining red-blue-green color data ratios as well as overall brightness in comparison to a standard indicating one or more data representations of color and/or brightness corresponding to the one or more locations across the surface of the film using a mapping scheme. In some embodiments, an optical sensor may correspond to light beyond the visible spectrum (e.g., light visible to the human eye) such as for example, a full-spectrum sensor that captures light from the deep ultraviolet (UV) to the far infrared (IR) (and in some cases radio frequency (RF) signal. The method may further include processing the color data using one or more machine-learning models (MLMs). The method further includes determining one or more values corresponding to the film thickness, index of refraction, degree of diffuse light scattering or other properties at the one or more locations. The method further includes preparing the one or more metric values for display on an electronic interface such as a console for a programming language, a window of a graphical user interface (GUI), a smart-phone app or other hand-held device etc. In some embodiments, processing logic prepares the one or more metric values for processing in a script-based environment (e.g., scripting programming language).

In some embodiments, a method for training a machine learning model (MLM) includes generating training data for the machine learning model. Generating the training data includes identifying a first training input having first image data characterizing light reflected from a first set of locations across a "processed" substrate. Generating the training data further includes identifying a first target output for the first training input. The first target output indicates a first process metric profile (e.g., a thickness profile, an index of refraction profile, a darkening and/or diffuse scattering profile (e.g., such as due to roughness)) of the first film. The first process result metric profile indicates one or more process result metric values (e.g., thickness values, index of refraction values, diffusion values, etc.) corresponding to the first set of locations across the first film. The method further includes providing the training data to train the machine learning model on a set of training inputs comprising the first training input and a set of target outputs comprising the first target output. The trained machine learning model is to receive a new input having new image data characterizing light reflected from a new set of location across a new film disposed on a new substrate and determine a new output. The new output indicating a new process result profile of the new film. The new process result profile indicating one or more process result metric value corresponding to the new set of locations across the new film.

In some embodiments, a non-transitory machine-readable storage medium comprising instructions that, when executed by a processing device, cause the processing device to perform operations including receive, by a processing device, image data characterizing light reflected from a film disposed on a processed surface of a substrate. The image data corresponds to one or more locations across a surface of the film and indicates a camera perspective angle associated with capturing the image data. The operations further include determine, using the image data, reflection data indicating one or more reflection effects of the light reflected from the film. The operations further include processing the color data using one or more MLMs. The operations further include determining one or more process result metrics corresponding to the film at the one or more locations. The operations further include prepare the one or more thickness value for display on a graphical user interface (GUI). The operations may further include preparing the one or more process result metrics for processing in a script-based environment.

In some embodiments, a method includes receiving, by a processing device, first data characterizing a processed surface of a film on a surface of a substrate processed within a recess of a sensor assembly positioned in a first region of a processing chamber. The deposition of the film may correspond to a substrate processing procedure. The method further includes determining, based on the first data, a rate of advancement of a first processed surface boundary of the film across the surface of the substrate. The method further includes determining, using the rate of advancement, a dosage strength (e.g., reactive species concentration, particle mass flow rate, etc.) of a reactive species delivered to the first region of the processing chamber. The method may include preparing an indication of the dosage strength for presentation on a graphical user interface (GUI). The method may include altering an operation of the processing chamber based on the dosage strength.

In some embodiments, a method includes receiving, by a processing device, first data characterizing one or more process conditions of the processing chamber. The one or more process conditions are associated with performing a substrate processing procedure. The method further includes determining a process result prediction by processing the first data using one or more machine learning models (MLMs). The process result prediction characterizes a deposition of a film on a surface of a substrate processed within a recess of a sensor assembly disposed within the processing chamber. The substrate is processed according to the substrate processing procedure under the one or more process conditions. The method may include preparing an indication of the process result prediction for presentation on a graphical user interface (GUI). The method may include altering an operation of the processing chamber based on the process result prediction.

In some embodiments, a system includes a processing chamber and a sensor assembly positioned in a first region of the processing chamber. The sensor assembly forms a recess configured to receive and support a substrate. The system may further include a processing device coupled to the sensor assembly. The processing device may receive, from the sensor assembly, first data characterizing a deposition of a film on a surface of the substrate processed within the recess of the sensor assembly. The deposition of the film corresponds to a substrate processing procedure. The processing device may further determine, based on the first data, a rate of advancement of a first deposition boundary of the film across the surface of the substrate. The processing device may further determine, using the rate of advancement, a dosage strength of a deposition material delivered to the first region of the processing chamber. The processing device may further prepare an indication of the dosage strength for presentation on a graphical user interface (GUI). The processing device may further alter an operation of the processing chamber based on the dosage strength.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

FIG. 26 depicts a flow diagram of one example method for monitoring deposition on a substrate, in accordance with some implementations of the present disclosure.

DETAILED DESCRIPTION

Figures 1, 2:
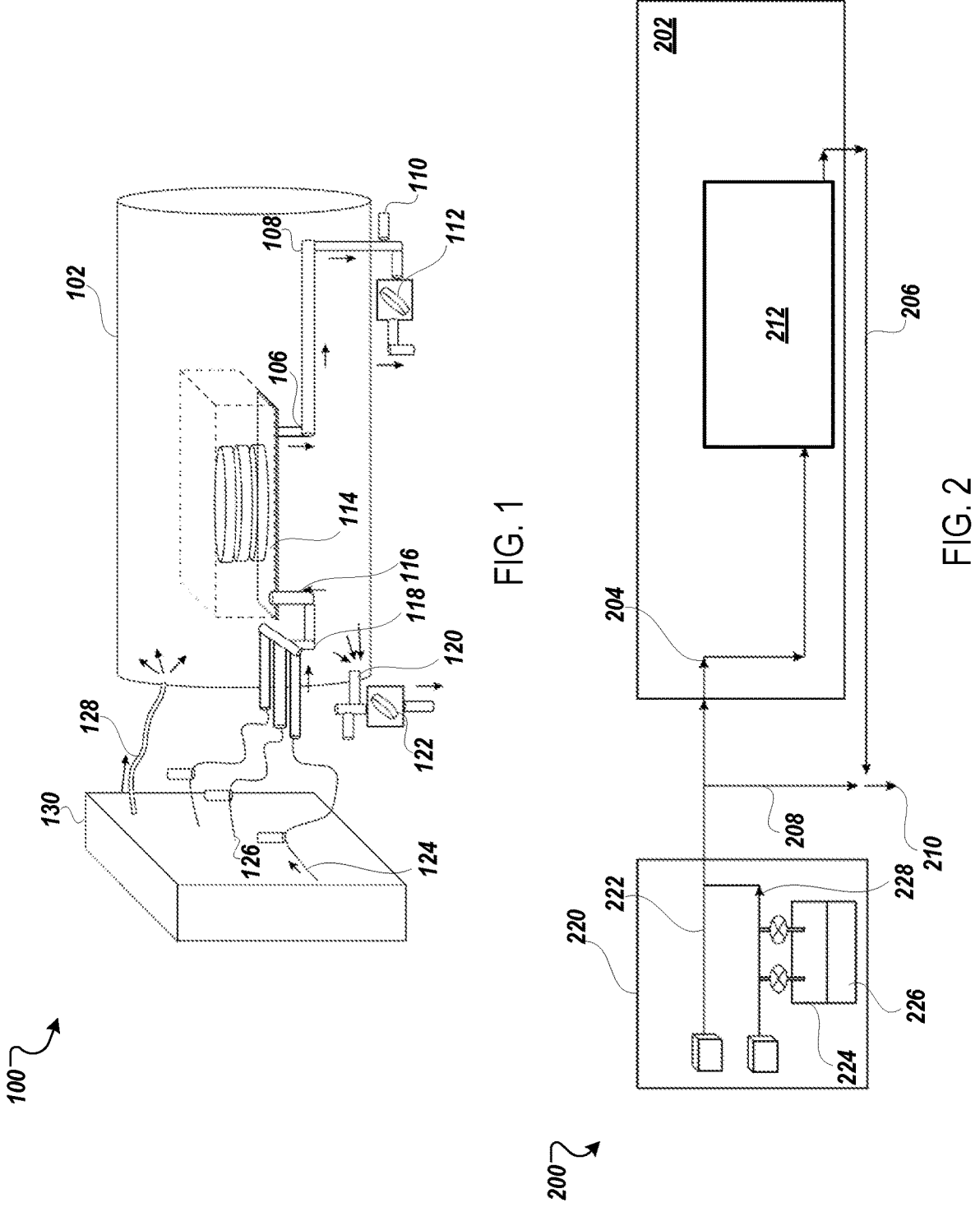
FIG. 1 illustrates a processing system including a process chamber and a gas panel, in accordance with some implementations of the present disclosure.
FIG. 2 illustrates a substrate process system, in accordance with some implementations of the present disclosure.

Substrate processing may include a series of processes that produces electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate procedures, conditions of processing chambers may depreciate and result in processed substrates failing to meet desired conditions or process results (e.g., critical dimensions, process uniformity, thickness dimensions, etc.).

The internal hardware of the semiconductor equipment may be referred to as a kit (of chamber components). Wafers passing through in production may be monitored for defects. Furthermore, special quality-control wafers will periodically pass through the same production process and be immediately sent for inspection for particle count, metal contamination and defects. Chambers can fail a certain qualification for a variety of reasons, particularly if the chamber's current kit is near the end-of-life and degradation from various thermal, chemical, plasma and mechanical processes have begun to shed microscopic fragments, (e.g. particles or other defects).

Robust chamber kits that go for a long period between preventative maintenance (PM) give a high rate of green-to-green (G2G) (e.g. not down for maintenance as well as saving costs from less frequent consumption of kits).

Chamber components resist corrosive environments of harsh plasma-ionized and radicalized halides as well as oxidizing (oxygen) and reducing (hydrogen). Chamber material designs can be considered in view of these corrosive environment. Solid metals such as steel, nickel, molybdenum, titanium and aluminum can be used with aluminum being popular due to the low cost and easy machinability. Metal, especially aluminum, can degrade and generate particles quickly in corrosive plasmas, (e.g. halides), and often need a coating. Non-metal components are largely bulk-sintered ceramics such as $Al_2O_3$, $Y_2O_3$ and proprietary compounds. Additionally, pure quartz and silicon can serve in some applications. Non-metal components are sometimes coated as well.

A variety of deposition techniques can be used to coat components. Plasma spray is popular due to the low cost but has drawbacks being that the film is rough, porous and does not get into non-line-of-sight recesses. ALD, on the other hand, is likely the most expensive type of coating due to the slow deposition rate but the density and conformality are, relatively, of exceptionally good quality.

The semiconductor making method of semiconductor device structure is used to form (for example, transistor, memory elements, integrated electricity, and the like) it is broad range of, and especially may include deposition methods, engraving methods, thermal annealing processes, photolithography methods and doping methods.

Atomic layer deposition (ALD) is a vapor phase technique used to deposit thin films onto a non-line-of-sight (non-LOS) substrate with a constant thickness that conforms to all rough surface features including high-aspect-ratio trenches (e.g., exceeding 100:1). The process of ALD involves the surface of a substrate being exposed to alternating precursors, which do not overlap but instead are introduced sequentially. In each alternate pulse, the precursor molecule reacts with the surface in a self-limiting way, this ensures that the reaction stops once all the reactive sites on the substrate have been used. A complete ALD cycle is determined by the nature of the precursor-surface interaction. The ALD cycle can be performed multiple times to increase the layers of the thin film, depending on the process specifications.

The process of ALD is often performed at lower temperatures (150 to 350 Degrees Celsius), which is beneficial when working with substrates that are fragile or cannot tolerate high temperatures such as polymers, and some thermally unstable precursors can still be employed with ALD if the desorption or decomposition rates are slow enough that non-uniform gain or loss of the monolayer thickness is below a certain threshold to survive through the time of the pulse/purge half-cycle. A wide range of materials can be deposited using ALD, including oxides, metals, sulfides, and fluorides, and there is a wide range of properties that these coatings can exhibit. Some ALD can be enabled at lower temperatures by the addition of a direct plasma-generation around the substrate or a remote plasma that provides non-ionized radicals. This is often called PE-ALD ("plasma assisted"). A drawback of PE-ALD is ions and radicals have the highest density near the surface of the substrate but less effect in recessed locations, especially deeply-recessed or high-aspect-ratios, which could result in the film quality quickly degrading depending on how recessed the location is. Also, precursor chemistry design is a challenging field. The well-known trimethylaluminum has the metal aluminum surrounded by 3 methyl ligands for an overall low molecular weight. Although TMA exists as a dimer (a paired molecule for doubled molecular weight) the molecular weight is still low enough to allow the molecule to quickly diffuse deep into recesses. It has excellent self-limiting monolayer properties and works efficiently with water to result in a robust process to give consistent results in a variety of conditions in temperature, pressure, purge times, types of substrates etc. The case is different for the majority of other elements, especially heavy metals, which need 3 to 4 ligands where each ligand can have 5 to 10 carbon or nitrogen atoms (plus pairing hydrogens) that place molecular weights in excess of 400 grams per mol. Such precursors are extremely slow to diffuse deep into recesses and in some cases have trouble leaving the ampoule because carrier gases such as nitrogen do not carry enough atomic momentum and will separate in flow leaving the precursors behind in the ampoule (heavier gases such as argon may be employed).

The process of Atomic Layer Etch (ALE) is the reverse of atomic layer deposition, where a self-limiting monolayer of "species A" partially reacts with the top surface of a film and is then assisted by "species B" to cleave that layer off of the film surface. ALE is of growing importance in controlling feature sizes of nm-scale components of printed electrical circuits.

Selective ALD or ALE is the process of using an inhibiting agent, for example, "species D" that prevents a monolayer of the respective deposition or etching ligands to form (e.g. repels the molecular bonding by blocking the sites). In patterning schemes the inhibitors can transfer a mask pattern. Inhibitors don't stay indefinitely and may allow a partial deposition to nucleate and displace the inhibitor agents.

Chemical vapor deposition (CVD) is the process of reactive gas-phase species that are continually present and growing the film. It may involve one, two or more different species. Also competing deposition and etching processes may take place. There are thermal processes as well as radical-assisted and plasma-assisted. CVD has an advantage over ALD of significantly higher growth rates as most of the time in an ALD process is non-deposition to wait on the purge processes. Also, CVD is sensitive to recesses where the extent depends on the relative rate-limiting kinetics. If the surface reaction rate is too fast, then the rate of deposition will proceed too slowly in the recesses if at all due to depletion of reactants diffusing. If the reaction is too slow on the surface it will have good overall uniformity and conformality but at the expense of the speed of deposition. Also, unlike ALD, which separates species so that they would not co-mix, CVD has additional requirements of the chemistry to be able to react on the surface and not in the bulk and may be highly-sensitive to temperature. PE-CVD can widen the temperature window, especially to make possible at lower temperatures with the same challenge of surface vs recess deposition rates.

Dry etch includes a variety of sub-categories such as reactive ion etch, radical etch, remote plasma etch (RPE) etc. RPE can etch recesses as well as the top-most surface with the etch rate decreasing in recesses due to both radical recombination and radical consumption. A gas-phased cleaning process that needs to penetrate recesses in order to remove unwanted films such as polymerized combinations of carbon, hydrogen, fluorine, chlorine, silicon etc.

Dope-modification example could be using a nitrogen plasma to inject nitrogen radicals into a coating of $SiO2$ on a substrate and convert to $SiOxNy$. A recessed limited by diffusion will alter the rate and quality of conversion and eventually phase out with deeper and narrower recesses.

Hardware components often use coating into fine holes and other non-line-of-sight (non-LOS) recesses. Conventional methods to measure and evaluate substrate process results within fine hole and other non-LOS recesses often involved time-consuming and resource intensive processes. In conventional systems to evaluate an extend of a deposition within a recess a component often would need to be dismantled or split up to expose the hidden surface to be evaluated. Traditionally, substrate devices are traditionally measured by costly and time-consuming cross-sectional scanning electron microscopy (SEM) or transmission electron microscopy (TEM). Without the details and concepts of the present disclosure, conventional methods often involved cutting up an actual part and performing cross-sectional metrology which typically renders the substrate unfit for reuse. The conventional method of performing metrology often demands a duration of time for performing the TEM and SEM procedures.

Aspects and implementation of the present disclosure address these and other shortcomings of the existing technology by providing methods and systems in various embodiments capable of determining metrology data without performing costly and time consuming conventional metrology techniques. Hardware components often use coating into fine holes and other non-LOS recesses. Aspects of the disclosure include an enclosure with a removable strip (e.g., a substrate such as silicon) that can quickly be measured by techniques such as ellipsometry. In some aspects the enclosure can be reused by inserting a fresh substrate (e.g., a strip). The spacing "s" of slot or recess can be varied and correlated (e.g., using a linear correlation) for improved process assessment accuracy. For example, the extend of deposition on the strip verse the depth into the recess depends on factors such as pulse time, pulse concentration, diffusivity of the reactant, gas pressure, temperature, surface roughness (are), reactant sticking coefficient. One or more of the previous identified factors may be correlated to process result to predict process results and alter process parameters to improve future substrate processing (e.g., to meet desired processing conditions).

In an example embodiment, an assembly includes an enclosure structure forming a first interior volume configured to support a substrate disposed within the first interior volume. The substrate may be selectively removable from the enclosure structure. The enclosure structure may include an upper interior surface and a lower interior surface located below the upper interior surface. The first interior volume is configured to direct a first mass transport of a reactive species to a first surface of the substrate, the reactive species corresponding to a substrate process. A first portion of the lower interior surface is configured to support the substrate. A second portion of the lower interior surface forms a channel configured to provide a second mass transport of the reactive species to a second surface of the substrate opposite the first surface.

In an example embodiment, a system includes a substrate processing chamber and a substrate monitoring assembly. The substrate monitoring assembly further includes an enclosure structure forming a first interior volume configured to support a substrate disposed within the first interior volume. The substrate is selectively removable from the enclosure structure. The enclosure structure further includes an upper interior surface and a lower interior surface located below the upper interior surface. The first interior volume is configured to direct a first mass transport of a reactive species to a first surface of the substrate. The reactive species corresponds to a substrate process. The first portion of the lower interior surface is configured to support the substrate. The second portion of the lower interior surface forms a channel configured to provide a second mass transport of the reactive species to a second surface of the substrate opposite the first surface.

In an example embodiment, a substrate monitoring device includes a first planar structure having a bottom surface. A second planar structure coupled to the first planar structure. The second planar structure having a top surface. The bottom surface of the first planar structure and the top surface of the second planar structure forms a first slot configured to at least partially enclose a first substrate disposed within the first slot. The first slot provides a first mass transport of a reactive species associated with a substrate processing procedure to a first surface of the first substrate. The top surface of the second planar structure comprises: a first portion disposed in a first plane and configured to contact the bottom surface of the first planar structure; and a second portion in a second plane below the first plane and configured to support the first substrate.

In an example embodiment, a method includes receiving, by a processing device, image data characterizing light reflected from a film disposed on a substrate. The image data may correspond to one or more locations (e.g., as many as 100 million in as high pixel-density map) across a surface of the film. The method further includes determining color data indicating one or more data representations of color corresponding to the one or more locations across the surface of the film using a color mapping scheme. The method may further include processing the image data using one or more machine-learning models (MLMs). The method further includes determining one or more thickness values corresponding to the film at the one or more locations. The method further includes preparing the one or more thickness values for display on a graphical user interface (GUI).

In an example embodiment, a method for training a machine learning model (MLM) includes generating training data for the machine learning model. Generating the training data includes identifying a first training input having first image data characterizing light reflected from a first set of locations across a first film disposed on a first substrate. Generating the training data further includes identifying a first target output for the first training input. The first target output indicates a first process result profile (e.g., thickness profile, index of refraction, hue, darkening, scattering, etc.) of the first film. The first thickness profile indicates one or more thickness values corresponding to the first set of locations across the first film. The method further includes providing the training data to train the machine learning model on a set of training inputs comprising the first training input and a set of target outputs comprising the first target output. The trained machine learning model is to receive a new input having new image data characterizing light reflected from a new set of location across a new film disposed on a new substrate and determine a new output. The new output indicating a new thickness profile of the new film. The new output indicates a new thickness profile of the new film. The new thickness profile indicating one or more thickness value corresponding to the new set of locations across the new film.

Some aspects of the present disclosure provide for an in-situ fixture assembly for providing a customizable and repeatable measurement standard to assess the extent of a non-LOS process such as atomic layer deposition (ALD), chemical vapor deposition (CVD), atomic layer etch (ALE), remote plasma dry etch, area-selective ALD (inhibitors) and the like to conformally coat through complicated and highly-recessed geometries with many features (e.g., in order to be small-scale representation but a key indicator of the process to meet expectations for a full-size and fully-complicated hardware). Some aspects of the present disclosure include a device capable of set up pre-defined constraints, optimized for the needs of the larger hardware. The device constraint may be a narrow gap between two parallel plate with all other areas closed off. The assessment of a process capability can be correlated of the depth of penetration into the recesses of the device as a function of the process settings. In some aspects of the present disclosure, the device may be part of a larger assembly that includes multiple devices with varying constraints of varying difficulty.

In an example embodiment, a non-transitory machine-readable storage medium comprising instructions that, when executed by a processing device, cause the processing device to perform operations including receive, by a processing device, image data characterizing light reflected from a film disposed on a substrate and indicating a camera perspective angle associated with capturing the image data. The image data corresponds to one or more locations across a surface of the film. The operations further include determine, using the image data, reflection data indicating one or more reflection effects of the light reflected from the film. For example, the reflection data may include representations of color corresponding to the locations across the surface of the film using a color mapping scheme. The operations further include process the reflection data using one or more MLMs. The operations further include determine one or more process result metrics corresponding to the film at the one or more locations. The operation further includes prepare the one or more process result metrics for display on a graphical user interface (GUI). The operations may further include preparing the one or more process result metrics for processing in a script-based environment.

In an example embodiment, a method includes receiving, by a process device, first data characterizing a processed surface of a film on a surface of a substrate processed within a recess of a sensor assembly positioned in a first region of a processing chamber, wherein the processed surface of the film corresponds to a substrate processing procedure. The method further includes determining, based on the first data, a rate of advancement of a first processed surface boundary of the film across the surface of the substrate. The method further includes determining, using the rate of advancement, a dosage strength of a reactive species delivered to the first region of the processing chamber. The method may include preparing an indication of the dosage strength for presentation on a graphical user interface (GUI). The method may include altering an operation of the processing chamber based on the dosage strength.

In an example embodiment, a method includes receiving, by a processing device, first data characterizing one or more process conditions of the processing chamber. The one or more process conditions are associated with performing a substrate processing procedure. The method further includes determining a process result prediction by processing the first data using one or more machine learning models (MLMs). The process result prediction characterizes a processed surface of a film on a surface of a substrate processed within a recess of a sensor assembly disposed within the processing chamber. The substrate is processed according to the substrate processing procedure under the one or more process conditions. The method may include preparing an indication of the process result prediction for presentation on a graphical user interface (GUI). The method may include altering an operation of the processing chamber based on the process result prediction.

In an example embodiment, a system includes a processing chamber and a sensor assembly positioned in a first region of the processing chamber. The sensor assembly forms a recess configured to receive and support a substrate. The system may further include a processing device coupled to the sensor assembly. The processing device may receive, from the sensor assembly, first data characterizing a processed surface of a film on a surface of the substrate processed within the recess of the sensor assembly. The processed surface of the film corresponds to a substrate processing procedure. The processing device may further determine, based on the first data, a rate of advancement of a first deposition boundary of the film across the surface of the substrate. The processing device may further determine, using the rate of advancement, a dosage strength of a reactive species delivered to the first region of the processing chamber. The processing device may further prepare an indication of the dosage strength for presentation on a graphical user interface (GUI). The processing device may further alter an operation of the processing chamber based on the dosage strength.

FIG. 1 illustrates a processing system 100 including a process chamber 102 and a gas panel 130, in accordance with some implementations of the present disclosure. The process chamber 102 may be used for processes in which a corrosive plasma environment having plasma processing conditions is provided. For example, the processing chamber 102 may be a chamber for a plasma etcher or plasma etch reactor, a plasma cleaner, and so forth. Examples of chamber components that may include a multi-component coating include chamber components with complex shapes and holes having large aspect ratios. Some example chamber components include a substrate support assembly, an electrostatic chuck (ESC), a ring (e.g., a process kit ring or single ring), a chamber wall, a base, a gas distribution plate, a showerhead, gas lines, a nozzle, a lid, a liner, a liner kit, a shield, a plasma screen, a mass transport equalizer, a cooling base, a chamber viewport, a chamber lid, and so on.

The processing chamber 102 may be configured to perform atomic layer deposition (ALD) which can allow for the application of a conformal coating of relatively uniform thickness on all types of components including components with complex shapes and holes with large aspect ratios. ALD is a thin-film deposition technique based on a gas-phase chemical process. The majority of ALD reactions use two chemicals often referred to as precursors (or reactants). The precursors react with the surface of a material one at a time in a sequential, self-limiting, manner. A thin film is slowly deposited through repeated exposure to separate precursors. In some embodiments, precursors, may include TMA+Water (or Ozone) for $Al_2O_3$. Other example may include. EtCp2Mg+water (or Ozone) for MgO2; YEtCp3+water (or Ozone) for Y2O3; and/or TiCl4+water for TiO2. (Cp is an acronym for the cyclopentyl ligand)

In some embodiments, the process chamber is configured to perform ALD. In other embodiments the processing chamber is configured to perform chemical vapor deposition (CVD), plasma-assisted ALD, radical surface cleaning radical etch reactive ion etch, ALD-inhibition (and reverse ALD inhibition), seed layer formation, and/or other processes leverage gas-phase diffusion to transport chemicals to a surface.

As shown in FIG. 1 the processing system 100 includes a gas panel 130 with a chamber gas line 128, precursor delivery lines 124, and one or more gas sensors (e.g., pressure sensor such as a manometer, gas flow rate monitor, gas concentration sensor, and the like). The gas chamber line delivered a gas to the larger processing chamber 102. For example, the chamber gas line may deliver nitrogen to the chamber. The nitrogen (N2) may continuously be provided as a purge gas and pumped out. The precursor delivery lines 124 may each be associated with individual precursor gases and/or dilution gases. For example, process gases including an N2 carrier gas and an N2 dilution gas may be delivered to an inner chamber 114 of the process chamber 102. The inner chamber may provide in interior volume for the atomic deposition (e.g., precursor reaction on a surface of a substrate) occurs. Process parameters of the processing chamber 102 include controlling a mass transport of one or more of the chamber gases, precursor gases, and/or dilution gases into and out of the processing chamber 102.

The processing system 100 may include an outer chamber foreline 120 and an outer chamber throttle valve (TV) 122 disposed on the outer chamber foreline 120. The outer chamber foreline 120 directs gas out of the outer chamber 102. The outer chamber TV 122 may be selectively operated to open or close a gas abatement path for gases disposed within the outer chamber of the processing chamber 102. The processing system 100 includes a gas inlet manifold 118 and an inner chamber seal (e.g., inlet gravity seal) that facilitate a mass transport of the previously identified gases precursor and/or dilution gases into the inner chamber 114. The gas inlet manifold 118 and the gas inlet seal 116 facilitate maintenance one or more condition of the inner chamber (e.g., pressure, temperature, reaction rate, vacuum conditions, etc.) The chamber TV 122 may be selectively operated to open or close an abatement path the removes an amount of the precursor and/or dilution gas from the substrate processing system. The substrate processing system 100 may further include an outlet seal 106 (e.g., outlet gravity seal), an inner chamber foreline 108, an inner chamber monitoring device 110 (e.g., a pressure sensor, a manometer, mass flow controller, etc.), and an inner chamber TV 112. The outlet seal 106 may selectively block a flow of gas out of the inner chamber while facilitating maintenance on conditions within the inner chamber (e.g., pressure, temperature, reaction rate, vacuum conditions, etc.). The inner chamber TV may selectively control a gas flow output from the inner chamber TV 112.

FIG. 2 illustrates a substrate process system 200, in accordance with some implementations of the present disclosure. The substrate process system comprises processing chamber with an outer chamber 202 and an inner chamber 212. The substrate process system 200 includes a gas panel 220 with one or more chemical delivery lines (e.g., gas delivery lines). The gas panel includes one or more dilution gas line 222 and one or more carrier gas lines 228. The carrier gas lines may be couple to a vaporization chamber 224 (e.g., ampoule) housing a precursor 226. The precursor 226 and carried to the chamber using foreline 204 (e.g., delivery manifold). The substrate process system further includes a diverting foreline 208 designed to divert a flow of one or more of the dilution gas 222 and/or the carrier gas 228 (with precursor 226) in an alternative path to downstream processes 210 not including the inner chamber 212 and the outer chamber 202. The substrate process system 200 includes a foreline 206 to deliver gas from the inner chamber to downstream processes 210. In some embodiments, the dose is streamed from the carrier flow by redirecting through the ampoule for a precise length of time (e.g., on the order of 0.1 to 1 second). The time is roughly proportional to the mass except for deviances related to details of the gas panel configuration and intrinsic latencies of relative valve controls.

In operation, a substrate to be processed is positioned within inner chamber 212 and combinations of dilution gases 222 and carrier gases 228 (with precursor 226) are delivered to the processing chamber. The combination of delivered gases perform atomic layer deposition (ALD) which can allow for the application of a conformal coating of relatively uniform thickness on all types of components including components with complex shapes and holes with large aspect ratios. ALD is a thin-film deposition technique based on a gas-phase chemical process. The precursors react with the surface of a material one at a time in a sequential, self-limiting, manner. A thin film is slowly deposited through repeated exposure to separate precursors. Various parameters in addition to flow rates and/or types of gases delivery to the inner chamber 212 can be altered to affect an overall dosage of deposition material delivered to various regions of the inner chamber 212, such as, for example, a temperature, pressure, vacuum condition of the chamber ail potentially affecting the fluence and diffusivity of the deposition material delivered by the dilution gases 222 and/or carrier gases 228.

In some embodiments, the delivery of one or more chemicals to the inner chamber is performed in accordance with a process recipe or more generally a process procedure. A process recipe may include heating and cooling phases, gas delivery phases, pressure adjustments, gas dilution phases, gas carrier phases, and repeated cycles of one or more of the described actions. The process recipe may be associated with a desired process result of a substrate undergoing processing according to the process recipe.

In some embodiments, delivery of one or more chemicals to the inner chamber may include use of a basic atomic layer deposition (ALD cycle. A basic ALD cycle has a dose of a precursor that will dissociate ligands in reacting with the surface so that a first reactive species, species A, is partially bonded to the surface and partially to ligands. Physically adsorbed portions of species A are removed by a purge flow of inert gas. A second species, species B, enters as a second precursor where a first bond between species A and species B is formed. The bond may completely displace the remaining ligands of species A, while keeping some ligands of species B. A purge cycle is followed to remove portions of species B that have been physically-adsorbed (e.g., not reacted to). In some embodiments, a separate cycle of a third species C and a four species D (e.g., a precursor) may be deposited after a set number layers (e.g., on top of the prior deposited layers) comprising a bonded combination of species A and species B. In some embodiments, in one or more of the layers species B may be replaced with another species that reacts with species A such as species E (e.g., a different precursor) to form a layer comprising species A and species E bonded together. Similarly, the species D may be substituted with species F (e.g., a different precursor) that reacts with species C. The use of alternating layer stacks and varied precursors is sometime referred to as a supercycle.

In the post-processing device the respective fronts (e.g., deposition boundaries) of various deposition regions (e.g., species A bonded with species B, species C bonded with species D, species A bonded with species E, etc.) will most likely be different so that the region where all three layer coexist (e.g., a layer include species A and B, a layer including species C and D, and a layer including species A and E is determined by which of the layers has the shortest front (e.g., the smallest area a layer covers indicates where all three layers coexist). For example, if the layer comprised of species C and D is the shortest then a portion of the deposition having all three define layers will exist and terminate with another portion of deposition including a layer comprised of species A and B and a layer having species A and E without a layer including species C and D for this described portion. If the layer including species A and F is the next shortest layer, then a portion of the deposition may include a portion where a layer comprised of species A and B independently exists. The references to shortest, longest, length, front may be in association with an axis that extends from a reactive species source (e.g., an opening to an enclosure) and extends within a recess of object to be processed. For example, shortest may be in reference to a distance a deposition occurs from the opening and how far the deposition extends into the recess (e.g., a non-LOS surface)

Figure 3:
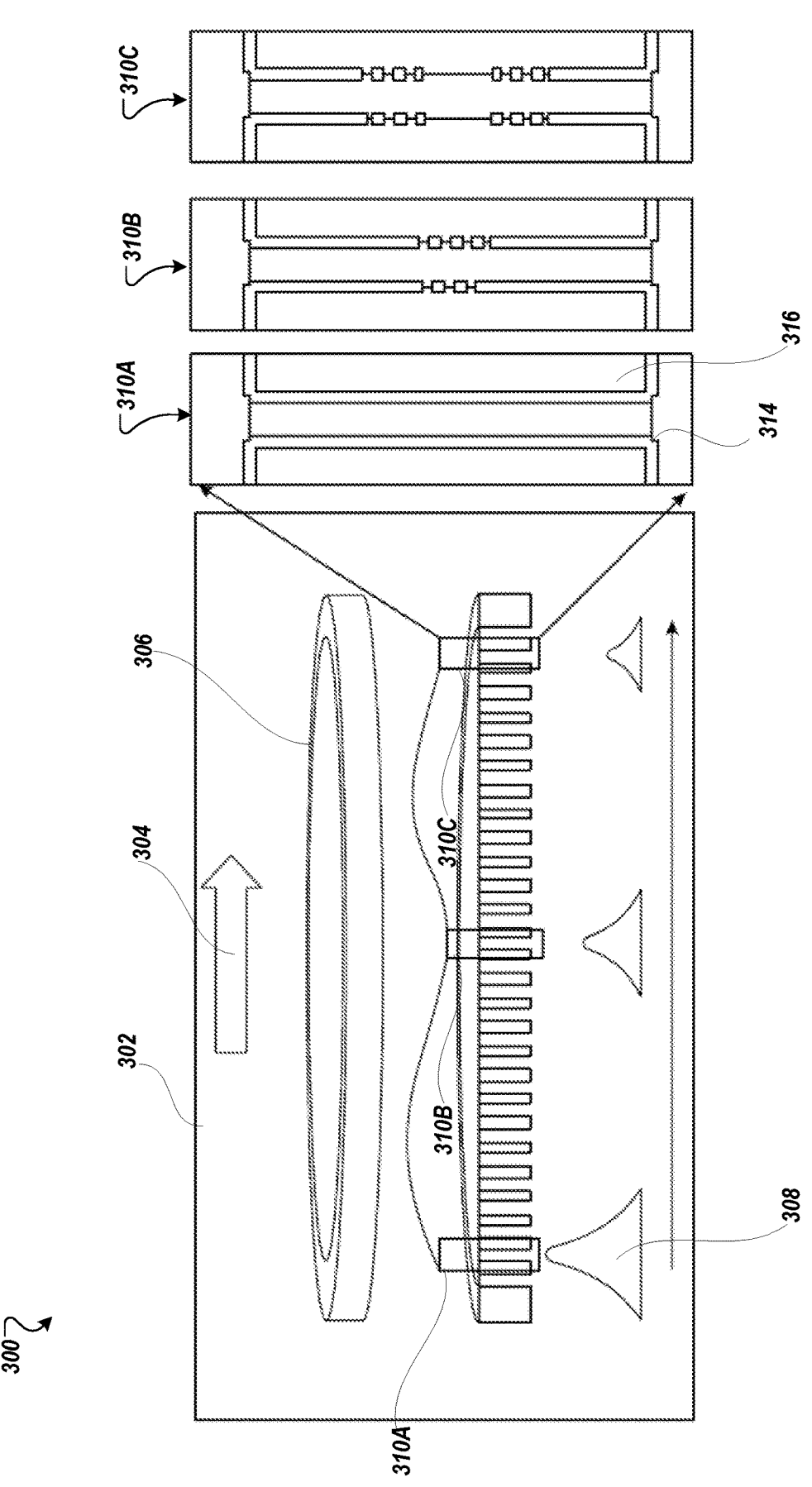
FIG. 3 illustrates a processing chamber including recessed features to be processed, in accordance with some implementations of the present disclosure.

FIG. 3 illustrates a processing chamber 300 including recessed features 310A-C to be processed, in accordance with some implementations of the present disclosure. The processing chamber 300 includes an inner chamber 302 housing a flow facilitation device such as a faceplate 306 that directs a flow 304 of ALD chemistry 308 along a plane within the processing chamber 300. As shown in FIG. 3, the flow of ALD chemistry 308 may be inconsistent throughout a chamber based one or more various factors including chamber conditions, locations to the ALD chemistry source (e.g., gas intake location where the dose is strongest and becomes weaker progressing downstream due to the consumption), surface area of surfaces being processed including corrections accounting for nano-pores, micro-roughness and machined texture, dosage of the ALD chemistry source to the various locations within the process chamber where the convective flow is restricted and insufficient dose is delivered to the proximity, and the like.

As shown in FIG. 3, the processing chamber 300 includes features 310A-C disposed at different locations (e.g., chamber regions) within the chamber. The features may include one or more surfaces (e.g., surface 316) designed to receive conformal coating (e.g., coating 314). The features 310A-C may include holes (e.g., fine holes) and other non-line-of-sight (non-LOS) recesses. As shown by features 310A-C in FIG. 3, the features coat at different rate and at any given moment each feature may have various process result characteristics (e.g., deposition film thickness, surface coverage of the film, "creep" distance or distance the film has advance from the opening to the ALD chemistry flow.

Conventional methods dictate ensuring coverage by dosing with an abundance of excess. Traditional "saturation" of flat coupons determines the minimum dose for all flat surfaces to have coating. However the method has no indication of penetration to recesses. In practice the minimum dose for flat-surface saturation will be assigned an arbitrary multiplier that ensures chemistry is available in abundant excess to leave no recesses uncoated because the extension of saturation of recesses, which rapidly deplete chemical ampoule sources and shorten the life of the abatement system. This is due to not knowing the recessed saturation trend as seen 310A-C due to the high costs of performing multiple destructive failure analysis over a series of doses to make the determination.

In some embodiments, the geometry of the processed features 310A-C may cause difficulty in determining whether the feature has been processed to receive a conformal coating along the entire surface of the feature. Further, holes or other relatively small non-LOS recesses can cause difficulty in evaluating process results of a deposition of film. The use of a substrate monitoring device, as will be further discussed in associated with FIG. 4, may be leveraged within processing chamber 300 at various location to monitor a deposition and provide an evaluation of a deposition of film within non-LOS recesses such as fine hole.

In some embodiments, a physical model may facilitate a relationship between the depth of penetration in the device will translate into the depth of penetration on any type of arbitrary hole. The shape of a "hole" is arbitrary except for the ratio of the cross-sectional area of the opening to the surface area for each unit of depth. For example, reducing the diameter by a factor of two reduces the interior surface area by two times but the cross-sectional area by four times so that there is overall half of the cross-sectional area. This is equivalent of reducing the separation of parallel plates by a factor of two, where the cross-sectional area is reduced by a factor of two but the interior surface area is not reduced. For example, a hole that is triangular shaped will have a separate multiplier to scale the interior surface area. In another example, the interior may include a rough surface which will increase the rate of consumption for a given flux across a surface area so that the depth penetration is reduced.

The physical model may facilitate a relationship between the depth of penetration and the increases the effective surface area, relative to a smooth surface, as a result of texturing from intrinsic micro-roughness from machining, mechanical grooves, texturing, micro-patterning and the like. For a given cross-section of the opening and hole shape, the depth of penetration will reduce with higher effective surface areas. The physical model may facilitate predicting the depth of penetration on holes that have a high degree of variability of shape, cross-section, surface roughness etc. based on integration of all details within the model calculations. The physical model may include known properties of the precursor molecules as well as empirical constants characterizing the surface reactions to the necessary degrees of complexity for accuracy and robustness.

In some embodiments, the dosage strength of the chemical deposition material may be delivered with various parameters, such as, for example, as discrete pulses or continuous delivery of deposition material. In another example, the dosage may be altered by a flow rate of the gas delivery of the deposition material, the pressure of the chamber, the temperature of the chamber. Without easy access to process result evaluation of a substrate processed within a non-LOS recess, components may necessitate being broken down into smaller pieces and time consuming and costly substrate metrology performed (e.g., SEM and/or TEM).

Figure 4:
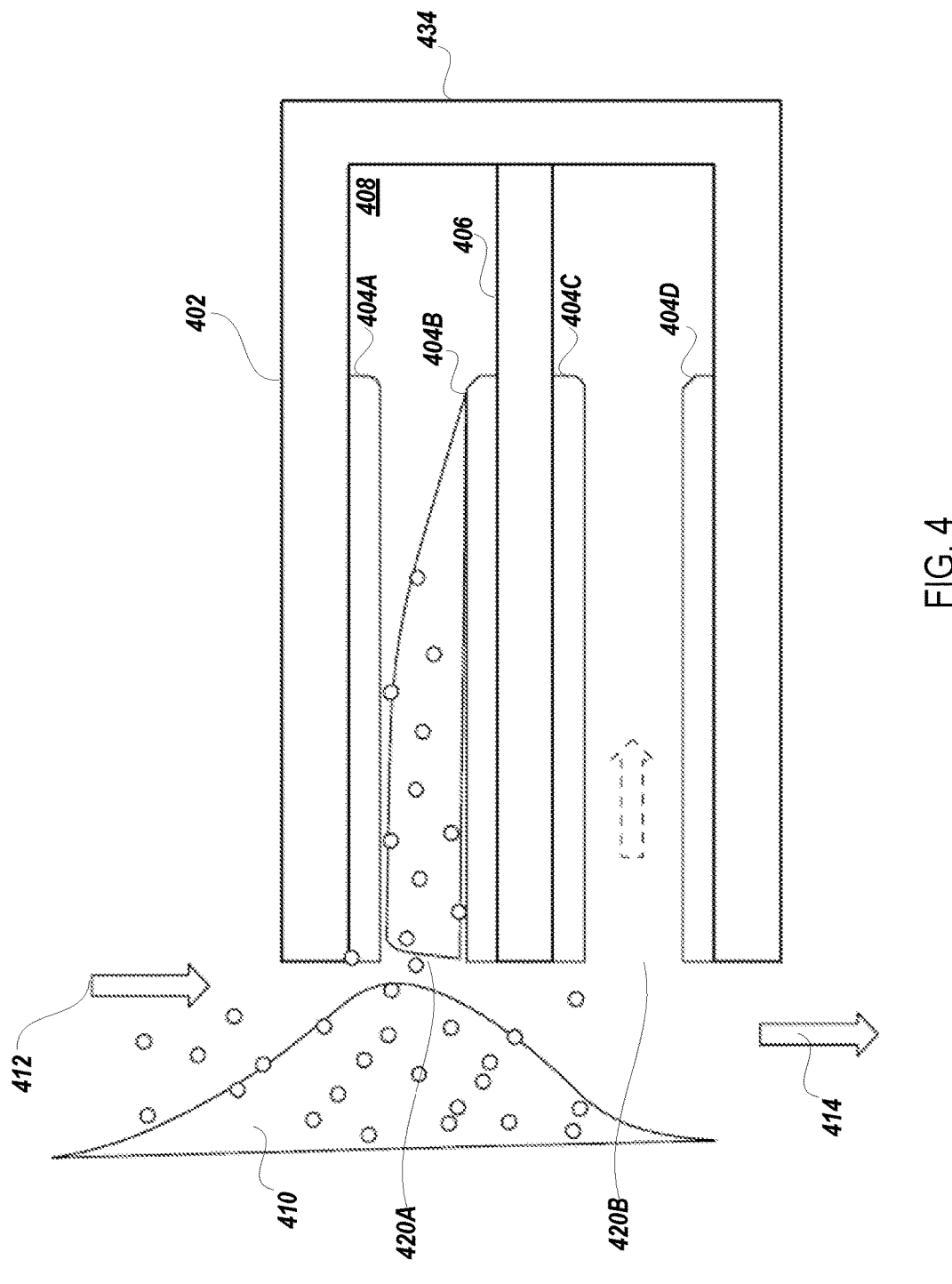
FIG. 4 illustrates a substrate monitoring device, in accordance with some implementations of the present disclosure.

FIG. 4 illustrates a substrate monitoring device 400, in accordance with some implementations of the present disclosure. The substrate monitoring device 400 includes an enclosure structure 402 forming an interior volume 408 that houses a substrate 406. The substrate may be selectively removable such that, for example, the substrate can be evaluated without breaking or otherwise modifying the structure of the enclosure structure 402. The substrate monitoring device 400 may be disposed in a processing chamber such that a chemical flow of deposition material 410 passes along an opening to the interior volume. For example, the deposition material 410 may flow from a first direction 412 substantially parallel to an area formed by an opening into the interior volume 408 and flow through to an exhaust along a second direction 414. In some embodiments, the slots facilitate a flow of deposition materials (e.g., ALD pulsed chemistry into one or more of slots 420A and 420B such as, for example, depositing along a surface of the enclosure structure 402 and/or substrate 406.

As shown in FIG. 4, a deposition of film 404A-D may build up on one or more interior surfaces of the enclosure structure and one or more surfaces of the substrate 406. As is illustrated and discussed further in other embodiments, the edge of the film opposite the opening may form a bow or otherwise rounded boundary that extends relatively further along a central axis of the film than on an edge of the film. The substrate may include a wafer disposed in a first plane. The substrate may be disposed parallel to an upper interior surface enclosure structure proximate the interior volume and a lower interior proximate the interior volume.

In some embodiments, the substrate 406 is disposed within the enclosure structure 402 such that a first slot 420A is formed above the substrate and a second slot 420B is formed below the substrate within the interior volume. In other embodiments, the substrate 406 is positioned on an interior surface of the enclosure structure (e.g., replacing film 404D with the substrate 406). In this and other embodiments, the place of the substrate 406 within the interior volume 408 may result in the formation of slot for receiving deposition chemistry on one side of the substrate 406.

In some embodiments, the substrate 406 is disposed within the enclosure structure that a back edge contacts or is disposed within the immediate vicinity of a back wall structure 434 of the enclosure device 402. However, in some embodiments, the substrate 406 is disposed a distance away from the back wall of the disclosure structure 434.

In some embodiments, the substrate may be comprised of one or more of silicon, a ceramic material (e.g., bulk sintered ceramic), aluminum, stainless steel, and/or the like.

Figure 5A:
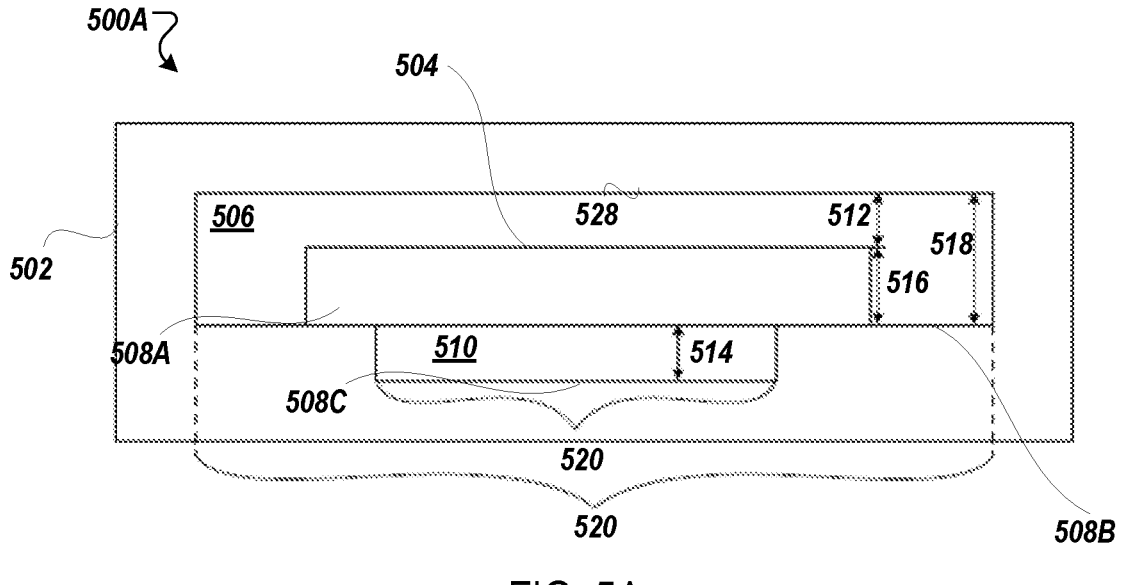
FIGS. 5A-B illustrate a cross-section view of substrate monitoring device, in accordance with some implementations of the present disclosure.
Figure 5B:
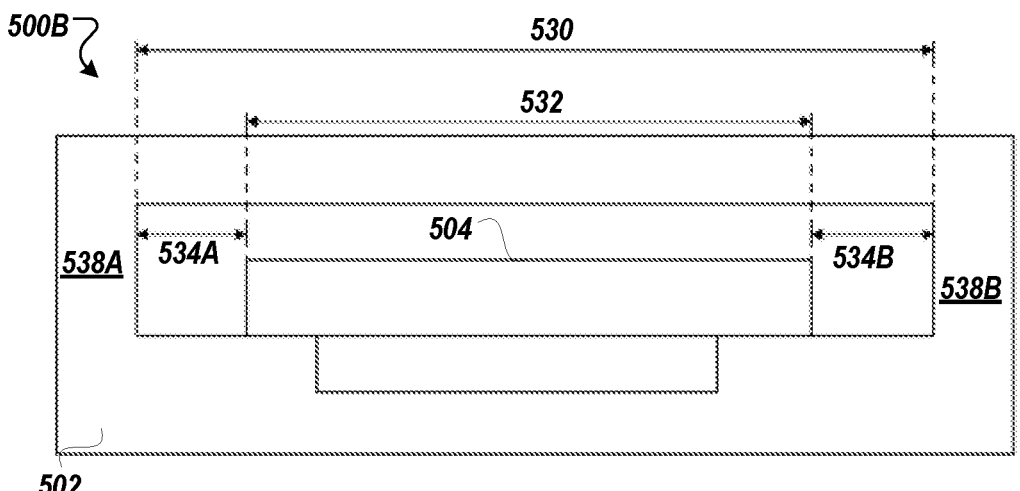

FIGS. 5A-B illustrate a cross-section view of substrate monitoring device 500A-B, in accordance with some implementations of the present disclosure. The substrate monitoring device 500 includes an assembly having an enclosure structure 502 forming a first interior volume 506 that is designed to support a substrate 504. The substrate may be selectively removable from the enclosure structure. The enclosure structure may include an upper interior surface 528 and a lower interior surface 508A-C located below the upper interior surface 528. The first interior volume 506 is configured to direct a first flow of a reactive species to a first surface of the substrate. The reactive species may correspond to a substrate process such as ALD. A first portion of the lower interior surface 508A-B is configured to support the substrate. A second portion of the lower interior surface 508C forms a channel 510 configured to provide a second flow of the reactive species to a second surface of the substrate opposite the first surface.

In some embodiments (e.g., for some process conditions), the lack of both an upper interior and lower interior may cause difficulty in uniform process results. For example, a substrate such as silicon resting on the lower interior surface 508 (e.g., an aluminum surface) does not form a seal but allows the active reactive species to diffuse in. In some embodiments, a clamping mechanism is incorporated to maintain a position of the substrate 504 relative to the enclosure structure 502. In one or more embodiments, the assembly is used to monitor how the reactive species supplied to the assembly 500A-B diffuses, react, and/or otherwise forms a front in a known recess (e.g., interior volume 506). However, a space between substrate 504 and interior surfaces 508A-B may result in an unintended parasite effect that may be inconsistent run to run when employing the assembly. In some embodiments, the overlap of substrate and lower interior surfaces 508A-B may be designed to be minimize to mitigate the parasitic effect.

In some embodiments, the enclosure structure 502 forms a second interior volume configured to support a second substrate disposed within the second interior volume. The second substrate is selectively removable from the enclosure structure 502. The enclosure structure may further include a second upper interior surface located above the second interior volume and a second lower interior surface located below the second interior volume. The second interior volume may be configured to direct a third flow of the reactive species to a first surface of the second substrate. A first portion of the second lower interior surface may be configured to support the second substrate. A second portion of the lower interior surface forms a channel 510 configured to provide a fourth flow of the reactive species to a second surface of the second substrate opposite the first surface.

In some embodiments, a thickness of a first gap 512 approximately matches a thickness of a second gap 514. In some embodiments, the thickness of the substrate 516 is selected such the first gap 512 and the second gap 514 is substantially equivalent. The first gap 516 may be consistent across the surface of the substrate. In some embodiments, as shown in FIG. 5B, a width 534A between the substrate 504 and a first sidewall 538A of the enclosure structure 502 is substantially equal to a width 534B between the substrate 504 and a second sidewall 538B. In some embodiments, the first interior volume comprises one or more spatial dimensions 520 different from corresponding one or more spatial dimensions 520 of the second interior volume. For example, the first interior volume 506 may include a gap thickness 512, interior volume thickness 518, substrate thickness 516, channel thickness 514, substrate width 532, interior volume width 530, width 534A, and/or width 534B.

As described previously, the underside of the substrate 504 in channel 510 may cause a parasitic effect on the process result of the top side of the substrate 504 expose to interior volume 506. In some embodiments, the widths 534A-B may be designed to be minimized. For example, a first width 532 should be smaller than 530 but just enough to insert and remove the substrate from the interior volume 506.

Figure 6A:
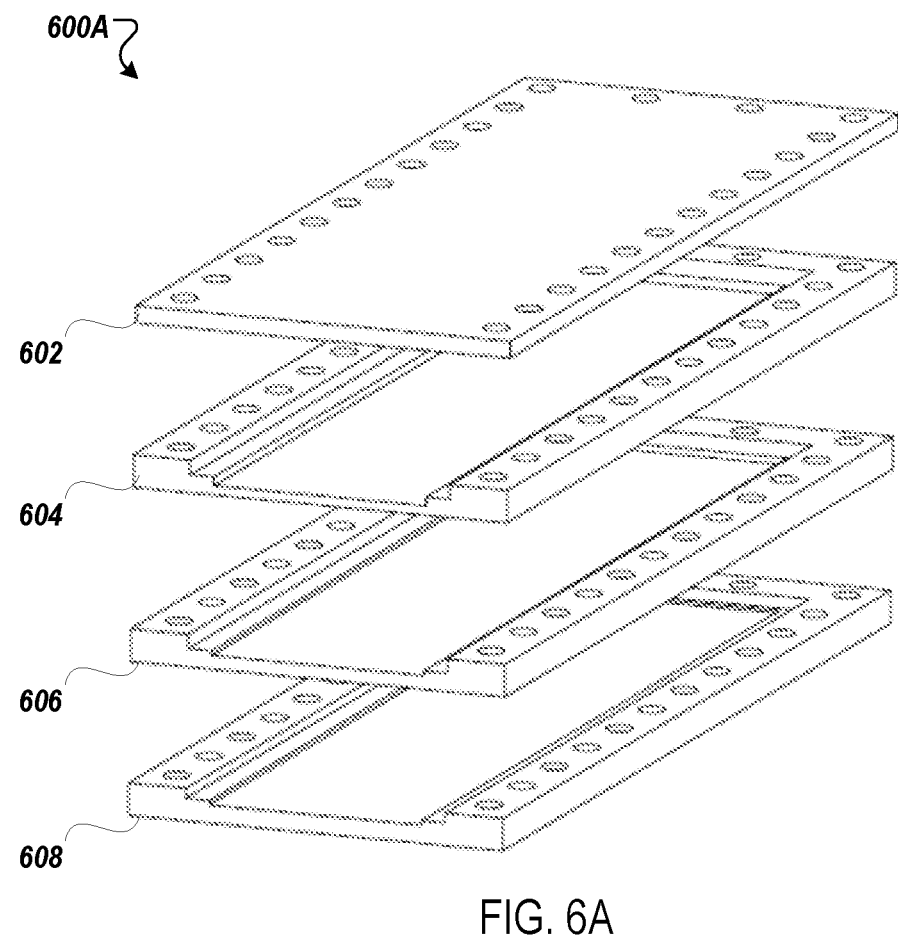
FIGS. 6A-B illustrate a substrate monitoring device, in accordance with some implementations of the present disclosure.
Figure 6B:
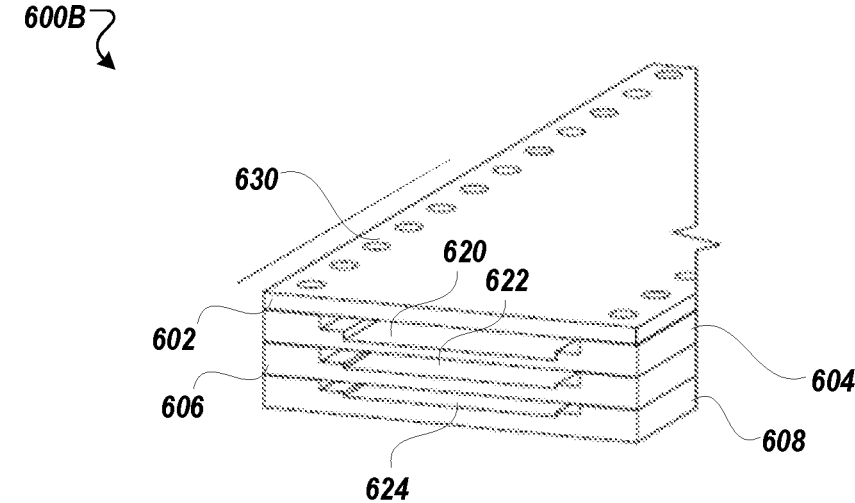

FIGS. 6A-B illustrate a substrate monitoring device 600A-B, in accordance with some implementations of the present disclosure. Substrate monitoring device 600A-B may include a first planar structure 602 having a bottom surface. The substrate monitoring device 600A-B may include a second planar structure 604 that is coupled (e.g., fastened, integrated with, machined together, riveted, brazed together, and the like) to the first planar structure 602. The second planar structure 604 has a top surface. The bottom surface of the first planar structure 602 and the top surface of the second planar structure 604 form a first slot 620. The first slot 620 may provide a first flow of a reactive species (e.g., deposition material such as ALD chemistry) associated with a substrate processing procedure to a first surface of the first substrate. The top surface of the second planar structure 604 includes a first portion disposed in a first plane and configured to contact the bottom surface of the first planar structure. The second planar structure 604 includes a second portion disposed in a second plane below the first plane and configured to support the first substrate.

In some embodiments the top surface of the second planar structure 604 further includes a third portion disposed in a third plane below the second plane. A first portion of the first slot 620 between the first substrate and the bottom surface of the first planar structure 602 provides the first flow of the reactive species to the first surface of the first substrate. A second portion of the first slot 620 between the first substrate and the third portion of the top surface provides a second flow of the reactive species to a second surface of the substrate opposite the first surface.

In some embodiments, the second planar structure further includes a bottom surface. The substrate monitoring device 600A-B may further include a third planar structure 606 coupled to the second planar structure 604. The third planar structure 606 has a top surface. The bottom surface of the second planar structure 604 and the top surface of the third planar structure 606 forms a second slot 622 configured to partially enclose a second substrate disposed within the second slot 622. The second slot 622 provides a second flow of the reactive species to a first surface of the second substrate. The top surface of the third planar structure 606 includes a first portion disposed in a third plane and configured to contact the bottom surface of the second planar structure 604. The second planar structure includes a second portion disposed in a fourth plane below the third plane and configured to support the second substrate.

Figure 7:
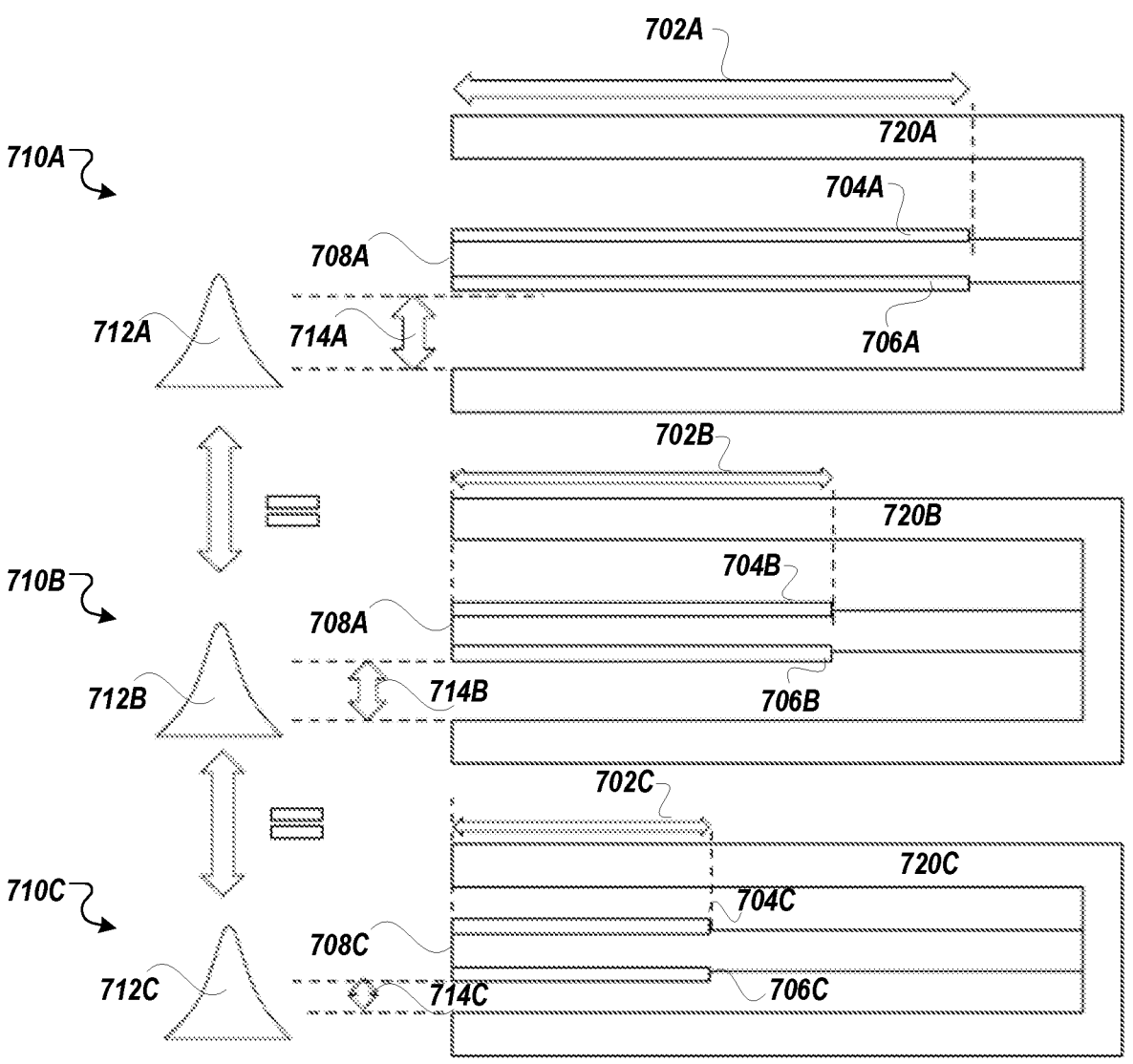
FIG. 7 illustrates a substrate monitoring devices having slots with varying spatial parameters, in accordance with some implementations of the present disclosure.

In some embodiments, the substrate monitoring device 600A-B may include a fourth planar structure, a fifth planar structure, a sixth planar structure, a seventh planar structure, and so on. The substrate monitoring device 600A-B may further form a third slot 624, a fourth slot, a fifth slot, a sixth slot, and so forth formed between two adjacent planar structures. As shown in FIG. 7, the various slots may incorporate various diverse sizes. As shown in FIG. 21, the substrate may have different surface roughness that may work better with different sized slots. In some embodiments, some slots may incorporate sensors or have variable gap size, shape, etc.

FIG. 6A illustrates an exploded view of the substrate monitoring device 600A and FIG. 6B illustrate a stacked view of the substrate monitoring devices 600B. As previously described, the substrate monitoring device 600A-B includes one or more planar structures. In some embodiments, the planar structures 602, 604, 606, 608 may be coupled together using one or more of brazing, adhesive, integrated together, and/or through the use of fasteners. One or more of the planar structures 602, 604, 606, 608 may include one or more fastening features 630 such as, for example, recesses to hold fasteners.

FIG. 7 illustrates a substrate monitoring devices 710A-C having slots 714A-C with varying spatial parameters, in accordance with some implementations of the present disclosure. As shown in FIG. 7, the substrate monitoring device 710A-C may include slot 714A-C with varying thickness that affect a rate of advancement of film 704A, 704B, 704C, 706A, 706B, 706C within a corresponding slot. For example, a first substrate monitoring device 710A may have a substrate 708A disposed within an enclosure structure 720A. The substrate monitoring device 710A may be processed with a first chemical dosage 712A of deposition material. The first chemical dosage 712A and thickness of the slot 714A results in a creep distance of 702A.

In another example, a second substrate monitoring device 710B may have a substrate 708B disposed within an enclosure structure 720B. The substrate monitoring device 710B may be processed with a second chemical dosage 712B of deposition material. The second chemical dosage 712B and thickness of the slot 714B results in a creep distance of 702B. In another example, a third substrate monitoring device 710C may have a substrate 708C disposed within an enclosure structure 720C. The substrate monitoring device 710C may be processed with a third chemical dosage 712C of deposition material. The third chemical dosage 712C and thickness of the slot 714C results in a creep distance of 702C.

In some embodiments, as shown in FIG. 7, a chemical dosage 712A-C used in associated with various exemplary substrate monitoring devices 710A-C may be substantially equivalent one to another. Each substrate monitoring device 710A-C may include a slot thickness that is different one from another. For example, a first substrate monitoring device 710A may have a thickness of the corresponding slot 714A that is larger than a thickness of a corresponding slot 714B of a second substrate monitoring device 710B. A similar relationship can be drawn between the first substrate monitoring device 710A and the third substrate monitoring device 710C as well as the second substrate monitoring device 710B and the third substrate monitoring device 710C.

In some embodiments, an assembly may include one or more of substrate monitoring device 710A-C (e.g., coupled together as is seen in FIG. 6). As will be discussed furthering in the processing of process result data. Processing machines, such as, for example, those leveraging and carrying out modeling functionality (e.g., machine learning modeling) may establish a defined relationship between creep distance 702A-C and thickness of a corresponding slot 714A-C for a given chemical dosage 712A-C. For example, numerical methods may be employed to predict the creep as a function of the process setting, chemistry properties, gap parameters, roughness parameters, and the like.

For example, a physical model may facilitate a relationship between the depth of penetration and increases of the effective surface area, relative to a smooth surface, as a result of texturing from intrinsic micro-roughness from machining, mechanical grooves, texturing, micro-patterning and the like. For a given cross-section of the opening and hole shape the depth of penetration will reduce with higher effective surface areas. The physical model may facilitate predicting the depth of penetration on holes that have a high degree of variability of shape, cross-section, surface roughness etc. based on integration of all details within the model calculations. The physical model may include known properties of the precursor molecules as well as empirical constants characterizing the surface reactions to the necessary degrees of complexity for accuracy and robustness.

Figure 8:
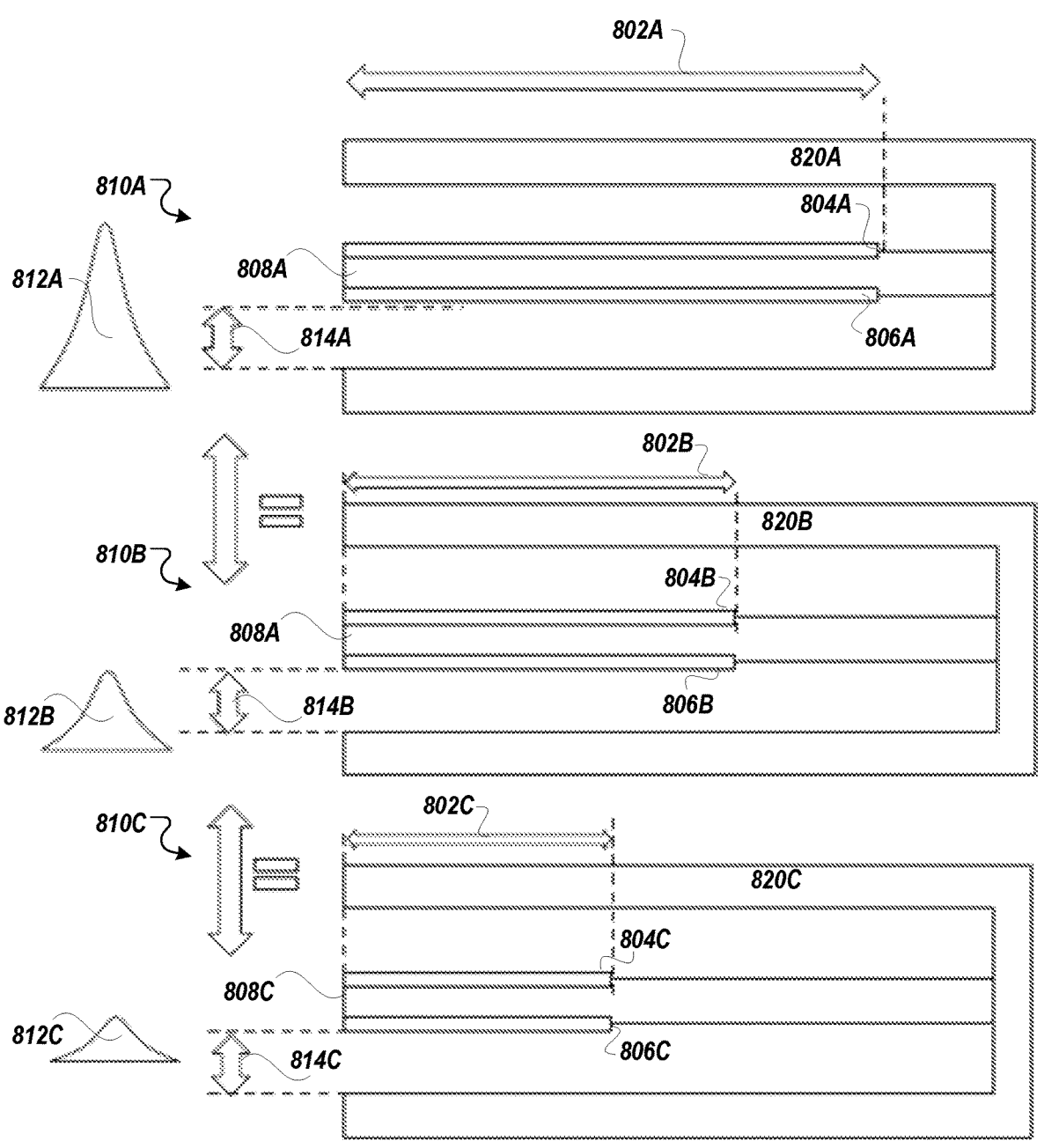
FIG. 8 illustrates substrate monitoring devices having slots with varying similar spatial parameters and receiving varying chemical dosage of a deposition material, in accordance with some implementations of the present disclosure.

FIG. 8 illustrates substrate monitoring devices 810A-C having slots 814A-C with varying similar spatial parameters and receiving varying chemical dosage 812A-C of a deposition material, in accordance with some implementations of the present disclosure. As shown in FIG. 8, the substrate monitoring device 810A-C may include slots 814A-C with substantially similar thicknesses and receive varying chemical dosage 812A-C of a deposition material that affect a rate of advancement of film 804A, 804B, 804C, 806A, 806B, 806C within a corresponding slot 814A-C. For example, a first substrate monitoring device 810A may have a substrate 808A disposed within an enclosure structure 820A. The substrate monitoring device 810A may be processed with a first chemical dosage 812A of deposition material. The first chemical dosage 812A and thickness of the slot 814A results in a creep distance of 802A.

In another example, a second substrate monitoring device 810B may have a substrate 808B disposed within an enclosure structure 820B. The substrate monitoring device 810B may be processed with a second chemical dosage 812B of deposition material. The second chemical dosage 812B and thickness of the slot 814B results in a creep distance of 802B. In another example, a third substrate monitoring device 810C may have a substrate 808C disposed within an enclosure structure 820C. The substrate monitoring device 810C may be processed with a third chemical dosage 812C of deposition material. The third chemical dosage 812C and thickness of the slot 814C results in a creep distance of 802C.

In some embodiments, as shown in FIG. 8, a slot thickness a slot 814A-C may be substantially similar whereas a chemical dosage 812A-C deliver to each corresponding slot may vary across the various exemplary substrate monitoring devices 810A-C. Each substrate monitoring device 810A-C. For example, a first substrate monitoring device 810A may receive a chemical dosage 812A of a deposition with relatively stronger potency that a chemical dosage 812B of a second substrate monitoring device 810B. A similar relationship can be drawn between the first substrate monitoring device 810A and the third substrate monitoring device 810C as well as the second substrate monitoring device 810B and the third substrate monitoring device 810C.

In some embodiments, an assembly may include one or more of substrate monitoring device 810A-C (e.g., coupled together as is seen in FIG. 6). As will be discussed furthering in the processing of process result data. Processing machines, such as, for example, those leveraging and carrying out modeling functionality (e.g., machine learning modeling) may establish a defined relationship between creep distance 802A-C and chemical dosage 812A-C potency for a given slot thickness 814A-C of a slot.

Figure 9:
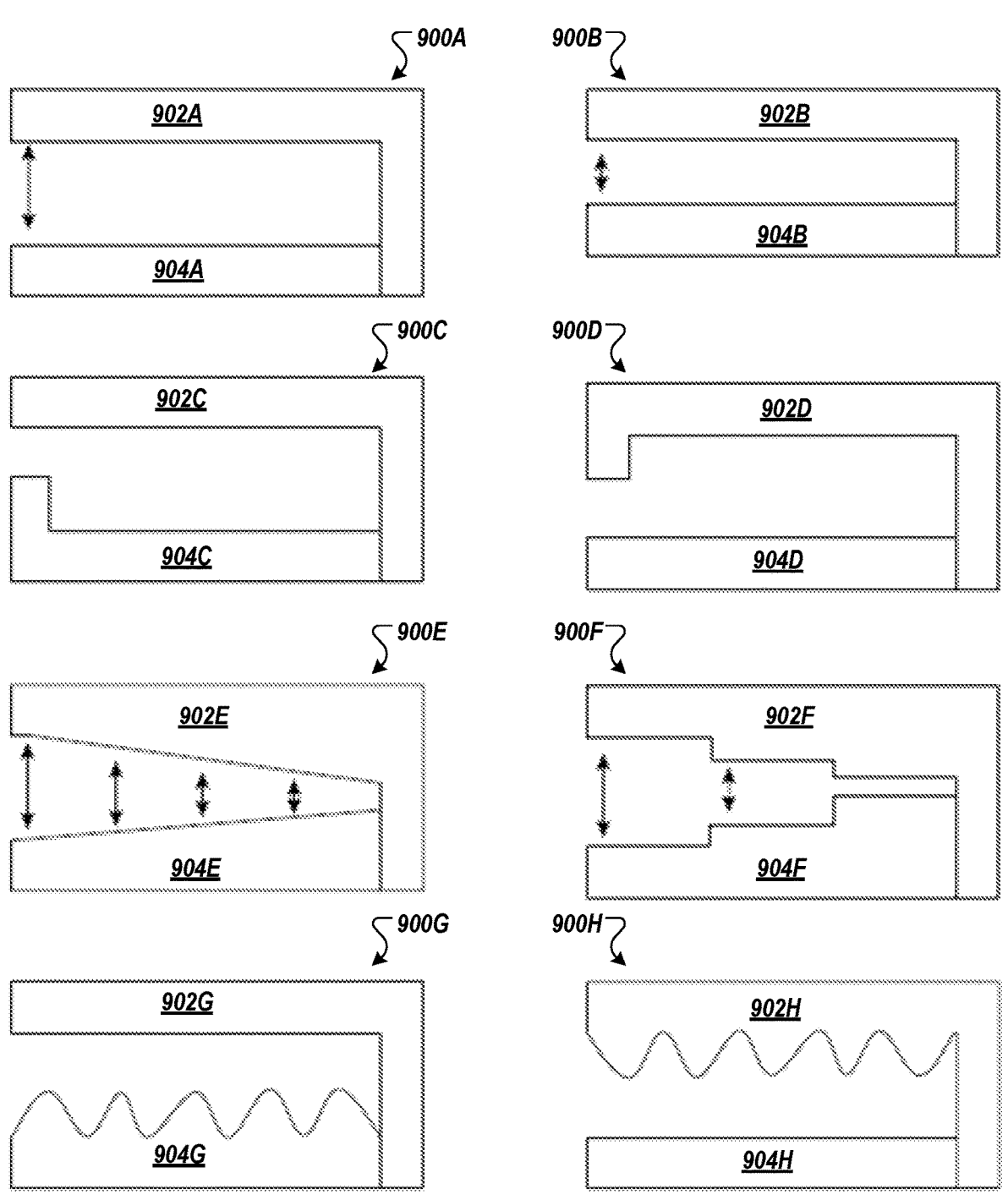
FIG. 9 illustrates various embodiments of enclosure structures and substrate combinations of substrate monitoring device, in accordance with some implementations of the present disclosure.

FIG. 9 illustrates various embodiments of enclosure structures 902A-H and substrate 904A-H combinations of substrate monitoring device 900A-H, in accordance with some implementations of the present disclosure.

As shown in substrate monitoring devices 900A-B, and discussed previously, one adjustable constraint of the substrate monitoring devices 900A-B is a distance between the substrate 904A-B and the enclosure structure 902A-B. In some embodiments, this gap thickness may be selected based on desired process rates within the gap. In some embodiments, an assembly may include various enclosure structure 902A-B and substrate 904A-B combinations that lever the use of a diversity of gap thicknesses. For example, an assembly may include a series of slots with incrementally ascending or descending slot thickness.

In some embodiments, as shown by substrate monitoring devices 900C-D, one or more of the substrate 904C or the enclosure structure 902D may form a constraint proximate an opening into a slot. For example, the constraint may be used to limit a chemical depiction on one of a surface of the enclosure structure 902D or the substrate 904. In some embodiments, both the substrate 904C and the enclosure structure 902D include constraint forming a narrower gap at an opening of the slot. One of the constraints may throttle chemical diffusion of the deposition material at the opening into a corresponding slot. For example, in long soak processes or highly diffusive chemistries that are not throttled or otherwise mitigated, the system can over saturate which may affect process results. The relative size (e.g., a narrow gap) may regulate the flux of the chemical species entering the enclosure structure 902D In some embodiments, as shown by substrate monitoring devices 900E-F, the one or more of the enclosure structure 902E-F and/or substrate 904E-R may include a grade or non-continuous contour. For example, as seen in substrate monitoring device 900F, one or both of the enclosure structure 902F and/or substrate 904F may include spatial discontinuities such as, for example, steps. In some embodiments, the use of spatial discontinuities may extend the range of sensitivity by providing a variety of data points within a single opening (e.g., in comparison to setting up a series of devices).

Figures 10A, 10B, 10C:
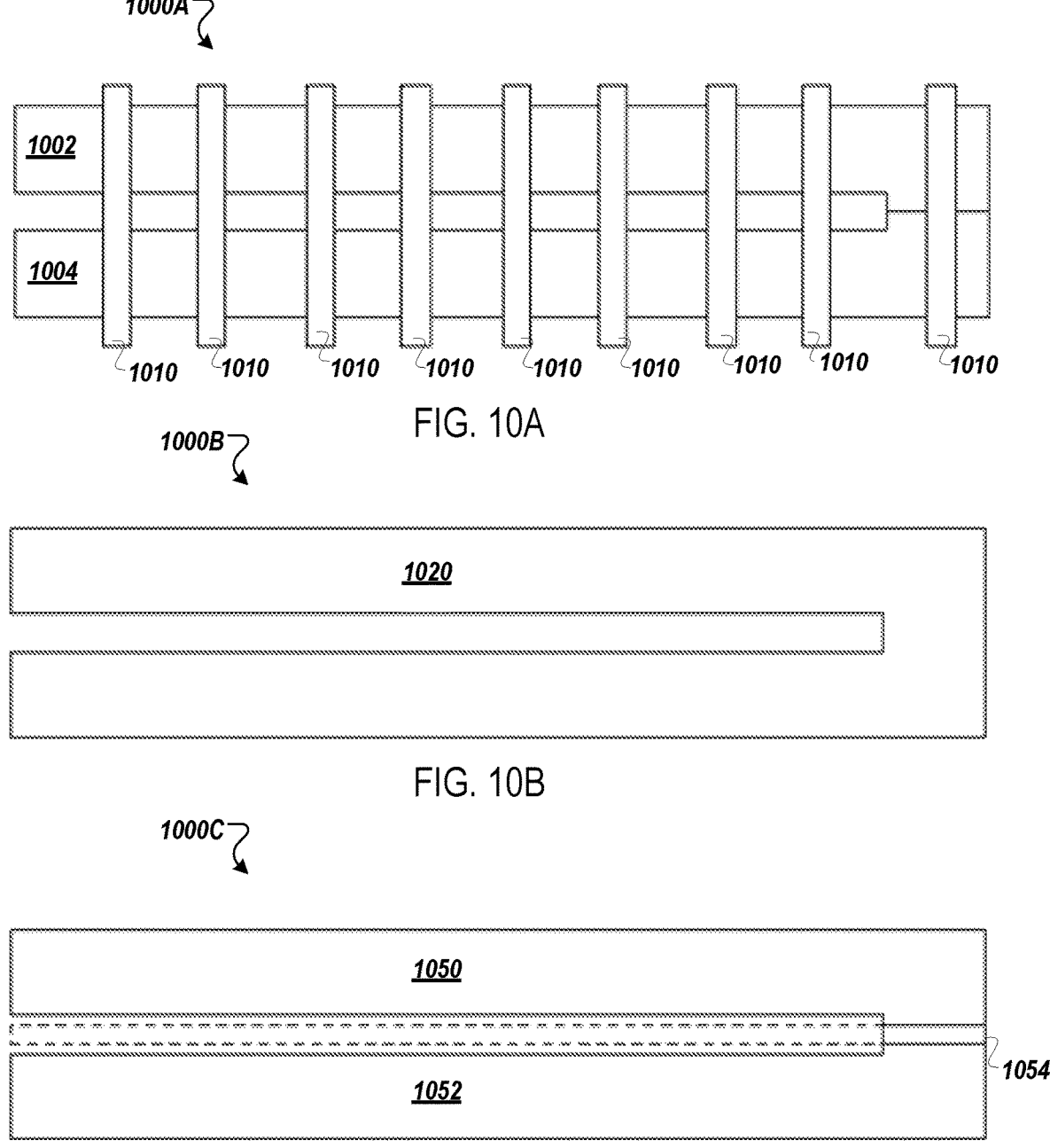
FIGS. 10A-C illustrate various assembly mechanisms of a substrate monitoring device, in accordance with some implementations of the present disclosure.

In some embodiments, as shown by substrate monitoring devices 900G-H, one or more of the enclosure structure 902G-H and/or substrate 904G-H may include a smooth or textured surface. As illustrated by substrate 904G, a surface may include a textured non-flat surface. As illustrated by enclosure structure 902H, a surface of the enclosure structure may include a textured non-flat surface. The use of a textured surface (e.g., roughening of the surface) may increase the surface area of reaction per length of penetration of a deposition material. For example, surface roughness may limit the processing front by increasing the absorption per area unit. Further embodiments describe various surface textures and roughness is described in association with FIG. 21A-C FIGS. 10A-C illustrate various assembly mechanisms of a substrate monitoring device 1000A-C, in accordance with some implementations of the present disclosure. As shown in FIG. 10A, the substrate monitoring device may include multiple components or structures (e.g., planar structures) that are coupled together using one or more coupling devices 1010. For example, the planar structure 1002 and 1004 may include machined aluminum or stainless structures that are connected together using fasteners (e.g., bolts) to create a unified enclosure.

As shown in FIG. 10B, the substrate monitoring device 1000B may be fabricated as an integrated unit 1020. For example, the substrate monitoring device 1000B may be fabricated using one or more of machining techniques, added manufacturing (e.g., three-dimensional (3D) printing), casting, etc.

As show in FIG. 10C, the substrate monitoring device 1000C may be assembled further uses other coupling techniques. For example, planar structure 1050 and planar structure 1052 may be fastened one to another along a joint 1054 using one or more techniques including welding, high-temperature adhesives, clamps, etc.

In some embodiments, one or combinations of the fabrication and manufacturing techniques may be used in combination to achieve an assembled substrate monitoring device. Although many embodiments illustrate the assembly of a substrate monitoring devices 1000A-C as having two planar pieces, a greater number of subdivisions of materials and parts may be coupled together to otherwise form the otherwise and assembly of the substrate monitoring devices 1000A-C are limited strictly limited to the manufacturing and machining techniques described herein.

Figure 11:
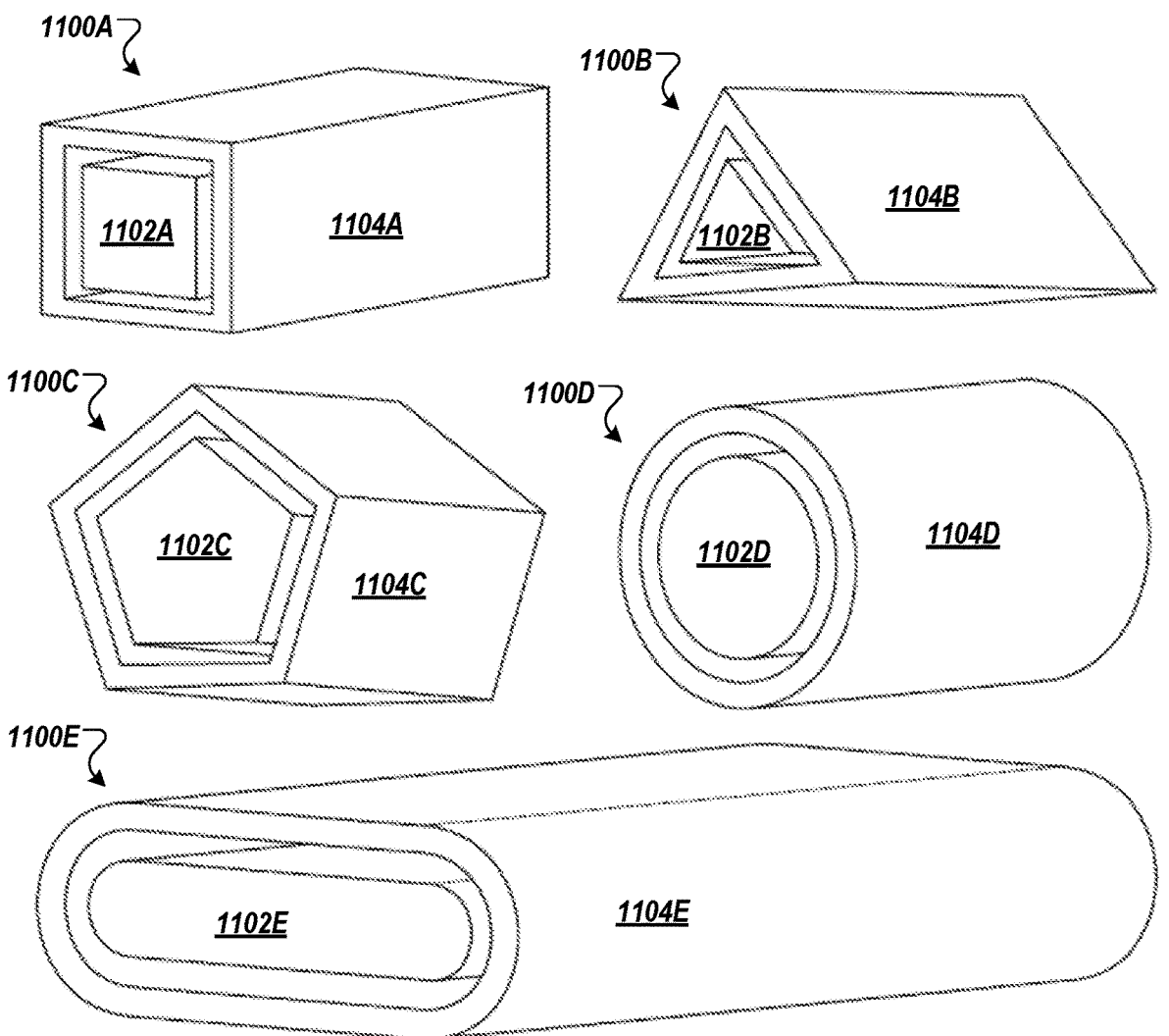
FIG. 11 illustrates various embodiments of a substrate monitoring device, in accordance with some implementations of the present disclosure.

FIG. 11 illustrates various embodiments of a substrate monitoring device 1100A-E, in accordance with some implementations of the present disclosure. As illustrate by substrate monitoring devices 1100A-E, each substrate monitoring devices illustrate a geometric variation of a substrate 1102A-E disposed within an enclosure structure 1104A-E. The substrate and enclosure structure may be concentric and have uniform corresponding shapes (e.g., concentric). The substrate 1102A-E may be selectively removed from within the enclosure structures 1104A-E.

In some embodiments, the substrate monitoring devices 1100A-E for two-dimensional profiled cavities as thickness of the substrate relative to the enclosure structure is smaller to effectively so that that substrate effectively for one or more planar surfaces for deposition materials to react and be deposited.

In some embodiments, the substrate 1102A-E may include a solid chunk of substrate in the geometric shape. In other embodiments, the substrate may be attached to a non-substrate structure effectively forming a substrate perimeter around another material (e.g., a metal). In some embodiments, the solid substrate insert may encompass a stand-alone removable structure. In some embodiments, the substrate may be fused, welded, clamped, sealed with a gasket or mask, and/or otherwise coupled to a corresponding enclosure structure.

Figures 12A, 12B:
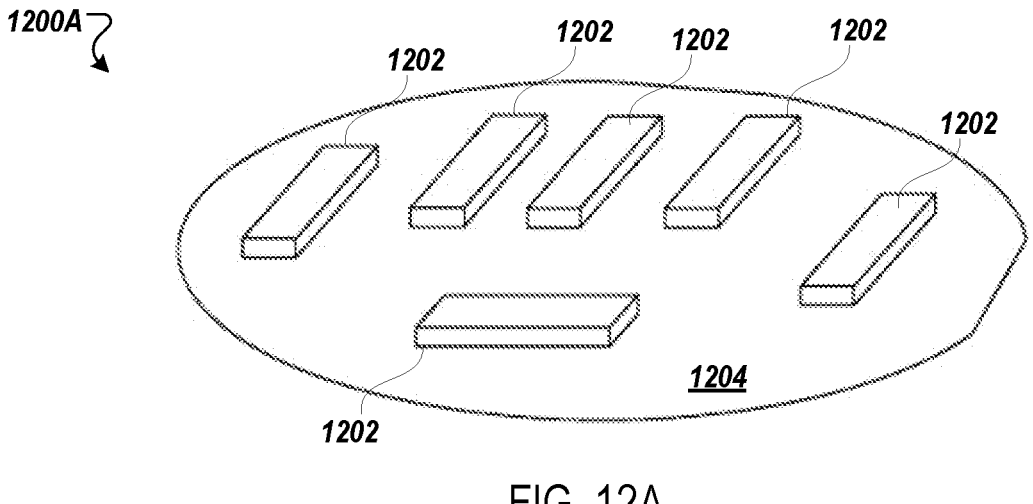
FIG. 12A illustrates monitoring assembly including a support structure with a set of substrate monitoring devices, in accordance with some implementations of the present disclosure.
FIG. 12B illustrates a support structure with a set of substrate monitoring devices disposed within a processing chamber, in accordance with some implementations of the present disclosure.

FIG. 12A illustrates monitoring assembly 1200A including a support structure 1204 with a set of substrate monitoring devices 1202, in accordance with some implementations of the present disclosure. The support structure 1204 may be a substrate or a generally planar structure that coupled to one or more monitoring assemblies. The one or more substrate monitoring devices 1202 may include one or more features of substrate monitoring devices and assemblies described herein. The substrate monitoring devices 1202 are spread across a wafer and used to make process result measurements which can be further processed to determine a state or characterization of one or more process conditions of an environment proximate a corresponding monitoring assembly.

FIG. 12B illustrates a support structure 1204 with a set of substrate monitoring devices disposed within a processing chamber 1280, in accordance with some implementations of the present disclosure. As shown in FIG. 12B. The support structure 1204 and set of substrate monitoring devices 1202 may be positioned in a processing chamber 1280 performing one or more process procedures such as delivery chemical dosage 1250 and 1260 to corresponding region of the processing chamber. The delivered chemical dosage 1250, 1260 may be facilitated by one or more chamber features 1240, 1242.

Various embodiment may be or employ a monitoring assembly that includes a substrate and a set of monitoring devices. The set of monitoring devices include enclosure structure with removable substrate located across a surface of the substrate. Each respective enclosure structure of the monitoring devices is adapted to acquire process results (e.g., deposition of a film and a corresponding removable substrate) The respective process signals associated with the measured respective pressures and/or the measured respective flows measured by the plurality of sensor together provide a pressure distribution across the surface of the substrate and/or a flow distribution across the surface of the substrate.

In some further embodiments, the sensor assembly may include a substrate that may include a semiconductor wafer, a printed circuit board (PCB), housing assembly, or combination thereof. The substrate of the sensor assembly may be adapted to be chucked by a chuck of a processing chamber. The sensor assembly may include a packaging layer located on the set of sensors and/or on the substrate between the set of sensors. The combination of the packaging layer and the set of sensors may cover a surface of the substrate and may be aligned to form an approximately flat surface. In some further embodiments, the sensor assembly may include one or more circuit board to which the set of monitoring devices is connected.

Figures 13A, 13B, 14:
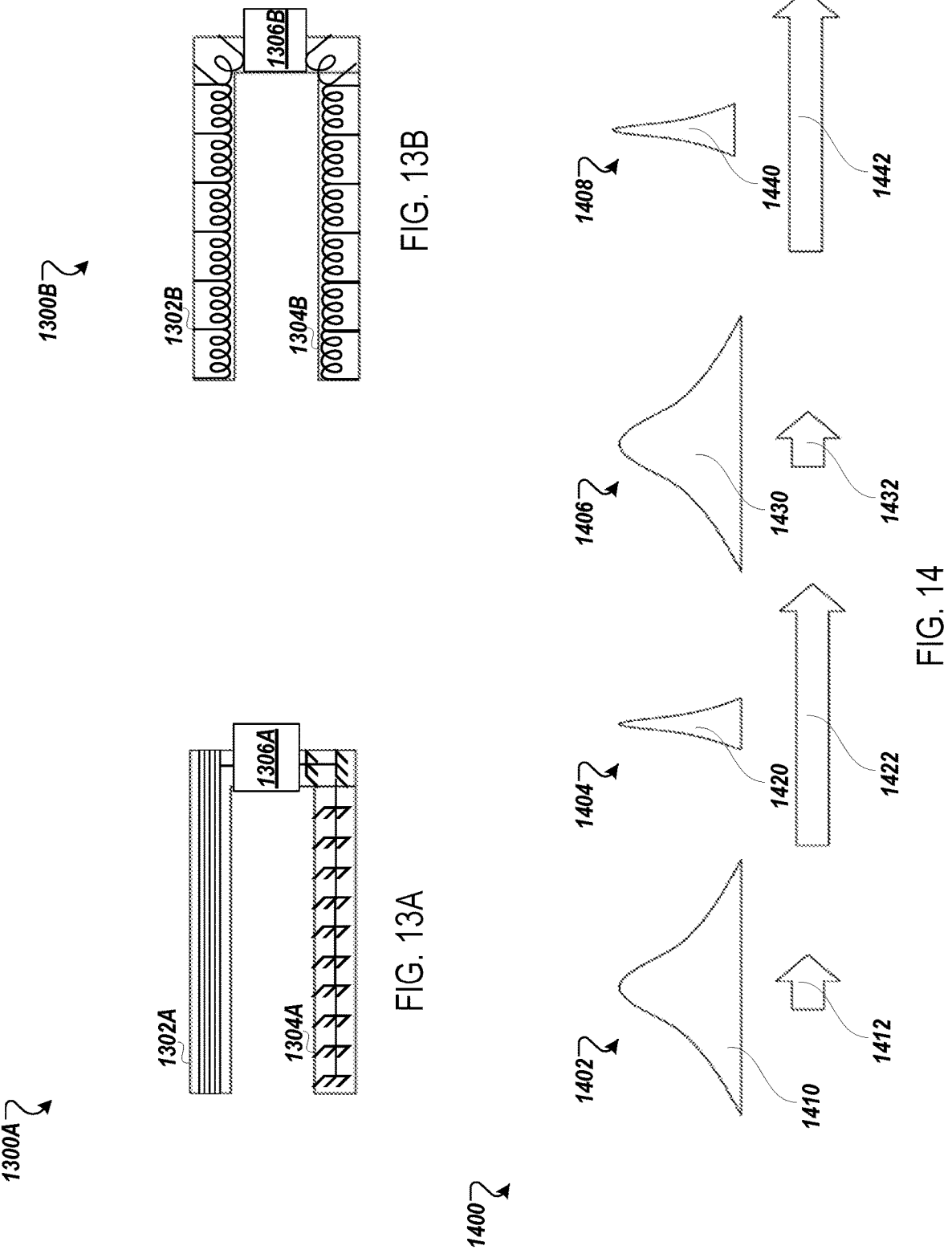
FIG. 13A illustrates a substrate monitoring device with a cooling mechanism, in accordance with some implementations of the present disclosure.
FIG. 13B illustrates a substrate monitoring device with a heating device, in accordance with some implementations of the present disclosure.
FIG. 14 illustrates hybrid gas flow procedure of a processing system, in accordance with some implementation of the present disclosure.

FIG. 13A illustrates a substrate monitoring device 1300A with a cooling mechanism 1306A, in accordance with some implementations of the present disclosure. FIG. 13B illustrates a substrate monitoring device with a heating device 1306B, in accordance with some implementations of the present disclosure.

In some embodiments, the substrate monitoring device 1300A includes a localized device capable of cooling a surface of the substrate 1304A and/or enclosure structure 1302A. In some embodiments, the substrate monitoring device 1300B includes a localized device capable of heating a surface of the substrate 1304B and/or enclosure structure 1302B.

The substrate monitoring devices 1030A-B may include other components facilitating heating and/or cooling the substrate monitoring devices 1300A-B including localized heat/cooling source, gas/fluid exchange, thermoelectric devices, conduction pathways, and the like.

FIG. 14 illustrates hybrid gas flow procedure 1400 of a processing system, in accordance with some implementation of the present disclosure. The gas flow of gases into and out of a processing system may be controlled via throttle valves (TV) (e.g., TV 122 of FIG. 1). Using the throttle valve, the flow rate of the deposition chemistry may maintain pressure of the chamber while altering the gas flow rate. In general, increasing the flow rate of process gases displaces the volume faster and allows the same non-uniformity to be achieved in a shorter amount of time. Increasing the flow rate of a system may however reduce the duration of time a reactant has to reach with the surface (e.g., substrate) before being swept out. Due, at least in part, to these two deficiencies a hybrid chemical delivery procedure may be leveraged to maintain fast purging of gas in addition to facilitating longer reaction times across the surface (e.g., of a substrate).

At 1402, process hardware facilitates a slow flow rate 1412 following the pulse 1410 of a first precursor. At 1404, process hardware facilitates a fast flow rate 1422 after the first precursor has had sufficient time 1420 to cover the volume of the system. At 1406, process hardware facilitates a slow flow rate 1432 following the pulse 1430 of the second precursor. At 1408, process hardware facilitates a fast flow rate 1442 after the second precursor has had sufficient time 1440 to cover the volume of the system. Such sensors may include sufficient sensitivity to detect the mass gain due to a monolayer formation that would imply how quickly it forms. The mass gain is a net gain of increased mass from the new "A" or "B" elements along with the ligands that remain but minus the mass from the previous ligands of "B" or "A". Furthermore, if molecules are not chemically bound in the form of a stable monolayer there will be a process of mass loss during the following purge cycle.

Figures 15A, 15B, 16A, 16B:
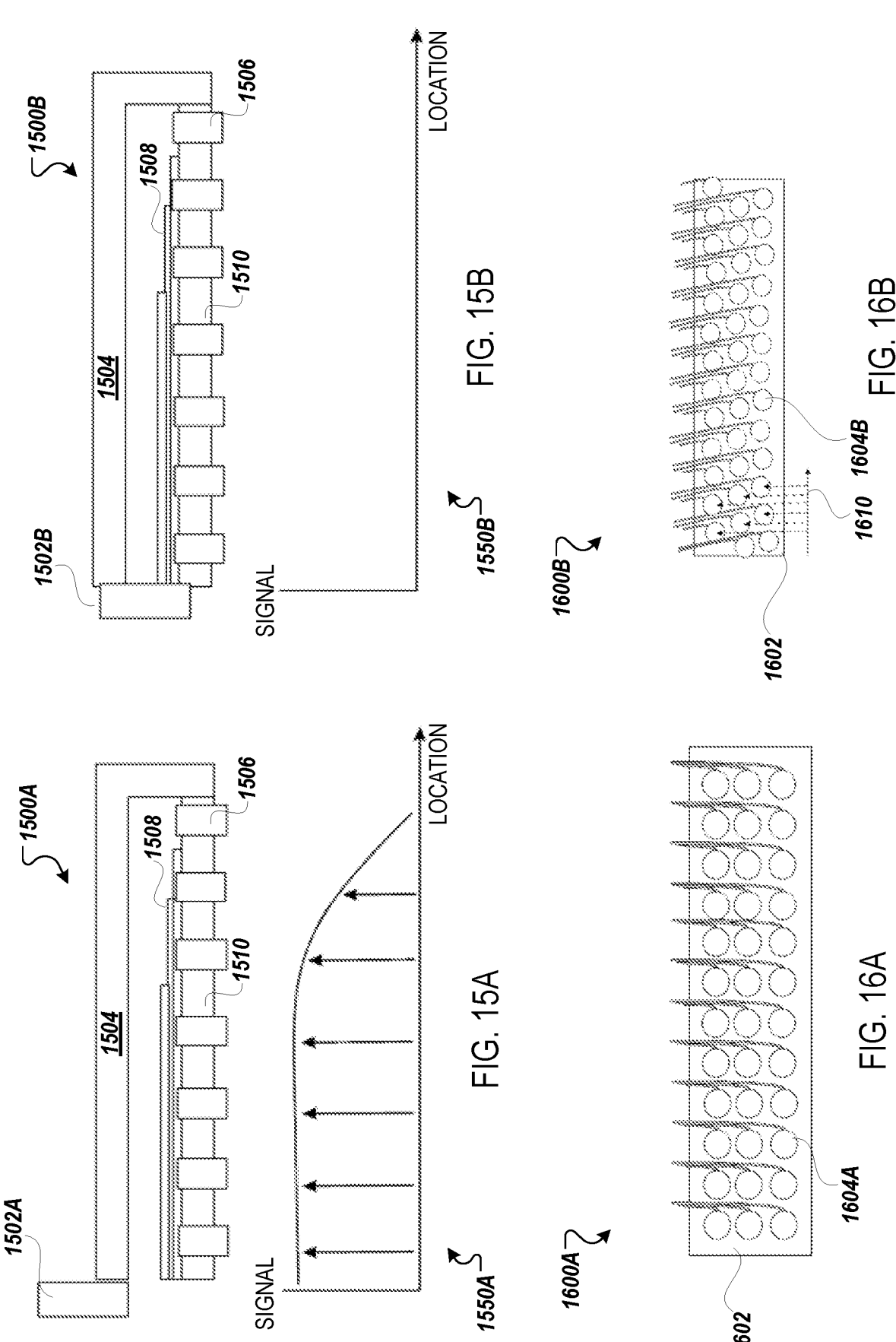
FIGS. 15A-B illustrates substrate monitoring devices with sensors and corresponding sensor measurements, in accordance with some implementations of the present disclosure.
FIGS. 16A-B illustrate embodiments of a substrate monitoring device with a sensor array, in accordance with some implementations of the present disclosure.

FIGS. 15A-B illustrates substrate monitoring devices 1500A-B with sensors and corresponding sensor measurements, in accordance with some implementations of the present disclosure. As shown in FIGS. 15A-B, the substrate monitoring devices 1500A-B includes an enclosure structure 1504 and a substrate 1510 partially enclosed within the enclosure structure 1504. The substrate 1510 may comprise one or more sensors 1506 configured to characterizing a film 1508 depositing along a surface of the substrate. The sensors 1506 may be capable of acquiring data characterizing the film deposited along the surface of the substrate. In some embodiments, the sensor may include hardware component allow the sensor data to be transmitted (e.g., using a wired or wireless connection) to one or more processing device (e.g., for carrying out downstream process). In some embodiments, the substrate monitoring devices 1500A-B may include a local storage configured to store data acquired by sensors 1506.

In some embodiments, the sensor includes mass sensors, electrodynamics sensor (e.g., current sensor, capacitance sensors, etc.), and optical sensors (e.g., acquiring spectral data, image data, reflectometry, ellipsometry, etc.). For example one or more of the sensors may include a quartz microbalance (QCM), which may be used in ALD processes as an indicator of the accumulation of mass with accuracy to the sub-atomic levels. The sensors may be capable of providing live in-situ measurement characterizing the film deposited on the substrate and/or may provide measurement data upon retrieval of the substrate from the substrate monitoring device.

In some embodiments, sensor may be organized to gather along an axis or across a surface area of the substrate. For example, the data acquired from sensors is processed to generate a process result profile. For example, process result profile 1550 indicates a thickness of the deposition of film across a surface of the substrate. The thickness profiles 1550A-B may indicate a determined thickness across an axis of the substrate (e.g., perpendicular to a plane spanned in part by the opening to the slot formed between the enclosure structure 1504 and the substrate 1510.

In some embodiments, the substrate monitoring devices 1500A-B include a shutter device 1502A-B or more generally a device capable of reducing or increasing a chemical dosage delivered to a slot formed by the enclosure structure 1504 and the substrate 1510. The shutter may be configured to selectively open and/or close to increase and decrease an opening of the monitoring devices 1500A-B. For example, during processing a shutter may be opened during a procedure once the processing conditions are set and immediately closed upon conclusion of the process procedure to isolate the process result data from other potential interfering variables. The use of shutters in a like process environment can provide controlled process results by selectively opening the slot when a specific instance of metrology is desired to be evaluated is occurring.

For example, during a chamber preparation phase when process conditions are changing drastically in preparation of performing a process procedure the shutter may be in a closed position effectively keeping the substrate free from noise or other external affects that may affect the process result. For example, process result 1550B indicates the absence of any process parameter results when the shutter is closed.

In some embodiments, the use of sensor provides a low-cost ex-situ monitor with high precision and reproducibility. In-situ measurement may provide additional information in real time (without breaking vacuum) such as: characterization of progression of accumulation and if the shape of the pattern is shifting within the process; high-speed monitoring to observe the reactions in real time (within a single cycle) as processing; capability to run a design of experiments without breaking vacuum; and/or the like.

FIGS. 16A-B illustrate embodiments of a substrate monitoring device 1600A-B with a sensor array 1604A-B, in accordance with some implementations of the present disclosure. As shown in FIGS. 16A-B, a substrate may include (e.g., disposed on top of, integrated within, or otherwise coupled to the substrate) an array of sensors. The arrays of sensors may be disposed in a common plane proximate a surface of the substrate configured to receive a deposition of film. As shown in FIG. 16A, the sensor array may be disposed in organized rows and/or columns and transfer data characterizing a film deposited on a surface of the substrate along with indication of the location of the sensor (e.g., a reference location, a sensor identifying information, a coordinate location, etc.).

In some embodiments, the sensors are disposed within recesses of the substrate such that, for example, a top surface of the sensor align flush with portion so of the substrate where sensor are not positioned. In some embodiments, the density of sensor is much higher than what is displayed. For example, the density of sensor may be sufficiently high where data from each sensor may be aggregated together to form an image data with individual pixels representative of data received from the individual sensors. The granularity of the data may be adjusted through the use or a greater or lesser density of sensors.

In some embodiments, one or more sensor may form a sensor group or subarray. The subarray of sensor may communicate data to a common hub (e.g., a collector sensor of the subarray). Each data collection entity for the subarray of sensor may communicate the data further to another entity collecting sensor data for a larger abstracted group of sensors. For example, a single monolith of sensor or multiple monolith (smaller groups of sensors) may function together such as, for example, to minimize crosstalk between the individual sensors.

In some embodiments, as shown in FIG. 16B, individual sensors of the sensor array 1604B may be disposed at varying distances along an axis 1610. This axis may run perpendicular to a plane spanned in part by a slot opening or recess used to facilitate delivery of deposition materials to a surface of the substrate 1602. The use of offsetting may allow data to be acquired at varying points along the axis 1610 while minimizing the negative effects of having the sensors in a close proximity (e.g., cross talk, wiring complications, wireless channel interference, etc.).

In some embodiments, the sensors collect real-time or post-time data that will characterize the film as it grow/deposits, shrinks/etches, changes density, composition, phase, and/or morphology as a result of internal chemical processes or the interactions of chemical species that either are diffusing/flowing from the exterior, from alteration of the species and/or creations of new species by chemical reaction and/or chemical species that are created by the film itself and/or part of the device. The described sensor may be designed to monitor any (e.g., selectively) or all of the chemical species as sell as the film itself in real-time or post-time.

Figure 17:
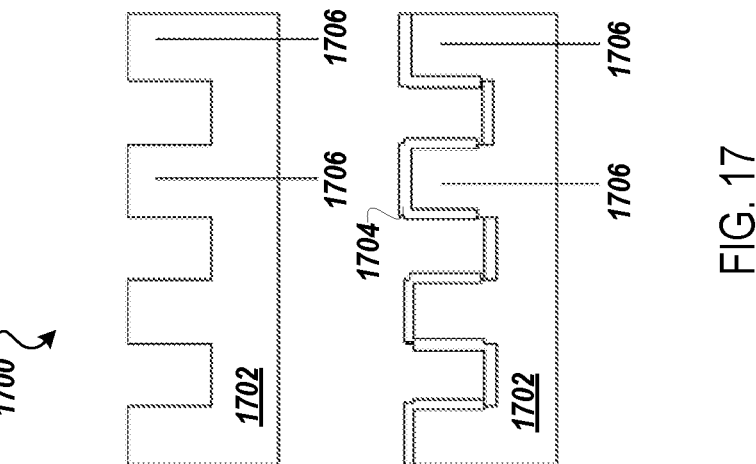
FIG. 17 illustrates a substrate deposition sensing unit 1700 using capacitance sensors 1706, in accordance with some implementations of the present disclosure.

FIG. 17 illustrates a substrate deposition sensing unit 1700 using capacitance sensors 1706, in accordance with some implementations of the present disclosure. FIG. 17 illustrate embodiments of a substrate deposition sensing unit 1700 including one or more capacitance sensors 1706. The substrate deposition sensing unit 1700 includes a set of capacitance sensors 1706 disposed along an axis of the substrate 1702. For example, the capacitance sensors 1706 may be disposed proximate a feature of the substrate 1702 such as a recess. The sensing unit 1700 may be calibrated to relate capacitance measurement to film characterization measurements such as thickness. For example, the presence of deposition film 1704 alters the capacitance between capacitance sensors 1706. The sensing unit may output capacitance values that can be used in downstream processes to predict a thickness corresponding to the capacitance measurements.

Figure 18B:
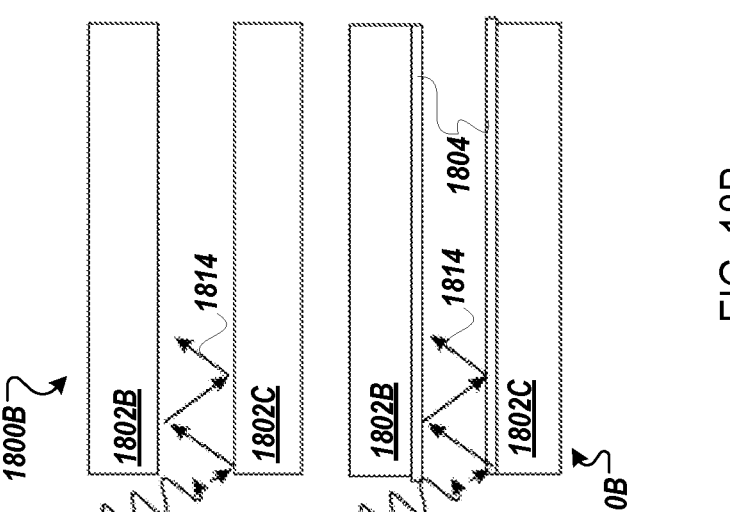
FIGS. 18A-B illustrates various embodiments of substrate deposition sensing unit 1800A-B, in accordance with some implementations of the present disclosure.
Figure 18A:
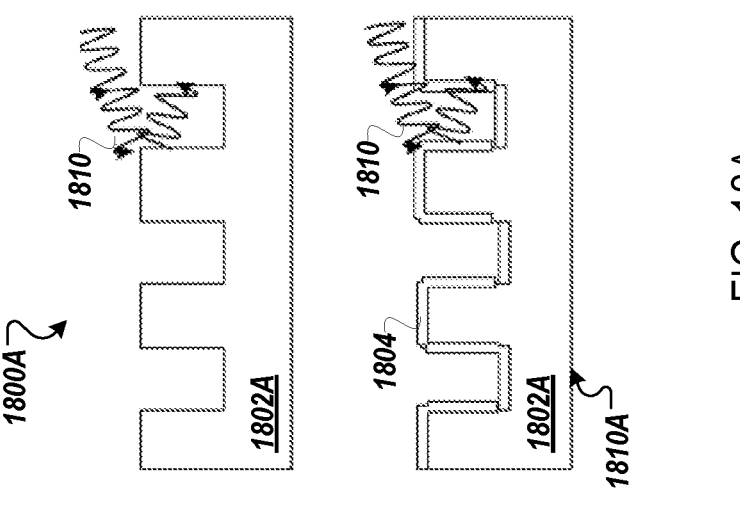
Figure 19:
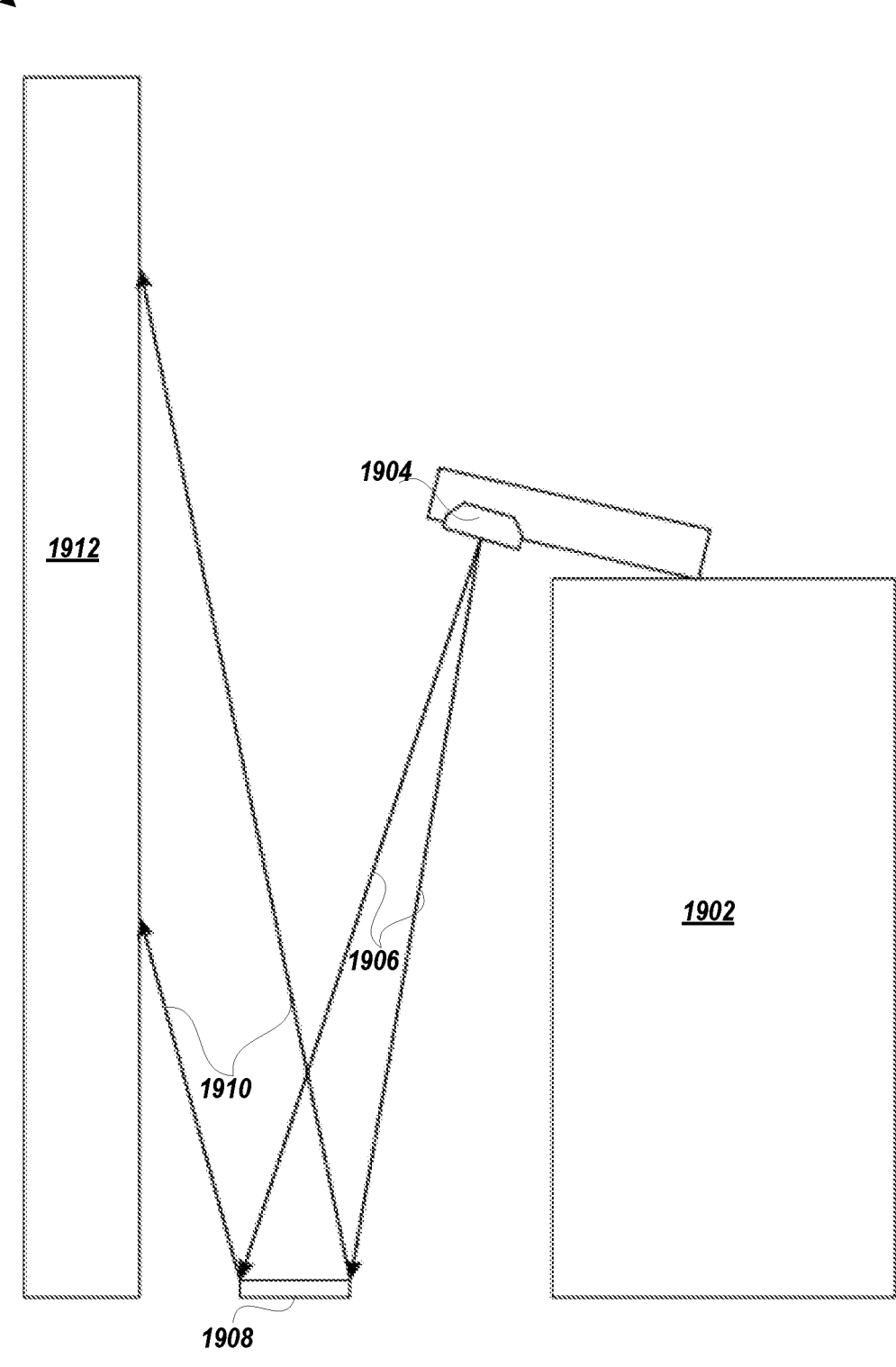
FIG. 19 illustrates a system for reflecting light and acquiring image data of a film deposited on a substrate, in accordance with some implementations of the present disclosure.

FIGS. 18A-B illustrates various embodiments of substrate deposition sensing unit 1800A-B, 1810A-B, in accordance with some implementations of the present disclosure. FIG. 18A illustrates embodiments of a substrate deposition sensing unit 1800A,1810A using radio frequency (RF) wave interference sensing methodology. RF waves 1810 may be transmitted and reflected of the substrate 1802A and any film 1804 deposited on the substrate 1802A. The interference pattern returned may be correlated to a characterization of the film 1804 deposited on the substrate 1802A. For example, conventional techniques such as radio detection and ranging (RADAR), light detection and ranging (LIDAR), and/or sounds detection and ranging (SONAR) may be used to characterize a film 1804 deposited on a surface of the substrate 1802A. FIG. 18B illustrates embodiments of a substrate deposition sensing unit 1800B,1810B using optical waves reflectometry data to infer characteristics of a film 1804 deposited on a substrate 1802B, 1802C. Optical wave (e.g., light) is directed towards a surface of the substrate 1802B, 1802C and reflected 1814 from the surface. Using known optical reflectance parameters of the film 1804 and the substrate 1802B, 1802C, characteristics of the reflected light can be measured, and the thickness of the film 1804 may be determined. FIG. 19 further expounds on the concept of using reflected light to determine a thickness of a film deposited on a substrate.

FIG. 19 illustrates a system 1900 for reflecting light and acquiring image data of a film deposited on a substrate, in accordance with some implementations of the present disclosure. System 1900 includes a mounting structure 1902 for supporting a light source 1904. The mounting structure 1902 facilitates the light source maintaining an orientation throughout an image acquisition process. The light generates an incident beam of light 1906 that is directed toward a deposition of film on a substrate 1908. The light is reflected from the film deposited on the surface forming a reflected beam 1910 that is directed towards an image capture device 1912 (e.g., a monitor or device). The image capture device 1912 (e.g., monitor or camera) may be used to capture on image of the reflected light from the surface of the substrate 1908. Image data may be captured for various angles of reflected light. For example, the mounting structure supports the light source 1904 to rotate or otherwise adjust to direct light that will reflect off the film deposited on the substrate 1908 at various angles. The camera may capture an image of the reflected light resulting in image data (e.g., corresponding to 10s and 100s of megapixels). As will be discussed further in other embodiments, the image data may be leveraged for further processing such, for example, to determine a thickness of the film at various locations across the surface of the substrate 1908 based on the image data.

Figures 20A, 20B, 21A, 21B, 21C:
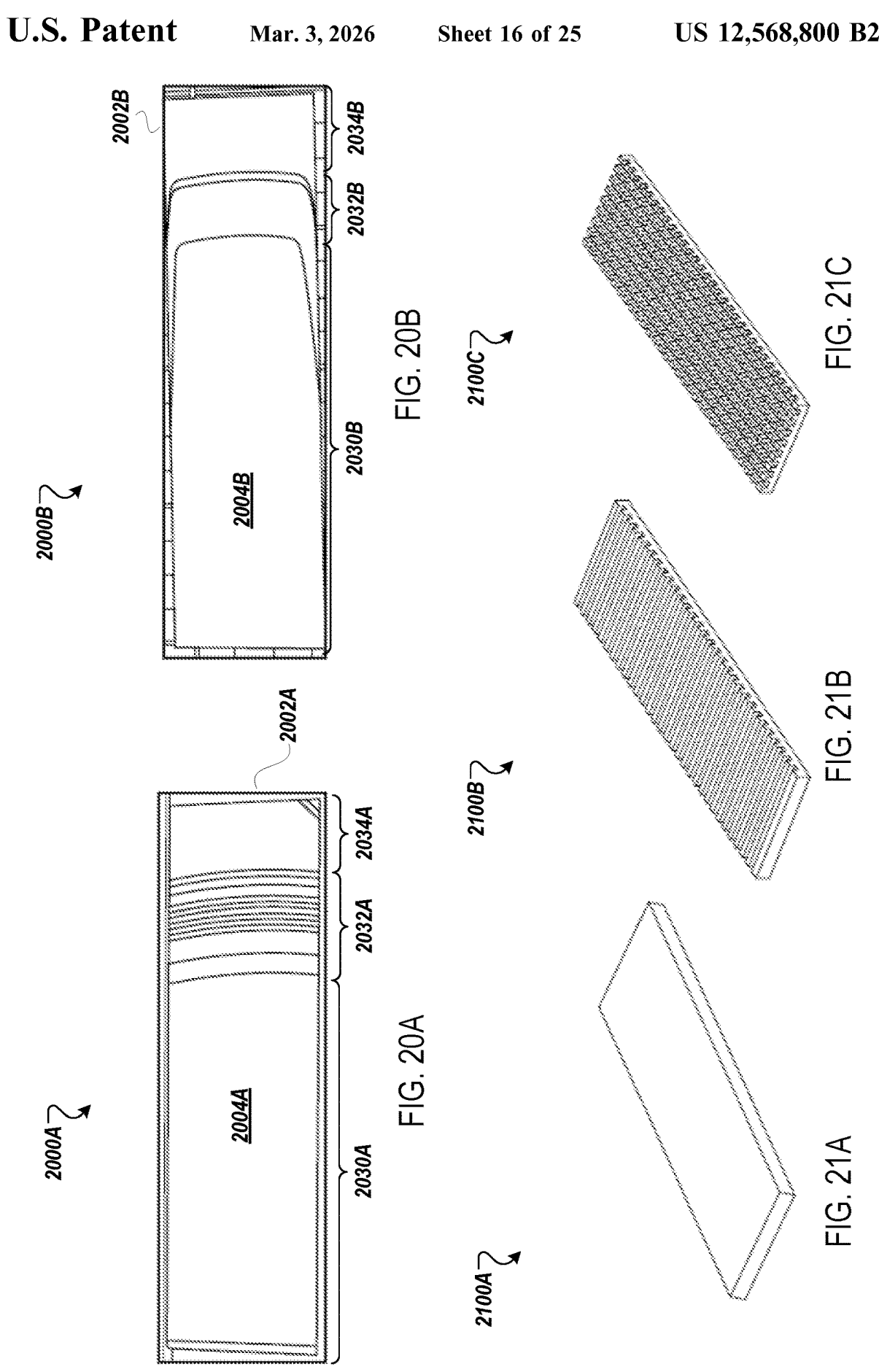
FIGS. 20A-B illustrates exemplary coupons processed within a recess of a processing chamber, in accordance with some implementations of the present disclosure.
FIGS. 21A-C illustrate embodiments of a surface structure of a substrate and/or enclosure structured used within a monitoring device, in accordance with some implementations of the present disclosure.

FIGS. 20A-B illustrates exemplary coupons 2000A-B processed within a recess of a processing chamber, in accordance with some implementations of the present disclosure. The coupon 2000A-B includes a substrate 2002A-B with a deposition of film 2004A-B deposited on the substrate. In some embodiments, the coupons may be inserted into a substrate monitoring device (e.g., substrate monitoring devices 500, 600 of FIGS. 5-6) to acquire deposition process results. The deposited film 2004A-B may have varying levels of thickness across the surface of the substrate 2002A-B which can be a result of the many process parameters discussed throughout.

As shown in FIGS. 20A-B the substrate can be divided (e.g., segmented) into three regions. A first region 2030A-B is defined by an area of the coupon that substantially covered by the film with little to no spatial variance (e.g., not much thickness deviations). A second region 2034A-B is defined as an area of the coupon that is substantially void of any deposition film. A third region 2032A-B is defined as an area of the area representative of a transition zone between the first region and the second region. The third region may be of various sizes and is often representative of a thickness gradient between the thickness of the film in the first region and the absence of the film of the second region.

The size (e.g., length or width) of the third region 2032A-B may be directly related to one or more combinations of process parameters. In some embodiments, the associated spatial dimensions (e.g., absolute and relative) of each of the define regions may be used in one or more processing procedures, as discussed in other embodiments, to determine process result prediction, process parameter tuning updates, among other things.

As seen in FIGS. 20A-B the size of each of the first region 2030A-B, the second region 2034A-B, and the third region 2032A-B may differ coupon to coupon. For example, the second region 2030A of coupon 2000A is longer that the second region 2032B of coupon 2000B. The longer second region 2032A of coupon 2000A indicates that a gradient of the thickness of the coupon 2000A is smaller than the gradient of the thickness of the second region 2032B of coupon 2000B when maximum thickness is substantially equivalent. The various identified parameters of coupons 2000A-B may be further leveraged as input to one or more downstream processes (the parameters sometimes referred to as process result data).

FIGS. 21A-C illustrate embodiments of a surface structure 2100A, 2100B, 2100C of a substrate and/or enclosure structured used within a monitoring device, in accordance with some implementations of the present disclosure. As shown in FIG. 21A the substrate and/or enclosure structure may include one or more surface designed to be substantially flat and/or smooth (e.g., minimal cross frication along the surface). As shown in FIG. 21B, the substrate and/or enclosure structure may include uni-directional trenches. As shown in FIG. 21C, the substrate and/or enclosure structure may include more complicates features such as multi-dimensional trenches or cross-cut trenches.

In some embodiments, one or more of the surfaces of the substrate and/or enclosure structure may include trenches having variations in the pitch, depth, angle, etc. Additionally, surfaces may include other surface features including holes, crater structures, etc. In some embodiments, a substrate may be segmented into a mixture of smooth, light textured, and/or heavily textures regions.

In some embodiments, a physical model may facilitate a relationship between the depth of penetration and the increases the effective surface area, relative to a smooth surface, as a result of texturing from intrinsic micro-roughness from machining, mechanical grooves, texturing, micro-patterning, and the like. For a given cross-section of the opening and hole shape the depth of penetration will reduce with higher effective surface areas. The physical model may facilitate predicting the depth of penetration on holes that have a high degree of variability of shape, cross-section, surface roughness etc. based on integration of all details within the model calculations. The physical model may include known properties of the precursor molecules as well as empirical constants characterizing the surface reactions to the necessary degrees of complexity for accuracy and robustness.

In some embodiments, surface texturing may be employed by such as through coating adhesion and/or emissivity tuning techniques. A wall-textured device may include two or three types of roughness from "smooth" to "highly textured" that increase the ratio of surface are in comparison to a flat surface.

Figure 22:
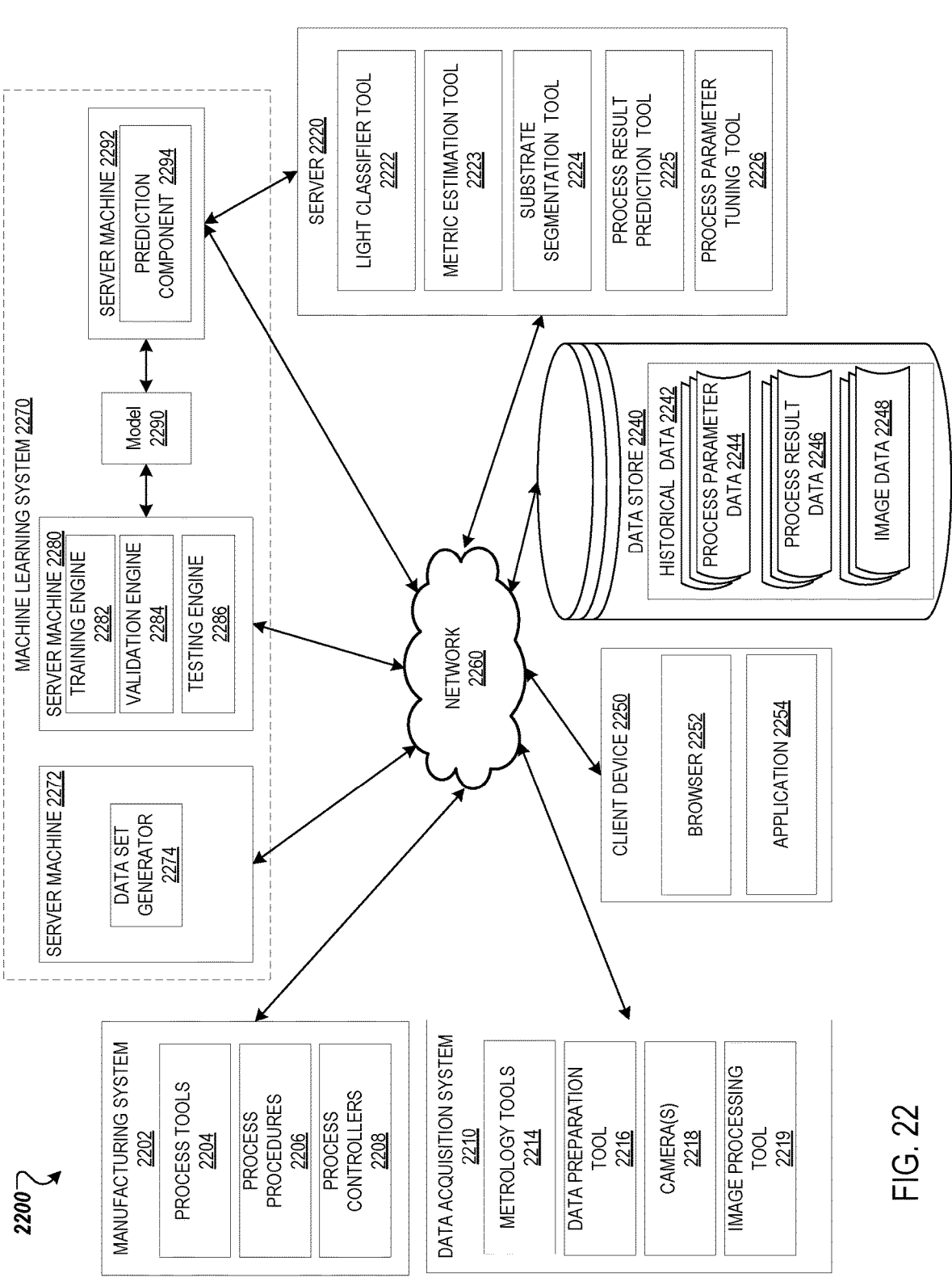
FIG. 22 is a block diagram illustrating an exemplary system architecture in which implementations of the disclosure may operate.

FIG. 22 is a block diagram illustrating an exemplary system architecture 2200 in which implementations of the disclosure may operate. As shown in FIG. 22, system architecture 2200 includes a manufacturing system 2202, a data acquisition system 2210, a client device 2250, a data store 2240, a server 2220, and a machine learning system 2270. The machine learning system 2270 may be part of the server 2220. In some embodiments, one or more components of the machine learning system 2270 may be fully or partially integrated into client device 2250. The manufacturing system 2202, the data acquisition system 2210, the client device 2250, the data store 2240, the server 2220, and the machine learning system 2270 can each be hosted by one or more computing devices including server computers, desktop computers, laptop computers, tablet computers, notebook computers, personal digital assistants (PDAs), mobile communication devices, cell phones, hand-held computers, or similar computing devices.

The manufacturing system 2202, the data acquisition system 2210, client device 2250, data store 2240, server 2220, and machine learning system 2270 may be coupled to each other via a network 2260 (e.g., for performing methodology described herein). In some embodiments, network 2260 is a private network that provides each element of system architecture 2200 with access to each other and other privately available computing devices. Network 2260 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, and/or any combination thereof. Alternatively or additionally, any of the elements of the system architecture 2200 can be integrated together or otherwise coupled without the use of network 2260.

The client device 2250 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 2250 may include a browser 2252, an application 2254, and/or other tools as described and performed by other systems of the system architecture 2200. In some embodiments, the client device 2250 may be capable of accessing the manufacturing system 2202, the data acquisition system 2210, the data store 2240, server 2220, and/or machine learning system 2270 and communicating (e.g., transmitting and/or receiving) indications of sensor data, processed data, data classifications, chamber recovery data (e.g., recovery profiles), process result data and/or inputs and outputs of various process tools (e.g., metrology tool 2214, data preparation tool 2216, camera(s) 2218, image-processing tool 2219, light classifier tool 2222, metric estimation tool 2223, substrate segmentation tool 2224, process result prediction tool 2225, and/or process parameter tuning tool 2226) at various processing stages of the system architecture 2200, as described herein.

As shown in FIG. 1, manufacturing system 2202 includes process tools 2204, process procedures 2206, and process controllers 2208. A process controller 2208 may coordinate operation of process tools 2204 to perform on one or more process procedure 2206. For example, various process tools may include specialized chambers such as etch chambers, deposition chambers (including chambers for atomic layer deposition, chemical vapor deposition, or plasma enhanced versions thereof), anneal chambers, and/or the like. In another example, machines may incorporate sample transportation systems (e.g., a selective compliance assembly robot arm (SCARA) robot, transfer chambers, front opening pods (FOUPs), side storage pod (SSP), and/or the like) to transport a sample between machines and process procedures.

Process procedures 2206 or sometimes referred to as process recipes or process procedures may include various specifications for carrying out operations by the process tools 2204. For example, a process procedure 2206 may include process specifications such as duration of activation of a process operation, the process tool used for the operation, the chemical dosage strength of deposition material(s) delivered to various regions of the processing chamber, the temperature, flow, pressure, etc. of a machine (e.g., a chamber), order of deposition, and the like. In another example, process procedures may include transferring instructions for transporting a sample to a further process procedure or to be measured by data acquisition system 2210. One or more process procedures 2206 include preventive maintenance procedures and seasoning procedures.

Process controllers 2208 can include devices designed to manage and coordinate the actions of process tools 2204. In some embodiments, process controllers 2208 are associated with a process recipe or series of process procedures 2206 instructions that when applied in a designed manner result in a desired process result of a substrate process. For example, a process recipe may be associated with processing a substrate to produce a target process results (e.g., rate of advancement of a deposition boundary on a film, film "creep" or distance a film has been deposited from an opening of a recess within a process chamber, critical dimensions, thicknesses, uniformity criteria, etc.) Process controllers 2208 can coordinate the performance of preventative maintenance procedures (e.g., chamber cleaning) and chamber recovery procedures (e.g., chamber seasoning) to return a chamber into a production state.

As shown in FIG. 22, data acquisition system 2210 includes metrology tools 2214, data preparation tool 2216, camera(s) 2218, and image processing tool 2219. Metrology tools 2214 can include a variety of sensors to measure process results (e.g., critical dimension, thickness, uniformity, etc.) within the manufacturing system 2202. For example, wafers processed within one or more processing chamber can be used to measure critical dimensions. In another example, substrate may be selectively removed from a substrate monitoring assembly and measured for one or more critical dimensions, thicknesses, process "creep" or distance a film has advanced from an edge proximate an opening of a slot or interior volume. Metrology tools 2214 may also include devices to measure process results of substrate processed using the manufacturing system. For example, process results such as critical dimensions, thickness measurements (e.g., film layers from etches, depositing, etc.) can be evaluated of substrates processed according to process recipe and/or action performed by process controllers 2208. Those measurements can also be used to measure conditions of a chamber over a recovery process such as during a seasoning procedure that includes processing a series of wafers (e.g., blank wafers).

In some embodiments, access to a particular substrate within a processing chamber may be selectively controlled for various process conditions (e.g., parts or steps of a process procedure). For example, as described previously, a barrier (e.g., a shutter device) may be actuated to remove and/or allow access to a slot where a corresponding substrate is situated. Metrology data can be matched or otherwise related to corresponding process conditions associated with a given process result (e.g., a deposition of film on a substrate in the corresponding accessible slot). In some embodiments, selective control over process conditions can be used to identify isolated effects of a subset of process parameters (e.g., a first parameter) on process results. For example, a substrate may be processed a first time under a first set of process parameters. A second substrate may be processed a second time under a second set of process parameters. The two substrates may be processed one after the other without breaking overall process conditions of a processing chamber (e.g., maintaining a vacuum condition). The difference between the first set of process parameters and the second set of process parameters may be one process value and the difference between process results of the first substrate and second substrate may indicate an overall influence of the one process value on a corresponding process result.

In some embodiments, Metrology tools 2214 can be configured to generate metrology data associated with substrates processed by manufacturing equipment 2222. The metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., a deposition rate, a deposition rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

Data preparation tool 2216 may include process methodology to extract features and/or generate synthetic/engineered data associated with data measured by metrology tools 2214. In some embodiments, data preparation tool 2216 can identify correlations, patterns, and/or abnormalities of metrology or process performance data. For example, data preparation tool 2216 may perform a feature extraction where data preparation tool 2216 uses combinations of measured data to determine whether a criterion is satisfied. For example, data preparation tool 2216 can analyze multiple data points of an associated parameter (e.g., thickness, critical dimension, defectivity, plasma condition, "creep" distance, rate of film boundary advancement, etc.) to determine whether process results conditions are met (e.g., threshold rates of film boundary advancement, threshold "creep" distances, whether a substrate is meets defectivity conditions, etc.). In some embodiments, data preparation tool 2216 performing a normalization across the various sensor data associated with various process chamber conditions. A normalization may include processing the incoming sensor data to appear similar across the various chambers and sensors used to acquire the data.

In some embodiments, data preparation tool 2216 can perform one or more of a process control analysis, univariate limit violation analysis, or a multivariate limit violation analysis on metrology data (e.g., obtained by metrology tools 2214). For example, data preparation tool 2216 can perform statistical process control (SPC) by employing statistics-based methodology to monitor and control process controllers 2208. For example, SPC can promote efficiency and accuracy of a deposition procedure by ensuring results fall within a level of confidence a non-line of sight (LOS) surface is adequately deposited over (e.g., a threshold "creep" distance is satisfied) such as, for example, by identifying data points that fall within and/or outside control limits.

In some embodiments, a processing chamber can be measured throughout a processing procedure. In some embodiments, increased amounts of sensor data is taken during predetermined time of a processing procedure. For example, during or immediately after a wafer is processed, additional sensors can be activated (e.g., within or otherwise integrated with a substrate) and/or currently activated sensors may take additional data. In some embodiments, process controllers 2208 may trigger measurement by metrology tools 2214 based on operations to be performed by process tools 2204. For example, process controllers 2208 can trigger activation of one or more process results measurements (e.g. of metrology tools 2214) responsive to one or more process procedures (or alternatively, individual process steps of a process procedure) during a transition period where a different process is performed or a substrate is transported out of a processing chamber.

In some embodiments, the extracted features, generated synthetic/engineered data, and statistical analysis can be used in association with machine learning system 2270 (e.g., to train, validate, and/or test machine learning model 2290). Additionally and/or alternatively, data preparation tool 2216 can output data to server 2220 to be used by any of light classifier tool 2222, metric estimation tool 2223, substrate segmentation tool 2224, process result prediction tool 2225, process parameter tuning tool 2226.

As shown in FIG. 22, data acquisition system 2210 may include one or more camera(s) 2218 and image-processing tool 2219. The one or more camera(s) may include any image acquisition capturing device such as a reflectometer sensor, optical sensor, an integrated camera within a client device (e.g., client device 2250) such as a computer, a telephone, a monitor or the like. Camera(s) 2218 may acquire image data of a film deposited on a surface of a substrate. The image data may characterize light reflected from a film deposited on a surface of the substrate (e.g., such as using the setup described in FIG. 18). The image data may include one or more image frames that include a substrate, film deposited on the substrate, and a boundary of the substrate that does not include the substrate or the film (e.g., a support structure or surface). The image-processing tool 2219 may include processing logic that receives image-based data acquired by the camera(s) 2218 and performs a feature extraction to identify features (e.g., color data, substrate bounding data) characterizing one or more image frames. As will be discussed in more detail below, the image-processing tool 2219 may employ one or more machine learning models (e.g., using machine learning system 2270) to perform the feature extraction.

Data store 2240 may be a memory (e.g., random access memory), a drive (e.g., a hard drive, a flash drive), a database system, or another type of component or device capable of storing data. Data store 2240 may store one or more historical data 2242 including old process parameter data 2244 (e.g., chamber conditions, chemical dosage strength of deposition materials, process procedure data) old process result data 2246 (e.g., film thickness profiles, "creep" distance, rate of deposition boundary advancements, etc.) and/or old image data 2248 (e.g., characterizations of reflected light off a surface of a film). In some embodiments, the historical data 2242 may be used to train, validate, and/or test a machine learning model 2290 of machine learning system 2270 (See e.g., FIG. 27 for exemplary methodology).

Server 2220 may include one or more computing devices such as a rackmount server, a router computer, a server computer, a personal computer, a mainframe computer, a laptop computer, a tablet computer, a desktop computer, etc. The server 2220 can include a light classifier tool 2222, a metric estimation tool 2223, a substrate segmentation tool 2224, a process result prediction tool 2225, and a process parameter tuning tool 2226.

The light classifier tool 2222 receives image data (e.g., characterization of light reflected from a surface of a film deposited on a substrate) and determine a corresponding light classification.

A light classification may include a color classification that includes one or more data representations for a color corresponding to a region of the image data (e.g., a pixel). For example, one or more color schemes may be used such as a red green blue (RGB) color map. In another example, a color map may include a hue, saturation, and lightness (HSL) mapping to one or more regions of the image data (e.g., for every pixel or a collection of pixels). In another example, the color map may utilize a color scheme account for the chromaticity of the light such as for example, the CIELAB (L*A*B*) color space or the CIELUB (L*U*V*) color space. These various data representations may be output from the light classifier tool 2224 and further used by other tools (e.g., metric estimation tool 2223, substrate segmentation tool 2224, process result prediction tool 2225, and process parameter tuning tool 2226) of server 2220. In some embodiments, knowledge of a chromaticity color rating of a light source may not contain sufficient information and further optical data may be measured. For example, a photo-spectrum measurement (e.g., relative intensity v. wavelength) may be acquired and leveraged in further processing to determine features of the light source and reflected light.

The light classifier tool 2222 classifies portions of the image data into a data representation indicating features of the reflected light such as color, chromaticity, polarization, etc. representation. In some embodiments, the light classifier tool 2222 receives segmented image data (e.g., a portion of an image) from substrate segmentation tool 2224. In some embodiments, as will be discussed further substrate segmentation tool 2224 may segments and image into identified regions such as a location of the substrate, a location of the film, a location of a support structure and may provide an identified region for processing by the light classifier tool 2222. For example, the image may be cropped or otherwise indicate the location of the substrate within an image frame. The light classifier tool 2222 may process a portion of the image frame associated with the region of interest and identify various light classifications (e.g., color, polarization, etc.) for the region of interest (e.g., the processed surface of film on the substrate, etc.)

As will be discussed further, the light classifier tool 2222 may leverage a machine learning model to classifying image data with data representations of color, polarization, chromaticity, hue, etc. For example, a machine learning model may receive image data as input and output a representation of color for each regions of the image data (e.g., for each pixel). An example output may include a matrix with various data representation for color where a position of the matrix represents a position of within the image data. For example, a matrix may include RGB color value from different regions of interest (ROI) on a substrate (e.g., a test coupon). RGB color map could be in different ranges (0.0-1.0, or 0-255) and converted to a few other color maps such as HSL, L*A*B*, or L*U*V*.

In some embodiments, the light classifier tool 2222 performs feature engineering. For example, as described in previous embodiments, various engineering tools can perform a feature extraction and/or create artificial and/or virtual parameter combinations. A feature extractor (e.g., performed by light classifier tool 2222) can create various features by performing variable analysis such as process control analysis, univariate limit violation analysis, and/or multivariate limit violation analysis on raw image data. The light classifier tool 2222 may further perform other feature engineering such as performing cross products, quadratics, ratios to add and other synthetic data generation techniques. As will be discussed further, the machine learning model may include linear regression, elastic net, support vector machine, neural network, random forest, extreme gradient boosting (XGBoost) algorithms.

The metric estimation tool 2223 receives input data and determines one or more metric values of a film deposited on a substrate. In some embodiments, the input data include color data such as the data representations generated by the light classifier tool 2222, as previously described. For example the metric estimation tool 2223 may receive a color map indicating color values corresponding to different portions of the image data (e.g., pixels). The metric estimation tool 2223 estimates a thickness of the film at a location of a substrate based on the color data corresponding to a portion of the image data associated with the location on the substrate. The metric estimation tool may receive an indication of which portions of the image represents the films based on data received from the substrate segmentation tool. For example, the metric estimation tool 2223 may receive filtered data or data indicating a subset of the raw image data to be used in the thickness estimation.

In some embodiments, the metric estimation tool 2223, may receive sensor data from a substrate monitoring assembly. As discussed previously a substrate may include one or more sensors that characterizing a film deposited on the substrate. The received sensor data may include one or more mass data from mass sensors, capacitance data from capacitance sensors, other measured data characterizing the film. The metric estimation tool 2223 determines a thickness of the film at various locations across a surface of the substrate based on the sensor data. The metric estimation tool may use a machine learning model or other models such as for example, a deterministic model, a statistical model, a physics model, and the like to determine the thickness of the film at the various location across a surface of the film.

In some embodiments, the metric estimation tool 2223 provides one or more metric values in the form of a metric profile. A metric profile may include one or more aspects of thickness profiles as discussed in associated with FIGS. 15A-B. For example, the thickness profile may indicate thickness values along an axis of the substrate (e.g., from an opening of a slot to a closed end or end of the substrate). The thickness profile may indicate a relative thickness trend.

In some embodiments, the metric estimation tool 2223 determines one or more thickness values, growth per cycle (GPC), index of refraction, composition of the film, etc. For example, one or more values of each of these parameters may be determined and used in a profile similar to the described thickness profile, previously described. In some embodiments, the metric estimation tool 2223 may determine other metrics such as effect of an inhibiting agent that is limited by the diffusion of the reactive species. The metric estimation tool 2223 may further be leveraged to determine limitation, endpoint, and stability of an ALD inhibiting agent.

In some embodiments, the metric estimation tool 2223 may determine a thickness based on metrology data or image data after a substrate process has been performed. However, in other embodiments the metric estimation tool may determine a live updating thickness prediction while the substrate is being processed. For example, a substrate may not be required to be removed from a processing chamber to perform a thickness estimation. As is discussed in other embodiments, the live thickness estimation may be used to make live updates to a process system such as, for example, to alter one or more process parameters of the processing chamber and/or processing procedure.

The substrate segmentation tool 2224 receives image data and identifies various identifiable regions of pixels within the frame. For example, the substrate segmentation tool 2224 may determine a boundary of a substrate (e.g., a coupon or wafer), the substrate segmentation tool 2224 may identify different regions of the substrate. For example, the substrate segmentation tool 2224 may annotate image data by for example, labeling bounding boxes around the substrate stored in the image data. Not all substrates may be the same size and the bounding boxes or more generally identifying the location of the substrate within an image frame may reduce computation load for future process by omitting processes using data outside the identified region (e.g., outside the bounding box). The substrate segmentation tool may identify where coupons are located within an image frame and provide bounding boxes around them. The substrate segmentation tool 2224 may leverage image data such as information corresponding to the viewing angle (e.g., a camera's perspective angle relative to a surface of the film. For example, image of a rectangular substrate may be acquired and an angle of an image with an unknown angle may be inferred.

The substrate segmentation tool 2224 may further segment image data based on received input data. The substrate segmentation tool 2224 may identify different regions. For example, a first region may be representative of a location of a film deposited on the substrate, a second region may be representative of a location of a bare substrate without film deposited on the surface, and a third region may be representative between the first region and the second region. The third region may be defined by having a spatial variance above a threshold variance. For example, FIG. 20A-B illustrates the various regions discussed herein. The first region may be defined by having a spatial variance below a threshold value. The substrate segmentation tool 2224 may output data indicating the various regions and/or a boundary of the substrate.

In some embodiments, in semantic segmentation every pixel in the image may be assigned to a particular class. For example, each pixel may be identified as bare substrate (e.g. bare Si), a transition between bare substrate and the film (e.g., a fast thickness gradient region), or the full film (e.g., slow thickness gradient region) and assigned a label to the corresponding region. The task of assigning each pixel may include a dense prediction and an output may include an image with classified pixels.

In some embodiments, the substrate segmentation tool may include two parts. A first part may include an encoder. The encoder may include a stack of convolutional and max pooling layers and performs feature extraction. The second part may include an upscaling part (e.g., a decoder). The second part may be used to implement precise localization using transposed convolutions. In some embodiments, the encoder may include a deep convolutional network such as a VGG-Net, a ResNet, a Mobile-Net, or the like. For example, the substrate segmentation tool may further include a Unet.

In some embodiments, as will be discussed further the substrate segmentation tool 2224 may use a machine learning model. The machine learning model may identify, based on the image and/or color data, where the regions start and end (e.g., by identifying patterns, gradients, and/or other features inherent in the image and/or color data). In some embodiments, the machine learning model leverages object detection logic to identify the boundary of the substrate and identify the boundaries of the various regions across the surface of the substrate. In some embodiments, the machine learning model leverages an angle of the camera's perspective as an input in determining the one or more described outputs.

The process result prediction tool 2225 receives data from process controllers indicating a state of a process chamber and/or a characterization of one or more process parameters for carrying out a process procedure. In some embodiments, the process tools 2204 and/or process controllers 2208 include sensors configured to generate and/or collect sensor data associated with manufacturing system 2202. Sensor data can include a value of one or more of temperature (e.g., heater temperature), spacing (SP), pressure, high frequency radio frequency (HFRF), voltage of electrostatic chuck (ESC), electrical current, flow, power, voltage, chemical dosage of deposition material, etc. Sensor data can be associated with or indicative of manufacturing parameters such as hardware parameters, such as settings or components (e.g., size, type, etc.) of the manufacturing system 2202, or process parameters of the process tools 2204. The sensor data can be provided while the manufacturing system 2202 is performing a substrate process. The sensor data can be different for each substrate.

In some embodiments, the process result prediction tool 2225 receives sensor data from process tools 2204 and predicts a process result of a substrate disposed within the process chamber. The substrate may be disposed in a non-LOS position and receive deposition material from an opening in a slot or recess (e.g., within a substrate monitoring assembly, as describe herein). In some embodiments, process result prediction tool 2225 receives raw sensor data from process tool 2204, in other embodiments, raw sensor data is combined with synthetic data engineered from data preparation tool 2216. The process result prediction tool 2225 may process sensor data to determine a prediction of a process result under the one or more process conditions indicated by the sensor data. The process result prediction may include an indication of one or more thickness values of a film deposited on substrate positioned within a recess of the process chamber. The process result prediction may include an indication of a rate of advancement of a deposition boundary of the film. For example, as discussed in other embodiments, substrates disposed within a slot or recess with an opening on one side begin to accumulate deposition material proximate the opening and the film grows across the surface towards the closed side of the substrate. The process result prediction may indicate a "creep" distance, or a distance the film has advanced across the surface of the substrate during a substrate process. In some embodiments, process result prediction tool 2223 may employ numerical simulations (e.g., based on models of diffusion and the surface reaction of chemistry such as, for example, physical adsorption, chemical adsorption, ligand exchange, add-atom-surface-mobility and the like).

The process parameter tuning tool 2226 may receive data from process tools 2204 (e.g., sensor data, etc.), data preparation tool 2216 (e.g., metrology data, etc.), and process result prediction tool 2225 (e.g., process result prediction data) and generate an update to one or more process parameters (e.g., process control knobs associated with a substrate process procedure). The process parameter tuning tool 2226 may generate control knob update data (e.g., updates to one or more control knobs (e.g., process parameters)). In some embodiments, the process parameter tuning tool 2226 receives chamber data (e.g., raw sensor data, processed sensor data) from process tools 2204, and/or processed data output from data preparation tool 2216. The process parameter tuning tool 2226 may generate chamber control knob update data based on chamber data received from process tools 2204 and/or processed data output from data preparation tool 2216. In some embodiments, the data preparation tool 2216 receives raw sensor data from metrology tool 2214. The raw sensor data may be combined with synthetic data engineered from data preparation tool 2216. The process parameter tuning tool 2226 may determine an update to the chamber control knobs (e.g., one or more chamber process parameters) which updates the chamber conditions to produce substrates having process results meeting a threshold condition. For example, the chamber knob tool may identify a change in chamber control knobs such that a substrate processed under the chamber conditions results in the substrate having process results meeting threshold conditions associated with one or more process procedures 2206.

The chamber control knobs may be associated with a process procedure 2206. The updates to process procedures may alter a manner in which a process procedure 2206 is implemented by process tools 2204. For example, an update may include increasing or decreasing a process time of one or more process operations of a process procedure 2206. In some embodiments, the process parameter tuning tool 2226 may use a machine learning model that receives input data such as chamber data from process tools 2204, and/or processed data output from data preparation tool 2216, and outputs chamber control knob updates to transition the processing chamber to a production mode of operation. As will be discussed later, the machine learning model may include a bootstrap aggregation model, a random forest tree decision tree model, a partial least squares regression (PLS) model, a least absolute shrinkage and selection operator (LASSO) regression model, and/or Ridge regression model among other models. The machine learning model may include ensemble modeling comprising multiple models (e.g., stacked modeling) and leveraging higher confidence models for final classification of the received data.

As previously described, some embodiments of the light classifier tool 2222, metric estimation tool 2223, substrate segmentation tool 2224, process result prediction tool 2225, and/or data process parameter tuning tool 2226 may perform their described methodology using a machine learning model. The associated machine learning models may be generated (e.g., trained, validated, and/or tested) using machine learning system 2270. The following exemplary description of machine learning system 2270 will be described in the context using machine learning system 2270 to generate a machine learning model 2290 associated with metric estimation tool 2223. However, it should be noted that this description is purely exemplary. Analogous processing hierarchy and methodology can be used in the generation and execution of machine learning models associated with the light classifier tool 2222, metric estimation tool 2223, substrate segmentation tool 2224, process result prediction tool 2225, and/or data process parameter tuning tool 2226 individually and/or in combination with each other, as will be discussed further in association with other embodiments.

The machine learning system 2270 may include one or more computing devices such as a rackmount server, a router computer, a server computer, a personal computer, a mainframe computer, a laptop computer, a tablet computer, a desktop computer, etc. The machine learning system 2270 may include a prediction component 2294. In some embodiments, the prediction component 2294 may use historical data 2242 to determine whether a status of a processing chamber meets conditions to transition to a production operational mode. In some embodiments, the prediction component 2294 may use a trained machine learning model 2290 to determine the status of the chamber. The trained machine learning model 2290 may use historical data 2242 to determine chamber status.

In some embodiments, the trained machine learning model 2290 is stored on server machine 2292 and/or server 2220. Server machine 2280 and/or server machine 2292 may store one or more machine learning models recently trained (e.g., to perform model performance management). For example, one or more models trained within a duration of time (e.g., last 6 months) may be stored in server machine 2292 and one or more final models for predicting chamber conditions may be stored on server 2220 (e.g., operable with chamber recovery tool 126).

In some embodiments, the machine learning system 2270 further includes server machine 2272 and server machine 2280. The server machine 2272 and 2280 may be one or more computing devices (such as a rackmount server, a router computer, a server computer, a personal computer, a mainframe computer, a laptop computer, a tablet computer, a desktop computer, etc.), data stores (e.g., hard disks, memories databases), networks, software components, or hardware components.

Server machine 2272 may include a data set generator 2274 that is capable of generating data sets (e.g., a set of data inputs and a set of target outputs) to train, validate, or test a machine learning model. The data set generator 2274 may partition the historical data 2242 into a training set (e.g., sixty percent of the historical data, or any other portion of the historical data), a validating set (e.g., twenty percent of the historical data, or some other portion of the historical data), and a testing set (e.g., twenty percent of the historical data). In some embodiments, the prediction component 2294 generates multiple sets of training data. For example, one or more sets of training data may include each of the data sets (e.g., a training set, a validation set, and a testing set).

Server machine 2280 includes a training engine 2282, a validation engine 2284, and a testing engine 2286. The training engine 2282 may be capable of training a machine learning model 2290 using one or more old process parameter data 2244, process result data 2246, and old image data 2248 of the historical data 2242 (of the data store 2240). In some embodiments, the machine learning model 2290 may be trained using one or more outputs of the data preparation tool 2216, light classifier tool 2222, metric estimation tool 2223, substrate segmentation tool 2224, process result prediction tool 2225, and/or data process parameter tuning tool 2226. For example, the machine learning model 2290 may be a hybrid machine learning model using sensor data and/or mechanistic features such as a feature extraction, mechanistic modeling and/or statistical modeling (e.g., using data preparation tool 2216) The training engine 2282 may generate multiple trained machine learning models 2290, where each trained machine learning model 2290 corresponds to a distinct set of features of each training set.

The validation engine 2284 may determine an accuracy of each of the trained machine learning models 2290 based on a corresponding set of features of each training set. The validation engine 2284 may discard trained machine learning models 2290 that have an accuracy that does not meet a threshold accuracy. The testing engine 2286 may determine a trained machine learning model 2290 that has the highest accuracy of all of the trained machine learning models based on the testing (and, optionally, validation) sets.

In some embodiments, the training data is provided to train the machine learning model 2290 such the trained machine learning model may receive a new input having new image data characterizing a deposition of a film on a substrate. The new output may indicate a metric estimation including one or more metric values (e.g., thickness, index of refraction, composition, etc.) of a film corresponding to the image data.

The machine learning model 2290 may refer to the model that is created by the training engine 2282 using a training set that includes data inputs and corresponding target output (historical results of processing chamber under parameters associated with the target inputs). Patterns in the data sets can be found that map the data input to the target output (e.g., identifying connections between portions of the sensor data and resulting chamber status), and the machine learning model 2290 is provided mappings that captures these patterns. The machine learning model 2290 may use one or more of logistic regression, syntax analysis, decision tree, or support vector machine (SVM). The machine learning may be composed of a single level of linear or non-linear operations (e.g., SVM) and/or may be a neural network.

Prediction component 2294 may provide input data to model 2290 and obtain one or more outputs. For example, regarding metric estimation tool 2223, the prediction component 2294 provides process data (e.g., current process parameter data associated with a state of a processing chamber) as input to trained machine learning model 2290 and may run trained machine learning model 2290 on the input to obtain one or more outputs including a set of values indicating a metric of a film deposited on a substrate. For example, the output may include a metric profile (e.g., a thickness profile outlining the thickness of the film along an axis across a surface of the substrate). Prediction component 2294 may be capable of identifying confidence data from the output that indicates a level of confidence that at various points of the seasoning procedure a status of the processing chambers meets threshold conditions to move to a production mode. In one non-limiting example, the level of confidence is a real number between 0 and 1 inclusive, where 0 indicates no confidence of the one or more chamber statuses and 1 represents absolute confidence in the chamber status.

For purpose of illustration, rather than limitation, aspects of the disclosure describe the training of a machine learning model and use of a trained learning model using information pertaining to historical data 2242. In another implementation, a heuristic model or rule-based model is used to determine a chamber status.

In some embodiments, the functions of client devices 2250, server 2220, data store 2240, and machine learning system 2270 may be provided by a fewer number of machines than shown in FIG. 22. For example, in some embodiments, server machines 2272 and 2280 may be integrated into a single machine, while in some other embodiments server machine 2272, 2280, and 2292 may be integrated into a single machine. In some embodiments, the machine learning system 2270 may be fully or partially provided by server 2220.

In general, functions described in one embodiment as being performed by client device 2250, data store 2240, data acquisition system 2210, manufacturing system 2202, and machine learning system 2270 can also be performed on server 2220 in other embodiments, if appropriate. In addition, the functionality attributed to a particular component can be performed by different or multiple components operating together.

In embodiments, a "user" may be represented as a single individual. However, other embodiments of the disclosure encompass a "user" being an entity controlled by multiple users and/or an automated source. For example, a set of individual users federated as a group of administrators may be considered a "user."

Figure 23:
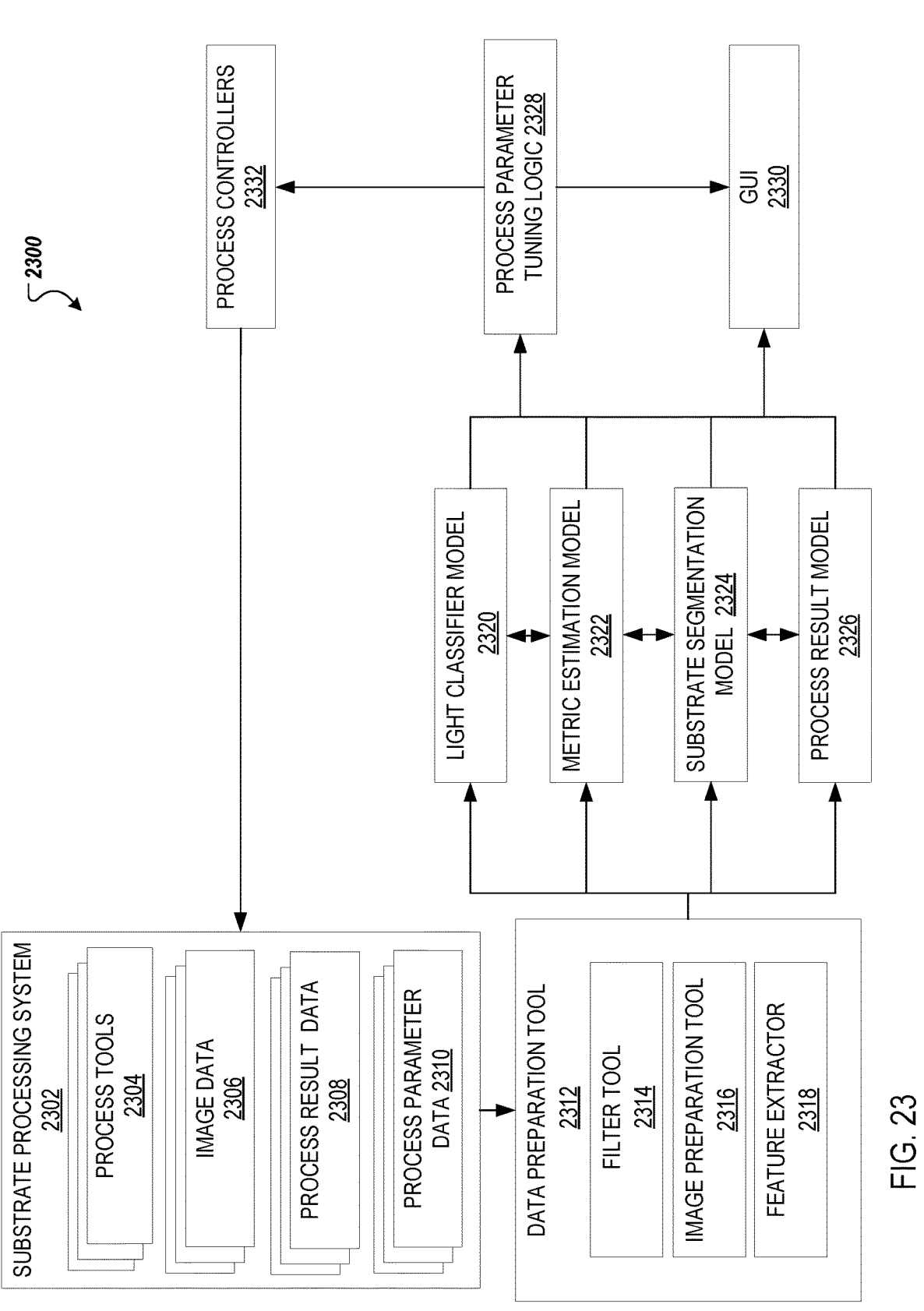
FIG. 23 is a block diagram illustrating a deposition monitoring system, in which implementations of the disclosure may operate.

FIG. 23 is a block diagram illustrating a deposition monitoring system 2300, in which implementations of the disclosure may operate. The deposition monitoring system 2300 includes a substrate processing system 2302 (e.g., manufacturing system 2202 of FIG. 22). The substrate processing system 2302 can include process tools 2304 and acquire image data 2306 (e.g., of light reflected from a surface of a processed substrate), process result data 2308 (e.g., thickness measurement, critical measurements, rate of advancement of deposition boundaries, composition measurements, refraction measurements, uniformity criteria, etc.). The process tools 2304 can include chamber sensors (e.g., to measure radio frequency (RF), temperature, gas, etc.) and additional sensors (e.g., optical emission spectroscopy (OES) sensor). The process parameter data 2310 can include data indicative of a state of a processing chamber. For example, process tools 2304 can measure and monitor parameters such as RF, temperature, gas, spectroscopy data, etc.

In some embodiments, the image data 2306, the process result data 2308, and the process parameter data 2310 is processed by data preparation tool 2312. The data preparation tool 2312 includes feature extractor 2318. The feature extractor 2318 can receive process result data 2308 and process parameter data 2310 and generate synthetic data associated with various combinations, correlations, and/or artificial parameters. The feature extractor 2318 can dimensionality reduce the raw sensor data into groups or features. For example, the data feature extractor 2318 may generate features that include the rate of change of a parameter value and/or a collection of parameter values. In some embodiments, data preparation tool 2312 performs any of partial least squares analysis, principal component analysis, multifactor dimensionality reduction, nonlinear dimensionality reduction, and/or any combination thereof. In some embodiments, the data preparation tool 2312 is designed for edge detection of the chamber data. For example, the data preparation tool 2312 includes methodology that aims at identifying data points that change sharply and/or that have discontinuities. For example, the slope of one or more image data point may indicate a boundary of a region such as, for example, a boundary of a substrate.

In some embodiments, data preparation tool 2312 performs a normalization across the various sensor data associated with various process chamber conditions. A normalization may include processing the incoming sensor data to appear similar across the various chambers and/or sensors used to acquire the data. In some embodiments, data preparation tool 2312 may include aspects and/or features of data preparation tool 2216 of FIG. 1.

As shown in FIG. 23, the data preparation tool 2312 includes a filter tool 2314. The filter tool 2314 performs a feature mapping. The feature mapping may include applying color filters to raw image data to provide additional data points for identifying a corresponding color for each region (e.g., each individual pixel) of an image frame. For example, an image frame may be received and multiple color filters such as a red filter, a blue filer, and a green filter may be applied and color filter data may be generated. The generated color filter data may be used as input to light classifier model 2320. In some embodiments, other image filters may be used such as grayscale filtering, RGB filtering, HSL filtering, L*A*B* filtering, and/or L*U*V* filtering.

In some embodiments, the filter tool 2314 may adjust factors to build a training set of known samples such as to improve the accuracy when encountering an unknown sample. For example, a single angle, brightness, spectrum, polarization, etc. can match a sample's observed properties but it is unlikely a complete match may occur. The filter tool 2314 may leverage various previously identified filters to adjust parameters that will change the dimensional perspective in order to generate a holistic and/or clear understanding of the sample properties being measured.

As shown in FIG. 23, the data preparation tool 2312 includes an image preparation tool 2316. The image preparation tool 2316 performs one or more methods or algorithms to prepare raw image data for processing by further processing tools (e.g., light classifier tool 2320, substrate segmentation model 2324). The image preparation tool may perform one or more logical processes of feature extractor 2318 in identifying patterns, groupings, or organizational mediums for delivering the image data for further process. For example, one or more image frames may be cropped, compressed, annotated, or otherwise altered (e.g., to improve image processing speed by the process models discussed later). For example, the image preparation tool may apply a spatial overlay (e.g., a displayed grid) to be display over an image to indicate spatial segmentation of the image data. In some embodiments, the data preparation tool 2312 may group related image data together (e.g., for ease of future processing). For example, as previously indicated the image data may include capture images of a film deposited on a surface of a substrate at different capture angles. Images with of the same substrate with different capture angles may be groups as part of a feature input for one or more downstream processing models.

In some embodiments, the light classification model 2320 evaluates other light metrics of a light source such as grey-scale, opacity, non-reflected elements, full-spectrum of color, polarization, unfiltered, and the light. For example, the light classification model 2320 may evaluate a gray-scale for thin amorphous films, which may not show color below a certain threshold (e.g., when $Al_2O_3$ is about 50 nm). Higher index of refraction materials such as HfO2 have lower transition such as 30 nm. In the sub-color thickness, the thinner the film is often the lighter the color. However, 10 nm films are almost invisible to the naked eye except if compared side-by-side to uncoated substrate in bright light. None-the-less, sensitivities of cameras beyond the human eye's sensitivity could detect in image enhancement reprocessing, compounding multiple photographs, full-spectrum (UV-vis-IR), and the like.

In some embodiments, the light classification model 2320 may evaluate cloud, darkened, and/or milk optical features of non-smooth surface features. Light reflecting from a non-smooth surface can be scattered randomly. The size and shape of the features determines how the light is redirected. Total internal reflection can make a film appear dark. Diffuse scattering can make a film appear milky or cloudy. Also darkening can occur by opaque due to chemical impurities added as a result of the surface process.

In some embodiments, the light classification model 2320 evaluates non-reflected color. Some chemical processes can change the color of light by selectively absorbing photons by wavelength.

In some embodiments, the light classification model 2320 evaluates a full spectrum of received optical signals. Effects of the human eye are not to limit the portion of the spectrum. As noted in other embodiments, the image capture devices may be capable of measuring an optical spectrum beyond what a human eye may be capable of processing/rendering (e.g., UV, IR, and RF).

In some embodiments, the light classification model 2320 may evaluate a polarization of the light. For example, the light classification model 2320 may evaluation a proportion of transverse electric (TE) or transverse magnetic (TM). In another example, the light classification model 2320 evaluates polarization angles, range of angles, polarization parameters (e.g., linear, elliptical, spherical, etc.).

In some embodiments, the data preparation tool 2312 is used to generate input for light classifier model 2320. As discussed further in other embodiments, the light classifier model 2320 receives input data (e.g., raw image data, filtered image data, etc.) to determine a color classification for various portions of image frames of the image data. In some embodiments, the light classifier model 2320 receives image data (e.g., raw or processed by image preparation tool 2316) characterizing light reflected from a surface of a film deposited on a substrate. The light classifier model 2320 classifies portions of the image data into a color representation. In some embodiments, the light classifier model 2320 receives segmented image data (e.g., a portion of an image) from substrate segmentation model 2324. The light classification model may output a data indicating an assigned color classification for each spatially defined (e.g., location on a grid) are represented by the image data. The light classification model may leverage the mapped features from image preparation tool 2316 and determine with a level of confidence features within the image data. For example, the light classification model 2222 may receive the feature data (e.g., in the form of a feature vector) and perform a linearization of the feature data. The linearized data may further be processed by a machine learning model such, for example, a neural network, to select (e.g., computationally vote) with high confidence on various identifiable features within the image data. For example, the light classification model may classify each region (e.g., pixel) with a color assignment. An example output may include a matrix with various data representation for color where a position of the matrix represents a position of within the image data. For example, a matrix may include RGB color value from different regions of interest (ROI) on a substrate (e.g., a test coupon). RGB color map could be in different ranges (0.0-1.0, or 0-255) and converted to a few other color maps such as HSL, L\*A\*B\*, or L\*U\*V\*.

In some embodiments, the light classifier model 2222 performs feature engineering. For example, as described in previous embodiments, various engineering tools can perform a feature extraction and/or create artificial and/or virtual parameter combinations. A feature extractor (e.g., performed by light classifier model 2222) can create various features by performing variable analysis such as process control analysis, univariate limit violation analysis, and/or multivariate limit violation analysis on raw image data. The light classifier model 2222 may further perform other feature engineering such as performing cross products, quadratics, ratios to add and other synthetic data generation techniques. As will be discussed further, the machine learning model may include linear regression, elastic net, support vector machine, neural network, random forest, extreme gradient boosting (XGBoost) algorithms.

In some embodiments, the light classification model 2222 may receive images captures at multiple angles and/or from a video-feed using frame-capture. Consistent lighting may be used. In some embodiments, a scaling correction algorithm may be deployed to correct overall lighting and reject images if they cannot be scale according to define specification, appear out of focus, and/or don't match with the metrics of the expected device geometry and other abnormalities.

The metric estimation model 2322 receives image data (e.g., image data 2306, prepared image data from image preparation tool 2316, color classified image data from light classifier model 2320). For example, the metric estimation tool may receive a color map indicating color values corresponding to different portions of the image data (e.g., pixels). The metric estimation model 2323 estimates a thickness of the film at a location of a substrate based on the color data corresponding to a portion of the image data associated with the location on the substrate. The metric estimation tool may receive an indication of which portions of the image represents the films based on data received from the substrate segmentation model 2224. For example, the metric estimation tool 2223 may receive filtered data or data indicating a subset of the image data to be used in the metric estimation model 2322.

In some embodiments, the metric estimation model comprises a statistical model. The statistical model may be used to process the data based on statistical operations to validate, predict, and/or transform the image data (e.g., color classified image data). In some embodiments, the statistical model is generated using statistical process control (SPC) analysis to determine control limits for data and identify data as being more or less dependable based on those control limits. In some embodiments, the statistical model is associated with univariate and/or multivariate data analysis. For example, various parameters can be analyzed using the statistical model to determine patterns and correlations through statistical processes (e.g., range, minimum, maximum, quartiles, variance, standard deviation, and so on). In another example, relationships between multiple variables can be ascertained using regression analysis, path analysis, factor analysis, multivariate statistical process control (MCSPC) and/or multivariate analysis of variance (MANOVA).

In some embodiments, the metric estimation model comprises a mechanistic or deterministic physics model. In some embodiments, the mechanistic model is determined using data regression analysis. For example, any of linear regression, nonlinear regression (e.g., exponential, power series, logarithmic, etc.), and/or any combination thereof can be used to generate the mechanistic model. In some embodiments, the mechanistic model identifies multiple physical dependencies between the data and generates various predicted values associated with the image data and the metric of the film across a surface of the imaged film deposited on a substrate. In some embodiments, the model can be used to output predictions (e.g., a future or expected value and/or a current parameter value difficult to obtain), updated data values (e.g., calibrate data points), and/or relationships between the individual data points (e.g., a regression equation and/or trend line).

The metric estimation model 2322 receives input data and determines one or more metric values of a film disposed on a substrate. In some embodiments, the input data includes color data such as the data representations generated by the light classifier model 2320, as previously described. For example, the metric estimation tool may receive a color map indicating color values corresponding to different portions of the image data (e.g., pixels). The metric estimation model 2223 outputs a prediction of one or more metric values indicating a metric of the film at corresponding location across a surface of the substrate. The metric estimation tool may receive an indication of which portions of the image represents the films based on data received from the substrate segmentation tool. For example, the metric estimation tool 2223 may receive filtered data or data indicating a subset of the raw image data to be used in the metric estimation.

In some embodiments, the metric estimation model 2322 may be configured to receive sensor data (e.g., individually or in combination with image data) from a substrate monitoring assembly. As discussed previously a substrate may include one or more sensors that characterize a film deposited on the substrate. The received sensor data may include one or more mass data from mass sensors, capacitance data from capacitance sensors, or other measured data characterizing the film. The metric estimation model 2322 receives the measured data and outputs one or more values indicating a metric of the films corresponding to the received measured data. As previously indicated, the metric estimation model may reach a corresponding output conditions using a statistical model, a mechanistic model, and/or a machine learning model employed individually or in combination with each other.

In some embodiments, the metric estimation model 2322 outputs data or further process logic modifies the metric data to generate data including a metric profile. The metric profile may include an organized representation of metric values across a surface of the substrate. For example, the metric profile may indicate a series of thickness values organized along a spatial axis (e.g., perpendicular to an opening of a substrate monitoring assembly). The metric profile may include one or more aspects of thickness profiles as discussed in associated with FIGS. 15A-B. For example, the thickness profile may indicate a relative thickness trend and may not include actual thickness measurement but dimensionless representations of relative thickness (e.g., ratio of max thickness, a rate of change of the thickness, a difference of predicted thickness to a desired thickness (e.g., an error profile)).

In some embodiments, the metric estimation model 2322 may output a metric based on input metrology data or image data after a substrate process has been performed. However, in other embodiments, the metric estimation tool may output a live updating metric prediction while the substrate is being processed. For example, removal of a substrate from a process chamber may not be necessitated to determine a metric prediction of the film. As is discussed in other embodiments, the live thickness estimation may be used to make live updates to a process system such as, for example, to alter one or more process parameters of the processing chamber and/or processing procedure (e.g., using the output of metric estimation model 2322 as input to process parameter tuning logic 2328).

In some embodiments, the metric estimation model 2322 may be trained by performing a regression between one or more features of the image data and one or more features of the thickness profile. In some embodiments, a first set of the image data may be acquired at a first angle and a second set of the image data may be acquired at a second angle. The metric estimation model may further perform a multi-dimensional regression between the image data at an acquired at a first angle, corresponding image data acquired at a second angle, and actual thickness of the corresponding film on the substrate that corresponds to the image data.

In some embodiments, the thickness model creates a relation between color and thickness such as thickness being a function of a data representation of color (e.g., (Red value, Green value, Blue value)). The metric estimation model may assign a location to each data representation of color such as placing each color representation on a grid or coordinate plane (e.g., a Cartesian x-y value). Using the segmentation described herein, the metric estimation model may identify the corner of each coupon, estimate a camera angle and fit the profile region on an axis, and further convert the data representation of color to a thickness value using a relationship model (e.g., formulated using a regression technique).

As shown in FIG. 23, the deposition monitoring system 2300 may include a substrate segmentation model 2324. The substrate segmentation model 2324 receives image data and identifies various identifiable regions (e.g., groups of pixels) within an image frame. For example, the substrate segmentation model 2324 may determine a boundary of a substrate (e.g., a coupon or wafer), and/or identify different regions of the substrate. For example, the substrate segmentation model 2324 may annotate image data by for example, labeling bounding boxes around the substrate stored in the image data. Not all substrates may be the same size and the bounding boxes or more generally identified boundaries to the inferred regions may be leveraged by further processes (e.g., metric estimation model 2322). The substrate segmentation model 2324 may identify where coupons are located within an image frame and provide bounding boxes around them. The substrate segmentation tool or downstream processes may perform updates to image data such as providing bounding boxes, indicating annotations indicating one or more boundaries, cropping image data, filtering image data, and the like based on the determined segmentation data.

In some embodiments, the substrate segmentation model 2324 may segment image data based on received input data. The substrate segmentation model 2324 may identify different regions. For example, a first region may be representative of a location of a film deposited on the substrate, a second region may be representative of a location of a bare substrate without film deposited on the surface, and a third region may be representative between the first region and the second region. The third region may be defined by having a spatial variance about a threshold variance. For example, FIG. 20A-B illustrates the various regions discussed herein. The first region may be defined by having a spatial variance below a threshold value. The substrate segmentation tool 2224 may output data indicating the various regions and/or a boundary of the substrate.

In some embodiments, the substrate segmentation model 2324 may segment portions of a substrate and classify them according to more than the three regions above and along different classifications. For example, a nano-laminate may have two different diffusive species. Species A has less does, lower diffusion, etc. than the B species which results in more regions. For example, having two different diffusive species (e.g., species A and species B) may result in: an AB-continuous region, an AB transition (e.g., higher spatial variance), a pure B-region, a B-transition and bare substrate. A chemical changing process may exist. For example, film-A may uptake a chemical modifying agent (e.g., fluorine converting $Y_2O_3$ to YOxFy). The AC model may be similar to the AB or different if the C overtakes the B so that all areas are C-ated uniformly. However, there could be a concentration dependent gradient that makes the entire length to be transitionary (e.g., in YOxFy x:y could initially be 2, then 1, then 0.5 such as in a parabolic manner.) Higher orders of complexity could exist such as combining such as YAlOx, YMgAlOx, YHfAlOx or 3 or 4 metal alloys with an oxide, oxy-nitride, oxy-fluoride combinations as well as higher-order on the reactant side. Each process may produce corresponding sub-divisions of film transitions.

In some embodiments, the substrate segmentation model 2324 may operate in an unsupervised manner and use similarity algorithm such as clustering algorithm to choose (e.g., recommend) region that should be segmented.

In some embodiments, the substrate segmentation model 2324 may assign selections of pixels to a particular class segmentation class (e.g., substrate, film, background, calibration data, color filters, etc. For example, each pixel may be identified as bare substrate (e.g. bare Si), a transition between bare substrate and the film (e.g., a fast thickness gradient region), or the full film (e.g., slow thickness gradient region) and assigned a label to the corresponding region. The task of assigning each pixel may include a dense prediction and an output may include an image with classified pixels.

In some embodiments, the substrate segmentation model 2324 may be broken down into multiple parts (e.g., multiple models or multiple subparts to a single model). For example, the substrate segmentation tool may include two parts. A first part may include an encoder. The encoder may include a stack of convolutional and max pooling layers and performs feature extraction. The second part may include an upscaling part (e.g., a decoder). The second part may be used to implement precise localization using transposed convolutions. In some embodiments, the encoder may include a deep convolutional network such as a VGG-Net, a ResNet, a Mobile-Net, or the like. For example, the substrate segmentation tool may further include a Unet.

As shown in FIG. 23, the deposition monitoring system 2300 may include a process result model 2326. The process result model 2326 receives input data (e.g., raw sensor data, synthetic data, output of other models, etc.) to determine a process result prediction of a deposition of a film on a substrate disposed in a non-LOS position within a processing chamber. The process result prediction may include a thickness profile, a "creep" distance or distance from an opening of the recess in which the substrate is disposed, a rate of advancement of a deposition boundary of the film, spatial parameters of the films, and so on.

In some embodiments, the process result prediction model 2326 receives data from data preparation tool 2312 or substrate processing system 2302 indicating a state of a process chamber and/or a characterization of one or more process parameters for carrying out a process procedure. As previously discussed, the process tools and process controller may include sensors configured to generate and/or collect sensor data associated with substrate processing system 2302. Sensor data can include a value of one or more of temperature (e.g., heater temperature), spacing (SP), pressure, high frequency radio frequency (HFRF), voltage of electrostatic chuck (ESC), electrical current, flow, power, voltage, chemical dosage of deposition material, etc. Sensor data can be associated with or indicative of manufacturing parameters such as hardware parameters, such as settings or components (e.g., size, type, etc.) of the substrate processing system 2302, or process parameters of the process tools 2304. The sensor data can be provided while the substrate processing system 2302 is performing a substrate process. The sensor data can be different for each substrate.

In some embodiments, the process result prediction model 2326 receives sensor data from process tools 2304 and predicts a process result of a substrate disposed within the process chamber. The substrate may be disposed in a non-LOS position and receive deposition material from an opening in a slot or recess (e.g., within a substrate monitoring assembly, as describe herein). In some embodiments, process result prediction model 2326 receives raw sensor data from process tool 2304, in other embodiments, raw sensor data is combined with synthetic data engineered from data preparation tool 2312. The process result prediction model 2326 may process sensor data to determine a prediction of a process result under the one or more process conditions indicated by the sensor data. The process result prediction may include an indication of one or more thickness values of a film deposited on substrate positioned within a recess of the process chamber. The process result prediction may include an indication of a rate of advancement of a deposition boundary of the film. For example, as discussed in other embodiments, substrates disposed within a slot or recess with an opening on one side begin to accumulate deposition material proximate the opening and the film grows across the surface towards the closed side of the substrate. The process result prediction may indicate a "creep" distance, or a distance the film has advanced across the surface of the substrate during a substrate process.

As shown in FIG. 23, the deposition monitoring system 2300 includes process parameter tuning logic 2328. The process parameter tuning logic may receive as input any of image data 2306, process results data 2308, process parameter data 2310, outputs from any of data preparation tool 2312, light classifier model 2320, metric estimation model 2322, substrate segmentation model 2324, and process result model 2326. The process parameter tuning logic 2328 may determine an update to one or more process parameters or operations of process controllers 2332 (sometime referred to as a chamber control knob update). A chamber control knob update (e.g., an update to one or more process parameters associated with a processing chamber) may be correlated with a chemical dosage strength of a deposition material delivered to a corresponding region of a processing chamber. For example, the chamber control knob update may include instructions such as increase/decrease temperature, increase/decrease process time, open/close gas delivery valves, and the like. In some embodiments, the process parameter tuning logic 2328 receives sensor data and metrology data during or after performance of a processing procedure.

In some embodiments, the process parameter tuning logic may determine a process parameter update based on a process result data. The process result data may include a thickness profile, a rate of advancement of a deposition boundary across a surface of a substrate, a "creep" distance or distance a deposition material has advanced within a recess of an assembly housing the substrate. The process parameter tuning logic 2328 determines based on the process result data a process parameter update that may include altering a dosing strength of a deposition material, a chamber pressure, a flow rate of one or more gases (e.g., a precursor, a carrier gas, etc.), a temperature associated with a substrate processing system, roughness or surface area of substrate processing components, and/or radical or plasma parameter values.

As shown in FIG. 23, the process controllers 2332 receive instructions from process parameter tuning logic 2328 and manage change within substrate processing system 2302 to update and/or alter operations of the process tools 2304 and/or update process recipe instructions for a given substrate processing procedure. The following embodiments describe various example of process controller operations and updates to process parameters.

In some embodiments process controllers 2332 correspond to one or more controller elements associated with altering a dosing schedule (e.g., frequency, strength, duration, etc.). For example, the process controller 2332 may receive instructions to alter a fluence of the deposition material by updating a performance of one or more valves, dose feedback sensor, heating controls. In another example, the process controller 2332 may receive instructions from process update logic and detect a fault and/or error with one or more process tools 2304. For example, an ampoule source may become depleted, clogged, or chemically deactivated. In another example, there may be an identified system leak preventing the system from performing at a desired rate, resource efficiency, accuracy, or precision. In some embodiments, the process parameter tuning logic 2328 may provide instruction to alter an operational mode of the substrate process system 2302 (e.g., turn on or off).

In some embodiments, process controllers 2332 may correspond to one or more controlling components associated with altering a pressure within a process chamber. For example, the process controllers 2332 may receive instructions to alter a diffusivity of the deposition material by updating an operation of a gas line, control valve, pump, or other system components. In another example, the process controller 2332 may be provided instructions indicating a clog in the gas line, a malfunction of a pump (e.g., an abatement pump), etc.

In some embodiments, process controllers 2332 may correspond to one or more controlling components associated with altering a flow rate or temperature such as to affect a fluence and/or diffusivity of the deposition material. For example, process controllers 2332 may receive instructions to alter an operation of a mass flow controller, heating elements, sensor, and/or other controllers. In some embodiments, process controllers 2332 may correspond to one or more controller components associated with altering a roughness or surface area of a processing element of substrate processing system 2302 such as, for example, to alter a surface area consumption rate of one or more processing chemicals.

As shown in FIG. 23, one or more of the light classifier model 2320, the metric estimation model 2322, the substrate segmentation model 2324, the process result model 2326, and/or the process parameter tuning logic 2328 may provide output data for presentation on a graphical user interface (GUI) 2330. The light classifier model 2320 may output data representations of color on the GUI. For example, the GUI may display annotations indicating various color value, a data structure indication the data representations of color, updated image data depicting color filters (e.g., greyscale images, RGB filtered image data, color overlaid image data, etc.).

The metric estimation model 2322 may output one or more thickness values for display on the GUI 2330. The one or more thickness values may be displayed as a thickness profile or thickness map that indicates a thickness corresponding to one or more locations across a surface of a substrate. For example, the thickness profile may indicate visually a relative thickness, a gradient of the thickness, or other physically values indicative of films thickness deposited on the substrate. The substrate segmentation model 2324 may outputs segmentation to be display on GUI 2330. For example, the segmentation data may display the image data with a segmentation overlay that may include one or more bounding boxes indicating a location of an identified region within the image data. In some embodiments, the segmentation may include a colored overlay or location data indicating boundaries of the identified regions. For example, a first overlay may indicate a location or boundary of the substrate, a second overlay may indicate a boundary of the film of the substrate.

The process result model 2326 may provide process result data for display on the GUI 2330. The process result data may indicate a creep distance, a thickness of the film, a rate of advancement of a deposition boundary on the film, one or more spatial properties of the films (e.g., gradients, thickness, statistical parameters (e.g., mean, medium, mode, range, percentiles, max, etc.) of spatial characteristics of the film).

The process parameter tuning logic 2328 may provide notifications of process parameter updates to GUI 2330. The notification may be provided as instructions for a user to undertake a task such as, for example, alter this control knob (e.g., pressure valve, gas flow valve, etc.). Process parameter updates may be displayed on the GUI 2330 in the form of fault detection warning or notifications that one or more aspects of substrate processing system 2302 of malfunctions or a fault is present in the substrate processing system 2302.

Figure 24:
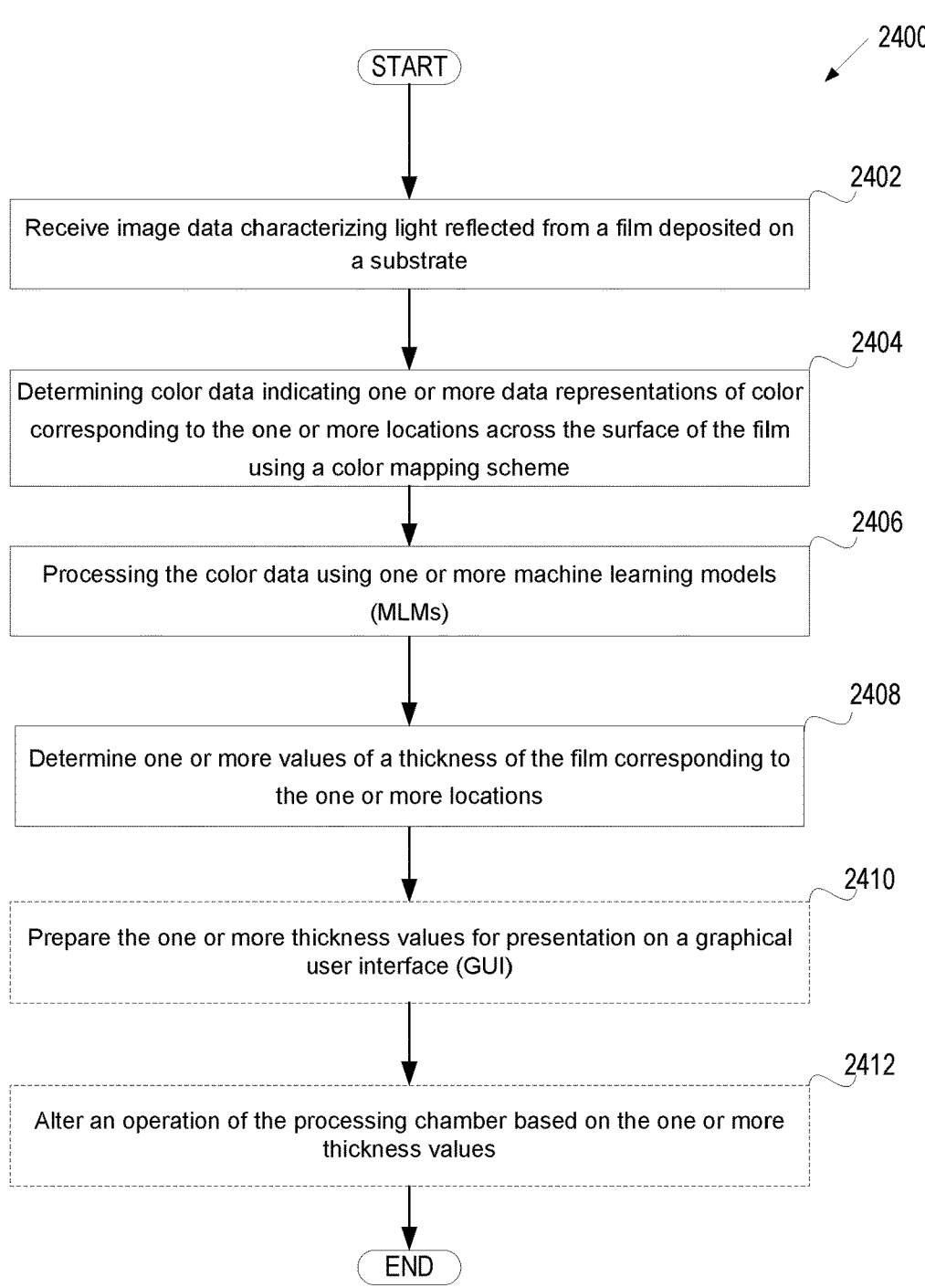
FIG. 24 depicts a flow diagram of one example method for monitoring deposition on a substrate, in accordance with some implementations of the present disclosure.
Figure 25:
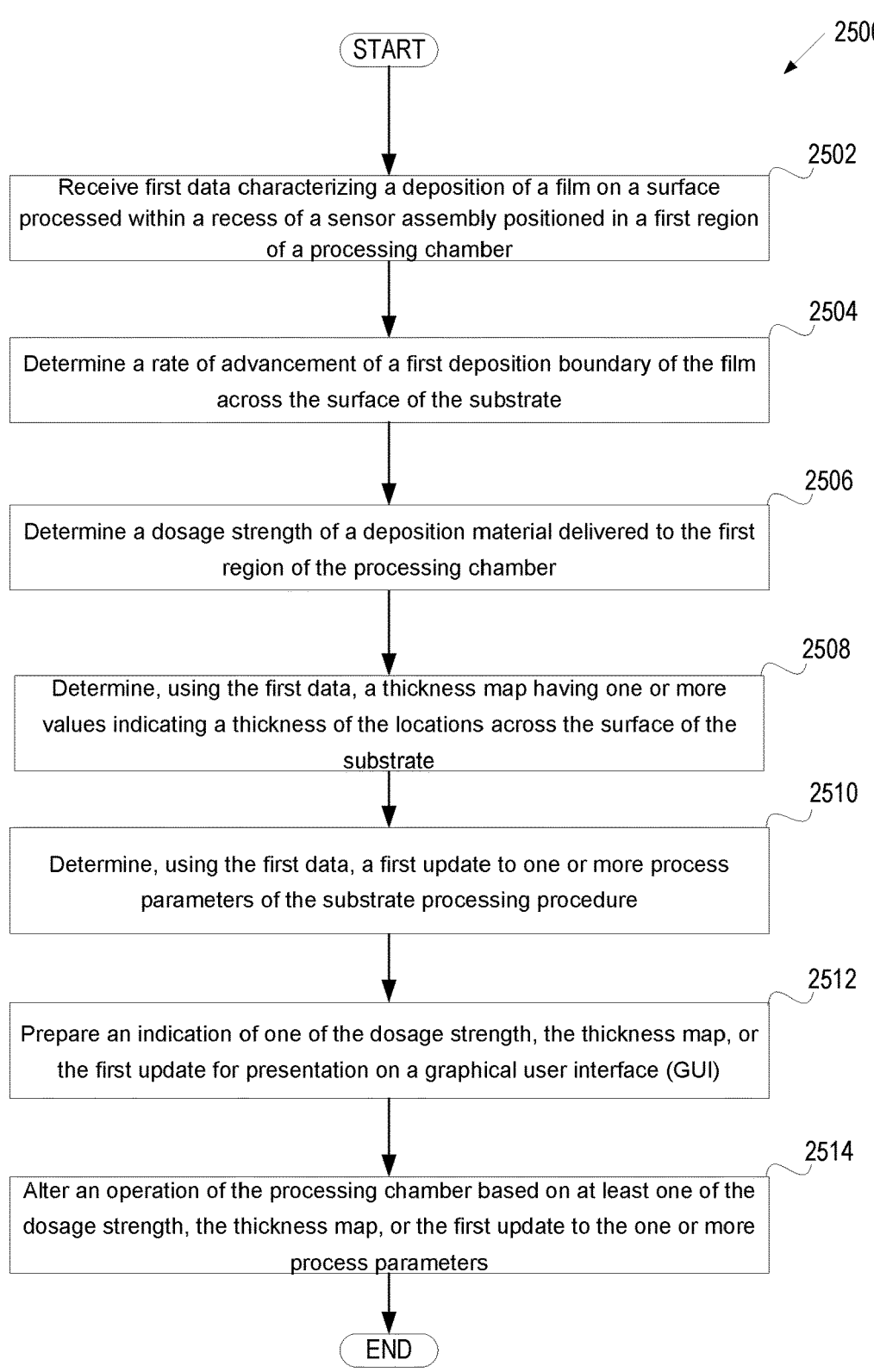
FIG. 25 depicts a flow diagram of one example method for monitoring deposition on a substrate, in accordance with some implementations of the present disclosure.

FIGS. 24-26 depict flow diagrams illustrating example methods 2400-2600 related to training and/or using machine learning models in association with image data, process result data, and/or process parameter data. For simplicity of explanation, methods 2400-2600 are depicted and described as a series of acts. However, acts in accordance with this disclosure can occur in various orders and/or concurrently and with other acts not presented and described herein. Furthermore, not all illustrated acts may be performed to implement the methods 2400-2600 in accordance with the disclosed subject matter. In addition, those skilled in the art will understand and appreciate that methods 2400-2600 could alternatively be represented as a series of interrelated states via a state diagram or events.

FIG. 24 depicts a flow diagram of one example method 2400 for monitoring deposition on a substrate, in accordance with some implementations of the present disclosure.

Method 2400 is performed by processing logic that may comprise hardware (e.g., circuitry, dedicated logic, etc.), software (such as is run on a general purpose computer system or a dedicated machine) or any combination thereof. In one implementation, the method is performed using server 2220 and the trained machine learning model 2290 of FIG. 22, while in some other implementations, one or more blocks of FIG. 24 may be performed by one or more other machines not depicted in the figures.

Method 2400 includes receiving image data and determining one or more thickness values of a film deposited on a substrate captured in the image data using one or more trained machine learning models (MLMs). The trained model may be configured to generate, based on the image data, one or more outputs indicating (i) a thickness profile (e.g., or more generally a metric profile, as described herein.), and (ii) a level of confidence that the thickness profile accurately represents the actual thickness of the film on the substrate associated with the image data.

At block 2402, processing logic receives image data characterizing light reflected from a film deposited on a substrate. The substrate may be disposed within a non-line-of-sight position (LOS) (e.g., not in direct view of a deposition source). For example, the substrate may be disposed within a substrate monitoring assembly as discussed throughout.

At block 2404, processing logic determines color data indicating one or more data representations of color corresponding to the one or more location across the surface of the film using a color mapping scheme. In some embodiments, processing logic generates filtered image data by applying one or more color filters to the image data. The color filters may correspond to one or more color mapping scheme such as an RGB and/or HSL color scheme. Processing log may map one or more selections of image data to one or more colors using the color mapping scheme and the filtered image data. In some embodiments, the data representations of color may be determined using a deterministic physics model, a pure statistical model, and/or a hybrid.

At block 2406, processing logic processes the color data using one or more machine learning models (MLMs). For example, processing logic may obtain one or more feature vectors using a first MLM of the one or more MLMs based on the image data. In some embodiments, the one or more of the MLMs include a support vector machine, a neural network, or a random forest model.

In some embodiments, the image data includes a first set of image frames captured at a first angle and a second set of image frames captured at a second angle. The one or more MLMs may be trained using multi-dimensional regression using multiple variables. For example, a first dimension may be associated with image frames captures at the first angle (or light reflected from a first angle) and a second dimension may be associated with image frames captured at the second angle (or light reflected from a second angle).

In some embodiments, processing logic assigns each of a selection of pixels of the image data to a classification corresponding to one or more segmented regions. Processing logic may further encode a region classification with a corresponding pixel of one of the selection of pixels. For example the one or more segmented region may include a first region indicating a bare substrate, a second region indicating a transition from the bare substrate to the film, and a third region indicating the film.

At block 2408, processing logic determines one or more values of a thickness of the film corresponding to the one or more locations. The processing logic further obtains a thickness profile representative of the one or more thickness values based on the image data. The thickness profile may indicate thickness values relative to a location across a surface of the substrate.

At block 2410, processing logic, optionally, prepares the one or more thickness values for presentation on a graphical user interface (GUI). At block 2412, processing logic, optionally, alters an operation of the processing chamber based on the one or more thickness values. Process logic may connect one or more values, combinations of values, patterns of values to one or more updates to process parameters. One or more operations of the processing may include adjusting control knobs resulting in changes to pressure, temperature, and dosage strength of deposition materials, process recipes parameters, and the like.

FIG. 25 depicts a flow diagram of one example method 2500 for monitoring deposition on a substrate, in accordance with some implementations of the present disclosure. Method 2500 is performed by processing logic that may comprise hardware (e.g., circuitry, dedicated logic, etc.), software (such as is run on a general purpose computer system or a dedicated machine) or any combination thereof. In one implementation, the method is performed using server 2220 and the trained machine learning model 2290 of FIG. 22, while in some other implementations, one or more blocks of FIG. 25 may be performed by one or more other machines not depicted in the figures.

Method 2500 may receive data characterizing a deposition of a film on a surface processed within a recess of a sensor assembly positioned in a first region of a processing chamber and determining an update to a process parameter of a substrate process system performing a substrate processing procedure.

At block 2502, processing logic receives first data characterizing deposition of a film on a surface processed within a recess of a sensor assembly positioned in a first region of a processing chamber. The first data may include image data, mass data, capacitance data, current data, and/or any data characterizing the film deposited on the substrate.

At block 2504, processing logic determines a rate of advancement of a first deposition boundary of the film across the surface of the substrate. The rate of advancement may indicate a rate at which the film is creeping across a surface of the substrate. The boundary may run substantially parallel to an area of an opening to the recess in which the substrate is disposed. For example, the boundary may begin close to the opening and moves across the surface of the substrate until the surface of the substrate is entirely covered by the film.

At block 2506, processing logic determines a dosage strength of a deposition material delivered to the first region of the processing chamber. The dosage strength, as described herein, indicates a fluence and rate of deposition material delivered to a define region. The dosage strength may indicate a fluence over time value related to a flow rate, density, pressure, temperature of the deposition material being delivered to the first region of the process chamber. In some embodiments, multiple assembly may be used and disposed at various regions of the processing chamber.

Dosage strength for the various regions may be individually determined based on input data corresponding to the regions.

At block 2508, processing logic determines, using the first data, a thickness map having one or more values indicating a thickness of the locations across the surface of the substrate. The thickness map may indicate a spatial reference and a thickness associated with the spatial reference. The thickness map may indicate a relative thickness such as a ratio of the thickness to the maximum thickness, a gradient of the thickness, and/or a different between the thickness and a predicted or desired film thickness.

At block 2510, processing logic determines, using the first data, a first update to one or more process parameters of the substrate processing procedure. The first update may indicate an update to an operation of one or more process controllers. For example, process controller may manage gas flow, temperature, pressure, precursor delivery, deposition material dosage and so and.

At block 2512, processing logic prepares an indication of one of the dosage strength, the thickness map, or the first update for presentation on a graphical user interface (GUI). In some embodiments, the dosage strength, the thickness map, and/or the first update may be presented by the GUI as a status message indicating whether an associated process, manufacturing equipment, or parameter condition is within a preset status window. In some embodiments, one or more values may be presented on the GUI. In some embodiments, one or more visual indicators may represent the dosage strength, the thickness map, and/or the first update such as using a color (e.g., green represents first range of values, yellow represents second range of value, and red represents third range of values, etc.)

At block 2514, process logic alters an operation of the processing chamber based on at least one of the dosage strength, the thickness map, or the first update to the one or more process parameters. As discussed further in other embodiments, substrate processing includes various control knobs responsible for various process parameters function such as, for example, maintaining a temperature, pressure, RF power, gas flow, etc. . . . . The various process parameters may be directly linked to a chemical dosage strength delivered to various regions of a processing chamber. Altering the one or more process parameters may affect a process result. Processing logic may cause one or more process parameters to be altered by altering one or more operations of one or more process controllers.

FIG. 26 depicts a flow diagram of one example method 2600 for monitoring deposition on a substrate, in accordance with some implementations of the present disclosure. Method 2600 is performed by processing logic that may comprise hardware (e.g., circuitry, dedicated logic, etc.), software (such as is run on a general purpose computer system or a dedicated machine) or any combination thereof. In one implementation, the method is performed using server 2220 and the trained machine learning model 2290 of FIG. 22, while in some other implementations, one or more blocks of FIG. 26 may be performed by one or more other machines not depicted in the figures.

At block 2602, processing logic receives first data characterizing one or more process conditions of a processing chamber associated with performing a substrate processing procedure. The first data may indicate a state of the processing chamber including one or more measured parameters such as temperature, pressure, RF power, vacuum conditions, gas flow, etc.)

At block 2604, processing logic uses the first data as input to a machine learning model. At block 2606, processing logic receives one or more outputs from the machine learning model including a process result prediction characterizing a deposition of a film on a surface of a substrate processed within a recess of a sensor assembly disposed within the processing chamber.

The process result prediction may include an indication of one or more thickness values of a film deposited on substrate positioned within a recess of the process chamber. The process result prediction may include an indication of a rate of advancement of a deposition boundary of the film. For example, as discussed in other embodiments, substrates disposed within a slot or recess within an opening on one side begin to accumulate deposition material proximate the opening and the film grows across the surface towards the closed side of the substrate. The process result prediction may indicate a "creep" distance, or a distance the film has advanced across the surface of the substrate during a substrate process.

At block 2608, processing logic prepares an indication of the process result prediction for presentation on a graphical user interface. In some embodiments, process result prediction may be presented by the GUI as a status message indicating whether an associated process, manufacturing equipment, or parameter condition is within a preset status window. In some embodiments, one or more values may be presented on the GUI. In some embodiments, one or more visual indicators may represent the process result such as using a color (e.g., green represents first range of values, yellow represents second range of value, and red represents third range of values, etc.)

At block 2610, processing logic alters an operation of the processing chamber based on the process result prediction. As discussed further in other embodiments, substrate processing include various control knobs responsible for various process parameters function such as, for example, maintaining a temperature, pressure, RF power, gas flow, etc. . . . . The various process parameters may be directly linked to the process result prediction. For example, altering the one or more process controllers may affect a process result. Processing logic may cause one or more process parameters to be altered by altering one or more operations of one or more process controllers.

Figure 27:
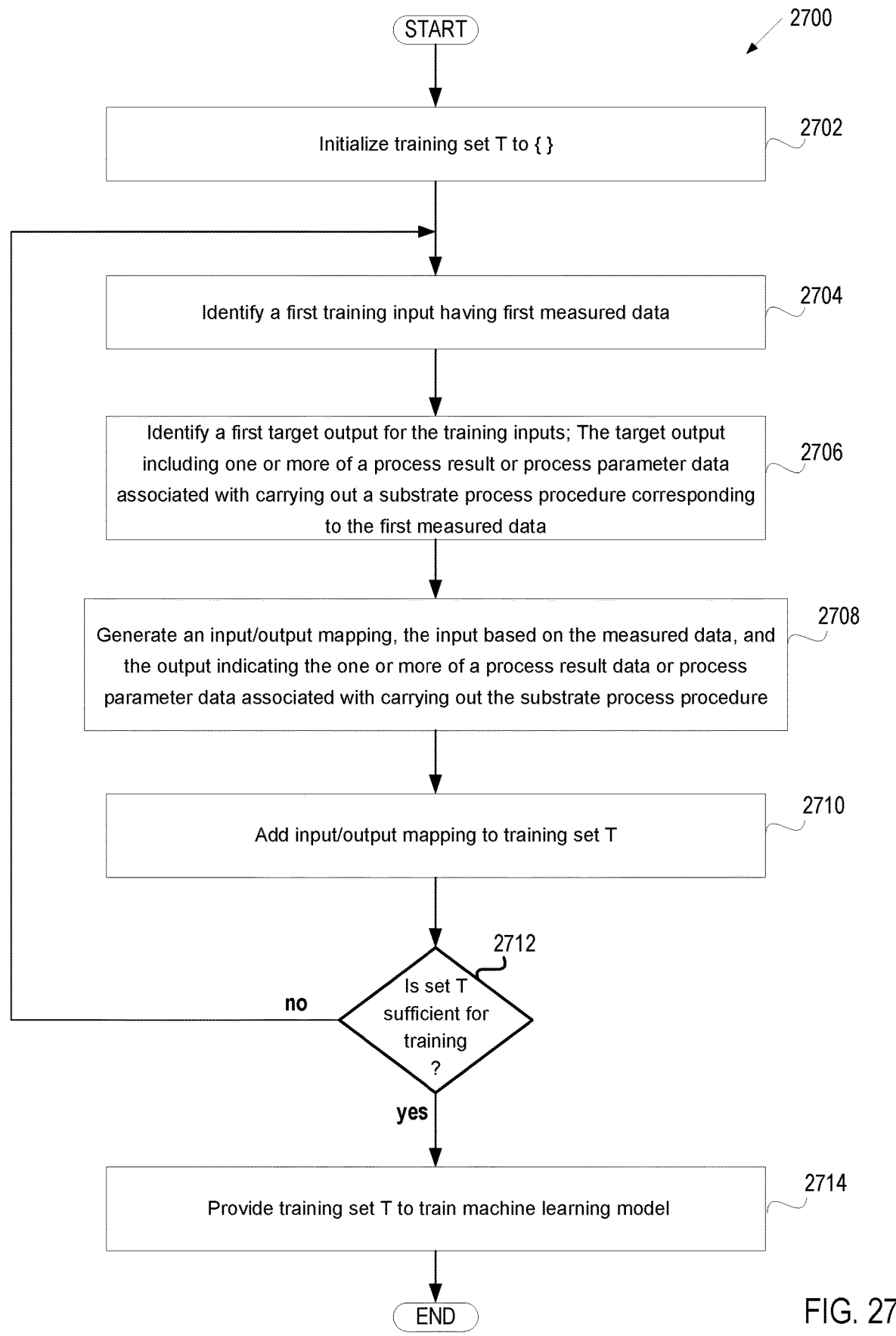
FIG. 27 is an exemplary illustration of a training phase of a machine learning system, in accordance with some implementation of the present disclosure.

FIG. 27 is an exemplary illustration of a training phase of a machine learning system, in accordance with some implementation of the present disclosure. Machine learning system 2270 may use method 2700 to at least one of train, validate, or test a machine learning model, in accordance with embodiments of the disclosure. In some embodiments, one or more operations of method 2700 may be performed by data set generator 2274 of server machine 2272, as described with respect to FIG. 22. It may be noted that components described with respect to FIG. 1 may be used to illustrate aspects of FIG. 6.

At block 2702, processing logic initializes a training set. At block 2704, processing logic identifies a first data input (e.g. first training input, first validating input) that includes a first process parameter data, process result data, and/or image data (as described with respect to FIGS. 22-23). The first data input may include data indicative of a state of an environment of a processing chamber (e.g., training the process parameter tuning model and/or process result model 2326), image data (training the light classifier model, the metric estimation model, and/or the substrate segmentation model). In some embodiments, the first data input may comprise any chamber environmental parameters (e.g., temperature, pressure, vacuum conditions, plasma conditions, spectroscopy conditions, etc.). The first target input may be identified from the old process parameter data 2244, process result data 2246, and/or old image data 2248 of the historical data 2242 (e.g., stored in the data store 2240).

At block 2706, processing logic identifies a first target output for one or more of the data inputs (e.g., first data input). The first target output may indicate a process result value such as a thickness (e.g., corresponding to the metric estimation model 2322). In some embodiments, the first target output may include a data representation of one or more color of one or more image frame of film deposited on a substrate encapsulated in image data (e.g., corresponding to the light classifier model 2320). In some embodiments, the target output indicates one or more substrate process results (e.g., thickness of a substrate, creep distance of a film deposited on a substrate, rate of advancement of a deposition boundary across a surface of the substrate) (e.g., corresponding to the process result prediction model 2326). In some embodiments, the target output may include an update to one or more process parameters of a substrate processing system (e.g., corresponding to the processing parameter tuning logic 2328). The first target input and/or target output may be identified from the process parameter data 2244, process result data 2246, and/or image data 2248.

At block 2708, processing logic optionally generates mapping data that is indicative of an input/output mapping. The input/output mapping (or mapping data) may refer to the data input (e.g., one or more of the data inputs described herein), the target output for the data input (e.g., one or more of the data inputs described herein), the target output for the data (e.g. where the target output identifies an associated chamber status), and an association between the data input(s) and the target output.

At block 2710, processing logic adds the mapping data generated at block 2704 to data set T.

At block 2712, processing logic branches based on whether the data set T is sufficient for at least one of training, validating, or testing machine learning model 190. If so ("yes" branch), execution proceeds to block 614, otherwise ("no" branch), execution continues back at block 604. It should be noted that in some embodiments, the sufficiency of data set T may be determined based simply on the number of input/output mappings in the data set, while in some other embodiments, the sufficiency of data set T may be determined based on one or more other criteria (e.g., a measure of diversity of the data examples, accuracy, etc.) in addition to, or instead of, the number of input/output mappings.

At block 2710, processing logic provides data set T to train, validate, or test machine learning model 2290. In some embodiments, data set T is a training set and is provided to training engine 2282 of server machine 2280 to perform the training. In some embodiments, data set T is a validation set and is provided to validation engine 2284 of server machine 2280 to perform the validating. In some embodiments, data set T is a testing set and is provided to testing engine 2286 of server machine 2280 to perform the testing. In the case of a neural network, for example, input values of a given input/output mapping (e.g., numerical values associated with data inputs) are input to the neural network, and output values (e.g., numerical values associated with target outputs) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 2714, machine learning model (e.g., machine learning model 2290) can be at least one of trained using training engine 2282 of server machine 2280, validated using validating engine 2284 of server machine 2282, or tested using testing engine 2286 of server machine 2280. The trained machine learning model may be implemented by prediction component 2294 (of server machine 2292) to identify associated outputs for a given model (e.g., light classifier model 2320, metric estimation model 2322, substrate segmentation model 2324, process result model 2326, and/or process parameter tuning logic 2328).

In some embodiments, a training dataset that was generated is used to train a machine learning model and/or a physical model. The model may be trained to receive new input data (e.g., image data). The model may output a (e.g., color classified image data, thickness estimation data, segmented image data, etc.) based on received image data. In some embodiments, the model may be agnostic to individual processing chamber, preventative maintenance performed, and/or process recipes used in the production mode. Accordingly, the model may be generated based on training data items generated based on films deposited on processed substrates positioned in non-LOS location within a processing chamber (e.g., recesses, slots, location opening in a non-parallel or anti-parallel direction to a flow direction of the deposition materials, etc.).

In one embodiment, the trained machine learning model is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, partial least square regression, percentage regression, leas absolute deviations, nonparametric regression, scenario optimization and/or distance metric learning may be performed to train the regression model. In one embodiment, the trained machine learning model, includes a support vector machine or other type of machine learning model.

In one embodiment, the trained machine learning model employs ensemble modeling. Ensemble modeling may include training multiple models (e.g., two or more related but different analytical models) and synthesizing the results of each of the model into a single score or spread (e.g., improving accuracy and reducing from any one machine learning model). For example, the trained machine learning model may include a bootstrap aggregation ("bagging") model. Bagging may include an aggregation phase and a bootstrapping phase for each individual model. Bootstrapping includes sampling or creating a dataset (e.g., using method 600A-B), where each sample (e.g., sensor data associated with performing a seasoning procedure on a processing chamber) is selected and replaced (e.g., at random) within a broader sample set. For each, as previously indicated, multiple models may be generated based on different subsets of the broader total set of training data (e.g., historical data 2242). The multiple models may output results that are synthesized (e.g., aggregated) to form an overall score (e.g., overall confidence level) associated with an identified output of the ensemble of models (e.g., a predicted chamber status). In another example, the machine learning model may include a random forest model. The machine learning model leverages multiple decision trees or types of analytical models designed to predict outputs based on different variables and rules. The random forest model may blend decisions trees that analyze different sample data, evaluate different factors, or weight common variables by different amounts. The results of the various decision trees may be converted into a synthesized result (e.g., a simple average or aggregated through further weighting) to predict a status of a chamber based on inputted sensor data.

In one embodiment, the trained machine learning model is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g., classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

The trained machine learning model may be periodically or continuously retrained to achieve continuous learning and improvement of the trained machine learning model. The model may generate an output based on an input, an action may be performed based on the output, and a result of the action may be measured. In some instances, the result of the action is measured within seconds or minutes, and in some instances, it takes longer to measure the result of the action. For example, one or more additional processes may be performed before a result of the action can be measured. The action and the result of the action may indicate whether the output was a correct output and/or a difference between what the output should have been and what the output was. Accordingly, the action and the result of the action may be used to determine a target output that can be used as a label for the sensor measurements. Once the result of the action is determined, the input, the output of the trained machine learning model, and the target result, and actual measured result may be used to generate a new training data item. The new training data item may then be used to further train the trained machine learning model. This retraining process may be performed on-tool on the manufacturing system (e.g., processing chamber(s)) in some embodiments.

Figure 28A:
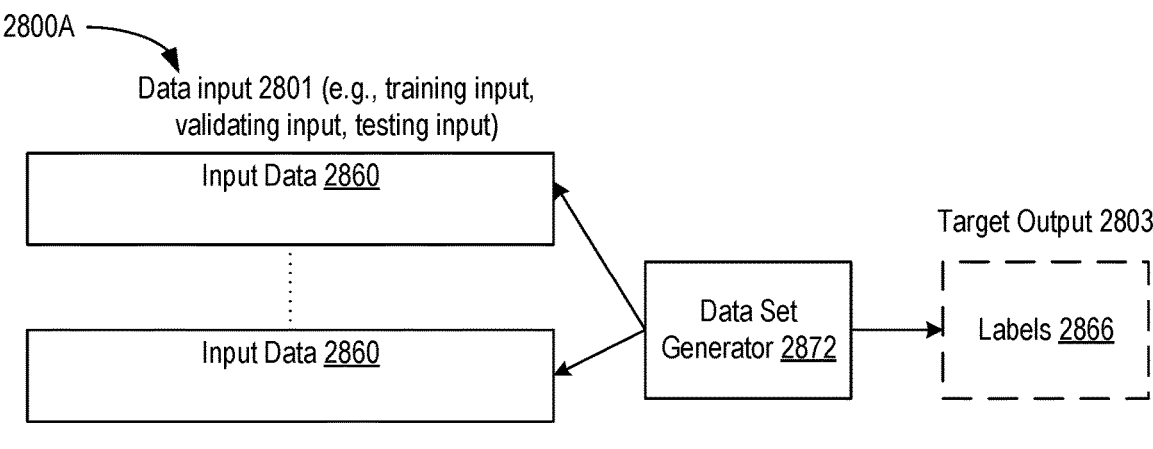
FIG. 28A is an example data set generator to create data sets for a machine learning model using training data, according to certain embodiments.

FIG. 28A is an example data set generator 2872 (e.g., data set generator 2274 of FIG. 2) to create data sets for a machine learning model (e.g., one or more of the MLMs described herein) using input data 2860 (e.g., processing parameter data 2244, process result data 2246, image data 2248, and the like), according to certain embodiments. System 2800A of FIG. 28A shows data set generator 2872, data inputs 2801, and target output 2803.

In some embodiments, data set generator 2872 generates a data set (e.g., training set, validating set, testing set) that includes one or more data inputs 2801 (e.g., training input, validating input, testing input). In some embodiments, the data set further includes one or more target outputs 2803 that correspond to the data inputs 2801. The data set may also include mapping data that maps the data inputs 2801 to the labels 2866 of a target output 2803. Data inputs 2801 may also be referred to as "features," "attributes," or "information." In some embodiments, data set generator 2872 may provide the data set to the training engine 2282, validating engine 2284, and/or testing engine 2286, where the data set is used to train, validate, and/or test a machine learning model.

In some embodiments, data set generator 2872 generates the data input 2801 based on input data 2860. In some embodiments, the data set generator 2872 generates the labels 2866 (e.g., process result data, process parameter updates, dosage data, color classifications, image segmentation data, etc.) associated with the input data 2860. In some instances, labels 2866 may be manually added to images by users. In other instances, labels 2866 may be automatically added to images (e.g., using a labeling database).

In some embodiments, data inputs 2801 may include one or more images (e.g., a series of image frames) for the input data 2860. One or more frames of the image data 2860 may include one or more substrate and one or more reference objects (e.g., color palettes, known colors panels, location reference objects, etc.).

In some embodiments, data set generator 2872 may generate a first data input corresponding to a first set of features to train, validate, or test a first machine learning model and the data set generator 2872 may generate a second data input corresponding to a second set of features to train, validate, or test a second machine learning model.

In some embodiments, the data set generator 2872 may discretize one or more of the data inputs 2801 or the target outputs 2803 (e.g., to use in classification algorithms for regression problems). Discretization of the data input 2801 or target output 2803 may transform a continuous series of image frames into discrete frames with identifiable features (e.g., feature vectors). In some embodiments, the discrete values for the data input may indicate regions of a substrate (e.g., a boundary between a film and a substrate, a bare substrate region, a uniform film thickness region).

Data inputs 2801 and target outputs 2803 that are being used to train, validate, or test a machine learning model may include information for a driving environment. For example, the image data 560 and labels 566 may be used to train a system for a particular driving environment (e.g., local driving laws, unique local object detection, and the like).

In some embodiments, the information used to train the machine learning model may be from specific types of substrate process procedure having specific characteristics and allow the trained machine learning model to determine outcomes for a specific range of process results and processing conditions based on input for input data 2860 associated with one or more components sharing characteristics of the specific group.

In some embodiments, subsequent to generating a data set and training, validating, or testing machine learning model(s) using the data set, the machine learning model(s) may be further trained, validated, or tested (e.g., with further image data and labels) or adjusted (e.g., adjusting weights associated with input data of the machine learning model 2290, such as connection weights in a neural network).

Figure 28B:
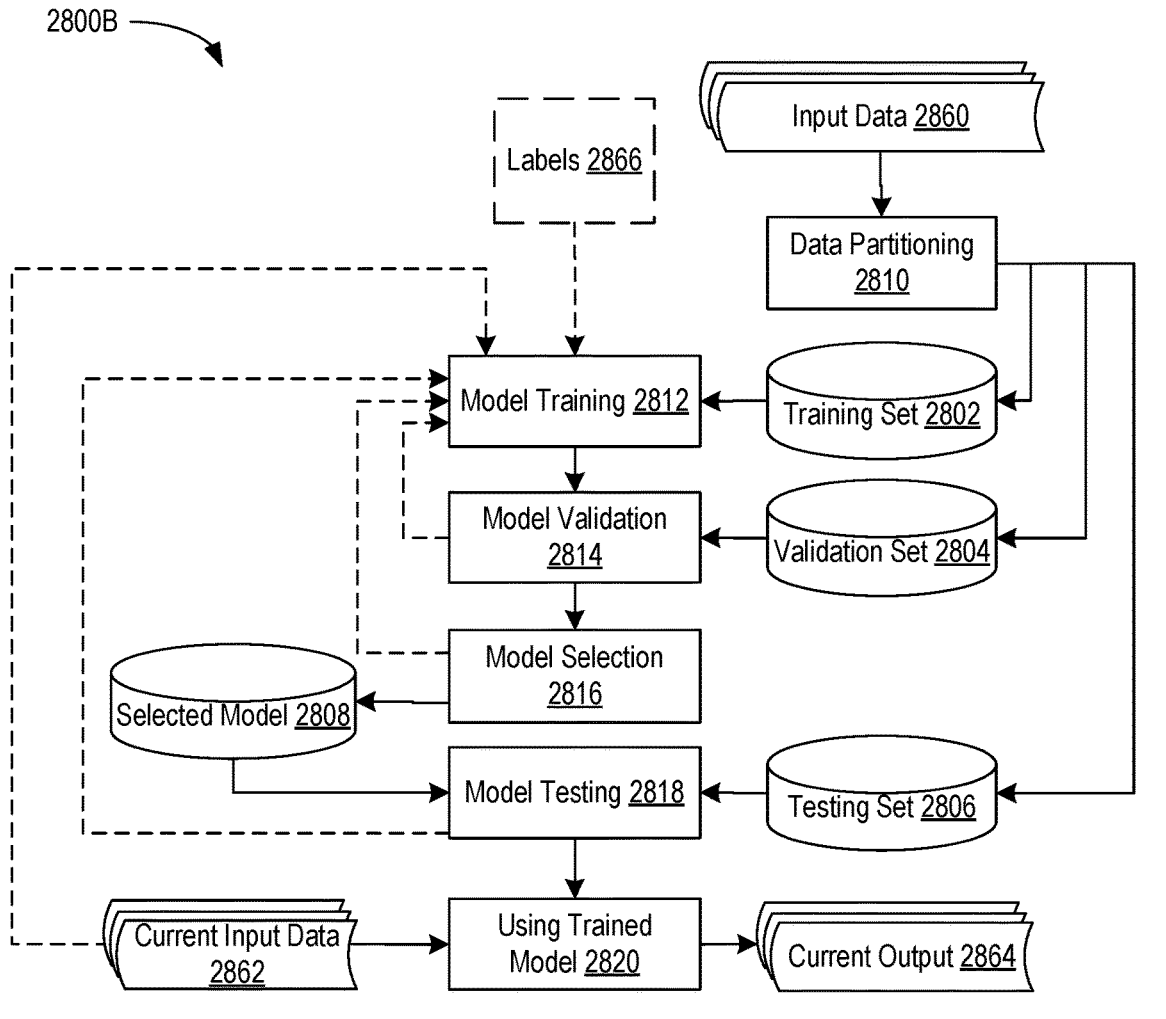
FIG. 28B is a block diagram illustrating a system for training a machine learning model to generate outputs, according to certain embodiments.

FIG. 28B is a block diagram illustrating a system 2800B for training a machine learning model to generate outputs 2864 (e.g., updates to process parameters, process result prediction, color classification, image segmentations data, encoded feature data), according to certain embodiments. The system 2800B may be used to train one or more machine learning models to determine outputs associated with input data (e.g., images acquired using cameras 2218).

At block 2810, the system 2800B performs data partitioning (e.g., via data set generator 2872) of the input data 2860 (e.g., series of image frame, image frames of the same substrate at different angles, process parameters data associated with processing a substrate corresponding to the image data, process result data, and in some embodiments labels 2866) to generate the training set 2802, validation set 2804, and testing set 2806. For example, the training set 2802 may be 60% of the input data 2860, the validation set 2804 may be 20% of the image data 2860, and the testing set 2806 may be 20% of the image data 2860. The system 2800B may generate a plurality of sets of features for each of the training set 2802, the validation set 2804, and the testing set 2806.

At block 2812, the system 2800B performs model training using the training set 2802. The system 2800B may train one or multiple machine learning models using multiple sets of training data items (e.g., each including sets of features) of the training set 2802 (e.g., a first set of features of the training set 2802, a second set of features of the training set 2802, etc.). For example, system 2800B may train a machine learning model to generate one or more of: a first trained machine learning model (e.g., light classifier model 2320) using the first set of features in the training set (e.g., images characterizing light reflected from a surface of a film deposited on a substrate); a second trained machine learning model (e.g. metric estimation model 2322) using the second set of features in the training set (e.g., color classified image data); a third trained machine learning model (e.g., substrate segmentation model 2324) using a third set of features in the training set (e.g., image data capturing a substrate and a film deposited on a surface of the substrate); a fourth trained machine learning model (e.g., process result model 2326) using a fourth set of features of the training set (e.g., process parameter conditions and resulting process results); and a fifth trained machine learning model (e.g., process parameter tuning logic 2328) using a fifth set of features of the training set (e.g., images, process parameters, and corresponding process results). The machine learning model(s) may be trained to output one or more other types of predictions, classifications, decisions, and so on. For example, the machine learning model(s) may be trained to classify colors of light reflected from a deposition of film, estimate a thickness of a film deposited on a substrate, and predict process result, among others.

Processing logic determines if a stopping criterion is met. If a stopping criterion has not been met, the training process repeats with additional training data items, and another training data item is input into the machine learning model. If a stopping criterion is met, training of the machine learning model is complete.

In some embodiments, one or more of the above described machine learning models (e.g., the first trained machine learning model, the second trained machine learning model, the third trained machine learning model, the fourth trained machine learning model, and the fifth trained machine learning model) may be combined to generate a combined trained machine learning model (e.g., which may be a better predictor than the first, second, third, fourth or fifth trained machine learning model on its own). In some embodiments, sets of features used in comparing models may overlap.

At block 2814, the system 2800B performs model validation (e.g., via validation engine 2284 of FIG. 22) using the validation set 2804. The system 2800B may validate each of the trained models using a corresponding set of features of the validation set 2804. For example, system 2800B may validate the first trained machine learning model using the first set of features in the validation set (e.g., feature vectors forming a first embedding network), the second trained machine learning model using the second set of features in the validation set (e.g., feature vectors forming a second embedding network), and so on.

At block 2814, the system 2800B may determine an accuracy of each of the one or more trained models (e.g., via model validation) and may determine whether one or more of the trained models has an accuracy that meets a threshold accuracy. Responsive to determining that one or more of the trained models has an accuracy that meets a threshold accuracy, flow continues to block 2816. In some embodiments, model training at block 2812 may occur on a processing chamber and/or process tool. For example, training of the one or more machine learning models may occur while substrate processing and/or evaluation are occurring.

At block 2818, the system 2800B performs model testing using the testing set 2806 to test the selected model 2808. The system 2800B may test, using the first set of features in the testing set (e.g., feature vectors from a first embedding network), the first trained machine learning model to determine the first trained machine learning model meets a threshold accuracy (e.g., based on the first set of features of the testing set 2806). Responsive to accuracy of the selected model 2808 not meeting the threshold accuracy (e.g., the selected model 2808 is overly fit to the training set 2802 and/or validation set 2804 and is not applicable to other data sets such as the testing set 2806), flow continues to block 2812 where the system 2800B performs model training (e.g., retraining) using further training data items. Responsive to determining that the selected model 2808 has an accuracy that meets a threshold accuracy based on the testing set 2806, flow continues to block 2820. In at least block 2812, the model may learn patterns in the image data 2860 to make predictions and in block 2818, the system 2800 may apply the model on the remaining data (e.g., testing set 2806) to test the predictions.

At block 2820, system 2800B uses the trained model (e.g., selected model 2808) to receive current data (e.g., current image data) and receives a current output 2864 based on processing of the current input data 2862 by the trained model(s) 2808.

In some embodiments, outputs 2864 corresponding to the current input data 2862 are received and the model 2808 is re-trained based on the current data 2862 and the outputs 2864.

In some embodiments, one or more operations of the blocks 2810-2820 may occur in various orders and/or with other operations not presented and described herein. In some embodiments, one or more operations of blocks 2810-2820 may not be performed. For example, in some embodiments, one or more of data partitioning of block 2810, model validation of block 2814, model selection of block 2816, or model testing of block 2818 may not be performed.

Figure 29:
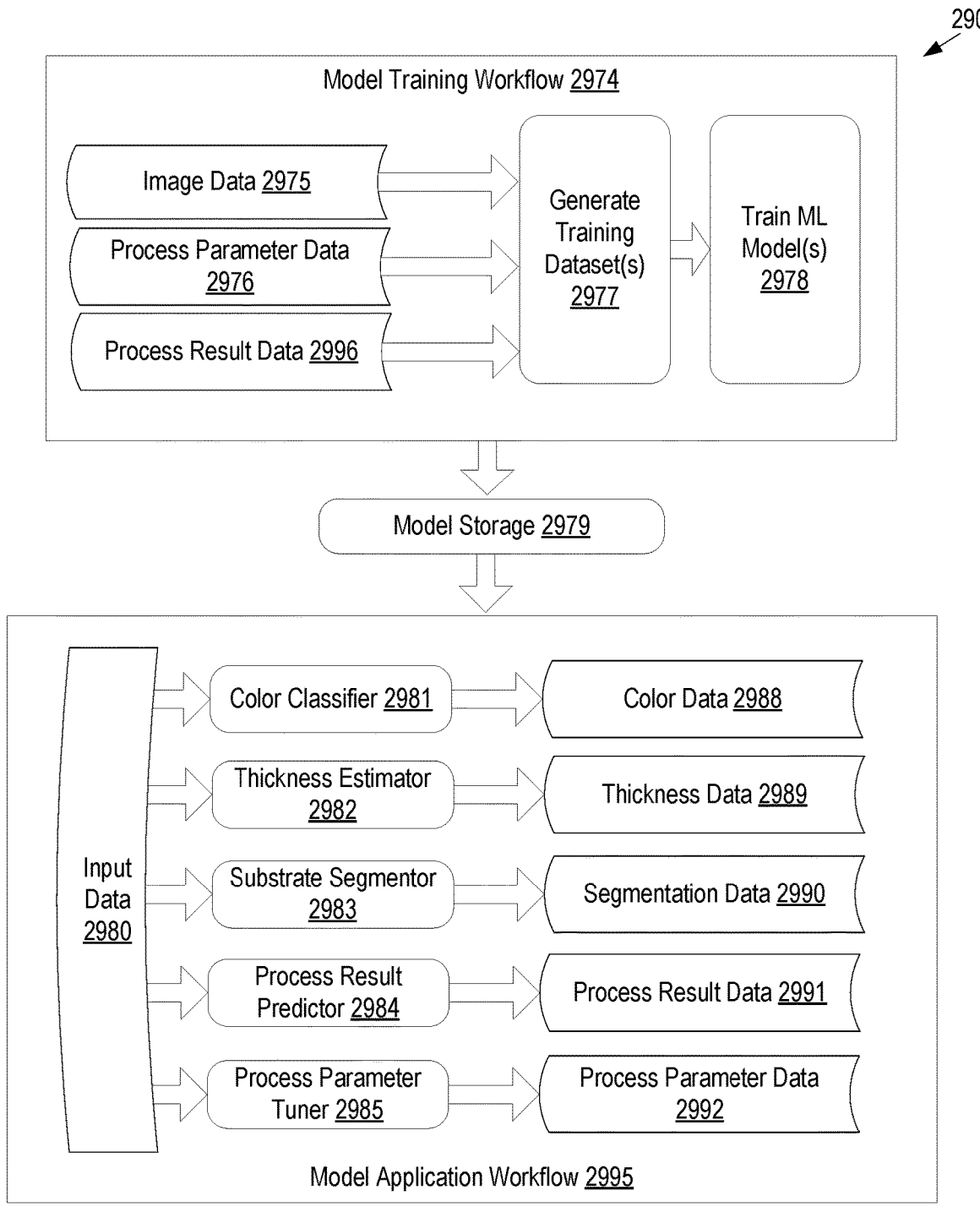
FIG. 29 illustrates a model training workflow and a model application workflow for monitoring deposition on a substrate, according to aspects of the present disclosure.

FIG. 29 illustrates a model training workflow 2905 and a model application workflow 2917 for monitoring deposition on a substrate, according to aspects of the present disclosure. In embodiments, the model training workflow 2905 may be performed at a server which may or may not include a substrate deposition monitoring application, and the trained models are provided to a substrate deposition monitoring application, which may perform the model application workflow 2917. The model training workflow 2905 and the model application workflow 2917 may be performed by processing logic executed by a processor of a computing device (e.g., server 2220 of FIG. 22). One or more of these workflows 2905, 2917 may be implemented, for example, by one or more machine learning modules on implemented processing device and/or other software and/or firmware executing on a processing device.

The model training workflow 2905 is to train one or more machine learning models (e.g., deep learning models) to perform one or more determining, predicting, modifying, etc. tasks associated with an image color classification, film thickness estimation, substrate image segmentation, process result prediction, and/or process parameter tuning. The model application workflow 2917 is to apply the one or more trained machine learning models to perform the determining and/or tuning, etc.

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In embodiments, one or more machine learning models are trained to perform one or more of the below tasks. Each task may be performed by a separate machine learning model. Alternatively, a single machine learning model may perform each of the tasks or a subset of the tasks. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. The tasks that the one or more trained machine learning models may be trained to perform are as follows:

a. Light classifier— The light classifier receives data (e.g., image data captured with a camera) characterizing light reflected from a surface of a film deposited on a substrate. The light classifier classifies one or more colors corresponding to one or more regions (e.g., pixels) of an image frame of the received data. The light classifier outputs one or more data representations of color (e.g., a matrix, a color map, etc.) corresponding to the received image data. For example, a matrix may include RGB color value for various regions of a substrate (e.g., a test coupon). RGB color map could be in different ranges (0.0-1.0, or 0-255) and converted to a few other color maps such as HSL, L\*A\*B\*, or L\*U\*V\*. The light classifier may output data associated with diffusion, brightness, darkening, polarization, and/or other parameters of the processed light.

b. Metric estimator—The metric estimator receives input data and determines one or more metric values of a film deposited on a substrate. The metric values may include growth per cycle (GPC) (e.g., associated it a substrate processing procedure), composition of the film, index of refraction of the film, and the like. The input data may include color data such as the data representations generated by the light classifier, as previously described. The metric estimator may generate a metric profile or metric mapping that maps an estimated metric with a corresponding location across a surface of a substrate. The metric profile may visually indicate relative metric across the surface of the substrate (e.g., along an axis)

c. Substrate image segmentor—The substrate segmentor receives image data and identifies various identifiable regions of pixels within the frame. For example, the substrate segmentor may determine a boundary of a substrate (e.g., a coupon or wafer). The substrate segmentor may identify different regions of the substrate. For example, the substrate segmentation tool may annotate image data by for example, labeling bounding boxes around the substrate stored in the image data. In another example, a first region may be representative of a location of a film deposited on the substrate, a second region may be representative of a location of a bare substrate without film deposited on the surface, and a third region may be representative of a transition zone between the first region and the second region.

d. Process result predictor—The process result predictor may receive sensor data from process tools and predict a process result of a substrate disposed within the process chamber). The substrate may be disposed in a non LOS position and receive deposition material from an opening in a slot or recess (e.g., within a substrate monitoring assembly, as describe herein). The process result predictor may process sensor data to determine a prediction of a process result under the one or more process conditions indicated by the sensor data. The process result prediction may include an indication of one or more thickness values of a film deposited on substrate positioned within a recess of the process chamber. The process result prediction may include an indication of a rate of advancement of a deposition boundary of the film. For example, as discussed in other embodiments, substrates disposed within a slot or recess with an opening on one side begin to accumulate deposition material proximate the opening and the film grows across the surface towards the closed side of the substrate. The process result prediction may indicate a "creep" distance, or a distance the film has advanced across the surface of the substrate during a substrate process.

e. Process parameter tuner—The process parameter tuner may receive outputs from any of the color classifier, the thickness estimator, the substrate segmentor, and process result predictor. The process parameter tuner may determine an update to one or more process parameters or operations of process controllers (sometime referred to as a chamber control knob update). A chamber control knob update (e.g., an update to one or more process parameters associated with a processing chamber) may be correlated with a chemical dosage strength of a deposition material delivered to a corresponding region of a processing chamber. For example, the chamber control knob update may include instructions such as increase/decrease temperature, increase/decrease process time, open/close gas delivery valves, and the like.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future input data (e.g., image data, sensor measurements, process result data, process parameter data, etc.) and make predictions based on this reception of information. RNNs may be trained using a training dataset to generate a fixed number of outputs (e.g., to determine a set of substrate processing rates, determine chamber conditions, and production mode requirements and conditions thresholds). One type of RNN that may be used is a long short term memory (LSTM) neural network.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

For the model training workflow 2905, a training dataset containing hundreds, thousands, tens of thousands, hundreds of thousands or more image data 2975 (e.g., image data characterizing light reflected from a surface of a film deposited on substrate) should be used to form a training dataset. In embodiments, the training dataset may also include an associated color classification data (e.g., classifications of the various colors corresponding to the image data) for forming a training dataset, where each data point may include various labels or classifications of one or more types of useful information.

To effectuate training, processing logic inputs the training dataset(s) 2936 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction may include color data 2988 (e.g., one or more data representations of color), thickness data 2989 (e.g., a film thickness prediction/estimation), segmentation data 2990 (e.g., modified image data such as annotated, overlaid, cropped, etc.), process result data (e.g., predictions of a process result of a deposition of film on a substrate), and/or process parameter data (e.g., process parameter updates for a substrate processing system) Processing logic may cause performance of one or more procedures associated with processing a substrate with updated process parameters settings. Processing logic determines an error (e.g., a classification error or prediction error) based on the difference between a predicted output value and a measured output (e.g., a predicted thickness value compared to a measured process result thickness) identified chamber status or recovery prediction and the evaluated process result (e.g., sample test result). Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

Once one or more trained machine learning models 2938 are generated, they may be stored in model storage 2945, and may be added to a substrate process rate determination and/or process tuning application. Substrate process rate determination and/or process tuning application may then use the one or more trained ML models 2938 as well as additional processing logic to implement an automatic mode, in which user manual input of information is minimized or even eliminated in some instances.

For model application workflow 2917, according to one embodiment, input data 2980 may be input into color classifier 2981, which may include a trained machine learning model. Based on the input data 2980, color classifier outputs color data 2988 indicating one or more data representations of color.

According to one embodiment, input data 2980 may be input into thickness estimator 2982, which may include a trained machine learning model. Based on the input data 2980, thickness estimator 2982 outputs thickness data 2989 indicating a film thickness prediction/estimation (e.g., a thickness profile).

According to one embodiment, input data 2980 may be input into substrate segmentor 2983, which may include a trained machine learning model. Based on the input data 2980, substrate segmentor outputs segmentation data 2988 indicating modified image data such as annotated, overlaid, cropped, etc.

According to one embodiment, input data 2980 may be input into process result predictor 2984, which may include a trained machine learning model. Based on the input data 2980, process result predictor outputs process result data 2991 indicating color data 2988 indicating predictions of a process result of a deposition of film on a substrate.

According to one embodiment, input data 2980 may be input into process parameter tuner 2985, which may include a trained machine learning model. Based on the input data 2980, process parameter tuner outputs process parameter data 2988 indicating one or more data representations of color.

Figure 30:
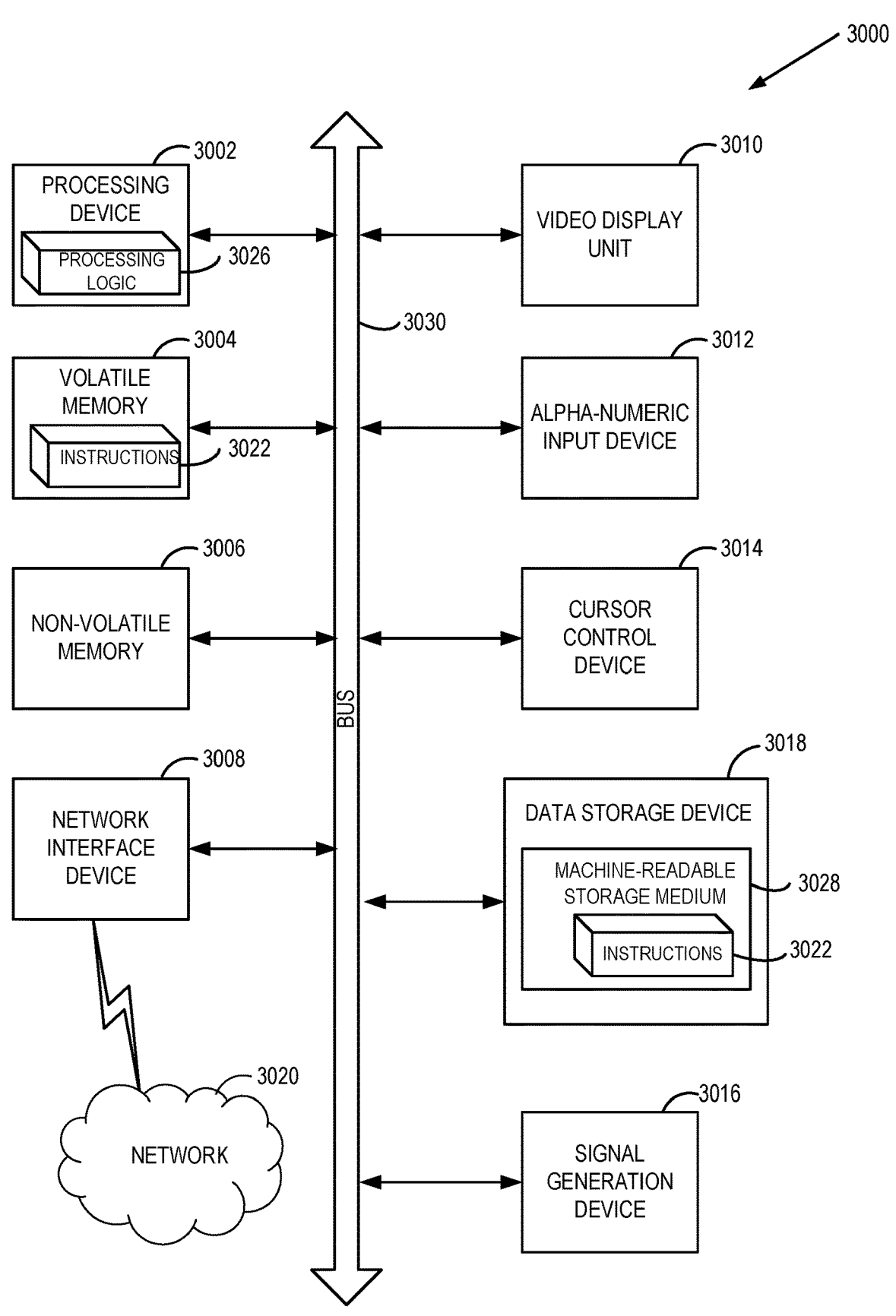
FIG. 30 depicts a block diagram of an example computing device, operating in accordance with one or more aspects of the present disclosure.

FIG. 30 depicts a block diagram of an example computing device 3000, operating in accordance with one or more aspects of the present disclosure. In various illustrative examples, various components of the computing device 3000 may represent various components of the client devices 2250, data acquisition system 2210, server 2220, data store 2240, manufacturing system 2202, and machine learning system 2270, illustrated in FIG. 22.

Example computing device 3000 may be connected to other computer devices in a LAN, an intranet, an extranet, and/or the Internet. Computing device 3000 may operate in the capacity of a server in a client-server network environment. Computing device 3000 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 3000 may include a processing device 3002 (also referred to as a processor or CPU), a main memory 3004 (e.g., read-only memory (ROM), flash memory, dynamic random access memory (DRAM) such as synchronous DRAM (SDRAM), etc.), a static memory 3006 (e.g., flash memory, static random access memory (SRAM), etc.), and a secondary memory (e.g., a data storage device 3018), which may communicate with each other via a bus 3030.

Processing device 3002 represents one or more general-purpose processing devices such as a microprocessor, central processing unit, or the like. More particularly, processing device 3002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 3002 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 802 may be configured to execute instructions implementing methods 2300-2900 illustrated in FIGS. 23-29.

Example computing device 3000 may further comprise a network interface device 3008, which may be communicatively coupled to a network 3020. Example computing device 3000 may further comprise a video display 3010 (e.g., a liquid crystal display (LCD), a touch screen, or a cathode ray tube (CRT)), an alphanumeric input device 3012 (e.g., a keyboard), a cursor control device 3014 (e.g., a mouse), and an acoustic signal generation device 3016 (e.g., a speaker).

Data storage device 3018 may include a machine-readable storage medium (or, more specifically, a non-transitory machine-readable storage medium) 3028 on which is stored one or more sets of executable instructions 3022. In accordance with one or more aspects of the present disclosure, executable instructions 3022 may comprise executable instructions associated with executing methods 2300-2900 illustrated in FIGS. 23-29.

Executable instructions 3022 may also reside, completely or at least partially, within main memory 3004 and/or within processing device 3002 during execution thereof by example computing device 3000, main memory 3004 and processing device 3002 also constituting computer-readable storage media. Executable instructions 3022 may further be transmitted or received over a network via network interface device 3008.

While the computer-readable storage medium 3028 is shown in FIG. 30 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the described purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description above. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. An assembly, comprising:
an enclosure structure forming a first interior volume configured to support a substrate disposed within the first interior volume, wherein, the substrate is selectively removable from the enclosure structure, wherein the enclosure structure further comprises:
an upper interior surface; and
a lower interior surface located below the upper interior surface, wherein;
the first interior volume is configured to direct a first mass transport of a reactive species to a first surface of the substrate, the reactive species corresponding to a substrate process;
a first portion of the lower interior surface is configured to support the substrate; and
a second portion of the lower interior surface forms a channel configured to provide a second mass transport of the reactive species to a second surface of the substrate opposite the first surface.

2. The assembly of claim 1, further comprising a shutter device coupled to the enclosure structure, wherein the shutter device is configured to actuate and alter at least one of the first mass transport of the reactive species or the second mass transport of the reactive species.

3. The assembly of claim 1, further comprising at least one of:
a heating device configured to increase a temperature of an environment disposed within the first interior volume of the enclosure structure; or
a cooling device configured to decrease the temperature of the environment disposed within the first interior volume of the enclosure structure.

4. The assembly of claim 1, further comprising the substrate disposed within the first interior volume, wherein the substrate further comprises one or more sensors onboard the substrate, the one or more sensors configured to acquire data characterizing at least one of (i) the first surface of the substrate, (ii) the second surface of the substrate, or (iii) the first interior volume.

5. The assembly of claim 1, wherein a first distance from the upper interior surface to the first surface of the substrate is substantially equivalent to a second distance from the second portion of the lower interior surface to the second surface of the substrate.

6. The assembly of claim 1, wherein the enclosure structure forms a second interior volume configured to support a second substrate disposed within the second interior volume, wherein the second substrate is selectively removable from the enclosure structure, where the enclosure structure further comprises:

a second upper interior surface located above the second interior volume and a second lower interior surface located below the second interior volume;

the second interior volume is configured to direct a third mass transport of the reactive species to a first surface of the second substrate;

a first portion of the second lower interior surface is configured to support the second substrate; and a second portion of the second lower interior surface forms a channel configured to provide a fourth mass transport of the reactive species to a second surface of the second substrate opposite the first surface of the second substrate.

7. The assembly of claim 6, wherein the first interior volume comprises one or more spatial dimensions different from corresponding one or more spatial dimensions of the second interior volume.

8. The assembly of claim 1, wherein the enclosure structure further comprises:

a first member comprising a first planar surface forming the upper interior surface; and a second member comprising a second planar surface fastened to the first planar surface, the second member forming the lower interior surface.

9. The assembly of claim 1, further comprising:

the substrate disposed in a first plane; and a set of one or more substrate monitoring devices disposed across a surface of the substrate, the set of one or more substrate monitoring devices comprising the enclosure structure.

10. The assembly of claim 1, further comprising:

the substrate disposed in a first plane, wherein the first surface comprises a textured portion comprising a textured surface.

11. The assembly of claim 10, wherein the first surface further comprises a smooth portion.

12. A system, comprising:

a substrate processing chamber; and a substrate monitoring assembly disposed within the substrate processing chamber, comprising:

an enclosure structure forming a first interior volume configured to support a substrate disposed within the first interior volume, the substrate is selectively removable from the enclosure structure, wherein the enclosure structure further comprises:

an upper interior surface and a lower interior surface located below the upper interior surface, wherein;

the first interior volume is configured to direct a first mass transport of a reactive species to a first surface of the substrate, the reactive species corresponding to a substrate process;

a first portion of the lower interior surface is configured to support the substrate; and a second portion of the lower interior surface forms a channel configured to provide a second mass transport of the reactive species to a second surface of the substrate opposite the first surface.

13. The system of claim 12, further comprising a shutter device coupled to the enclosure structure, wherein the shutter device is configured to actuate and alter at least one of the first mass transport of the reactive species or the second mass transport of the reactive species.

14. The system of claim 12, further comprising a gas injection device configured to selectively supply a flow of gas to the first interior volume and reducing at least one of the first mass transport or the second mass transport.

15. The system of claim 12, further comprising at least one of:

a heating device configured to increase a temperature of an environment disposed within the first interior volume of the enclosure structure; or a cooling device configured to decrease the temperature of the environment disposed within the first interior volume of the enclosure structure.

16. The system of claim 12, further comprising the substrate disposed within the first interior volume of the enclosure structure, wherein the substrate further comprises one or more sensors disposed within the substrate, the one or more sensor configured to acquire data characterizing at least one of (i) the first surface of the substrate, (ii) the second surface of the substrate, or (iii) the first interior volume.

17. The system of claim 12, wherein a first distance from the upper interior surface to the first surface of the substrate is substantially equivalent to a second distance from the second portion of the lower interior surface to the second surface of the substrate.

18. The system of claim 12, wherein the enclosure structure forms a second interior volume configured to support a second substrate disposed within the second interior volume, wherein the second substrate is selectively removable from the enclosure structure, wherein the first interior volume comprises one or more spatial dimensions different from corresponding one or more spatial dimensions of the second interior volume, and wherein the enclosure structure further comprises:

a second upper interior surface located above the second interior volume and a second lower interior surface located below the second interior volume;

the second interior volume is configured to direct a third mass transport of the reactive species to a first surface of the second substrate;

a first portion of the second lower interior surface is configured to support the second substrate; and a second portion of the second lower interior surface forms a second channel configured to provide a fourth mass transport of the reactive species to a second surface of the second substrate opposite the first surface of the second substrate.

19. The system of claim 12, further comprising:

a planar substrate; and a set of one or more substrate monitoring devices disposed across a surface of the planar substrate, the set of one or more substrate monitoring devices comprising the enclosure structure.

20. A substrate monitoring device, comprising:

a first planar structure having a bottom surface;

a second planar structure coupled to the first planar structure, the second planar structure having a top surface, wherein:

the bottom surface of the first planar structure and the top surface of the second planar structure forms a first slot configured to at least partially enclose a first substrate disposed within the first slot;

the first slot provides a first mass transport of a reactive species associated with a substrate processing procedure to a first surface of the first substrate; and the top surface of the second planar structure comprises:

a first portion disposed in a first plane and configured to contact the bottom surface of the first planar structure; and a second portion disposed in a second plane below the first plane and configured to support the first substrate.

21. The substrate monitoring device of claim 20, wherein:

the top surface of the second planar structure further comprises a third portion disposed in a third plane below the second plane;

a first portion of the first slot between the first substrate and the bottom surface of the first planar structure provides the first mass transport of the reactive species to the first surface of the first substrate; and a second portion of the first slot between the first substrate and the third portion of the top surface provides a second mass transport of the reactive species to a second surface of the first substrate opposite the first surface.

22. The substrate monitoring device of claim 20, wherein the second planar structure further comprises a bottom surface, the substrate monitoring device further comprising:

a third planar structure coupled to the second planar structure, the third planar structure having a top surface, wherein:

the bottom surface of the second planar structure and the top surface of the third planar structure forms a second slot configured to partially enclose a second substrate disposed within the second slot;

the second slot provides a second mass transport of the reactive species to a first surface of the second substrate; and the top surface of the third planar structure comprises:

a first portion disposed in a third plane and configured to contact the bottom surface of the second planar structure; and a second portion disposed in a fourth plane below the third plane and configured to support the second substrate.

23. The substrate monitoring device of claim 22, wherein the first slot comprises one or more spatial dimensions different from corresponding one or more spatial dimensions of the second slot.

* * * * *